United States Patent
Ladizinsky et al.

(10) Patent No.: US 8,951,808 B2
(45) Date of Patent: Feb. 10, 2015

(54) SYSTEMS AND METHODS FOR FABRICATION OF SUPERCONDUCTING INTEGRATED CIRCUITS

(75) Inventors: Eric Ladizinsky, Manhattan Beach, CA (US); Geordie Rose, Burnaby (CA); Jeremy P. Hilton, Burnaby (CA); Eugene Dantsker, San Diego, CA (US); Byong Hyop Oh, San Jose, CA (US)

(73) Assignee: D-Wave Systems Inc., Burnaby (CA)

( * ) Notice: Subject to any disclaimer, the term of this patent is extended or adjusted under 35 U.S.C. 154(b) by 505 days.

(21) Appl. No.: 12/992,049

(22) PCT Filed: Feb. 25, 2010

(86) PCT No.: PCT/US2010/025403
§ 371 (c)(1),
(2), (4) Date: Nov. 10, 2010

(87) PCT Pub. No.: WO2010/099312
PCT Pub. Date: Sep. 2, 2010

(65) Prior Publication Data
US 2011/0089405 A1    Apr. 21, 2011

Related U.S. Application Data

(60) Provisional application No. 61/156,377, filed on Feb. 27, 2009.

(51) Int. Cl.
*H01L 29/72*    (2006.01)
*H01L 27/18*    (2006.01)
(Continued)

(52) U.S. Cl.
CPC .............. *H01L 27/18* (2013.01); *B82Y 10/00* (2013.01); *G06N 99/002* (2013.01); *H01L 39/223* (2013.01); *H01L 39/2493* (2013.01)
USPC ...................................... 438/2; 257/31; 216/3

(58) Field of Classification Search
USPC ...................................... 438/2; 257/31; 216/3
See application file for complete search history.

(56) References Cited

U.S. PATENT DOCUMENTS 4,689,559 A * 8/1987 Hastings et al. .............. 324/248
4,912,975 A * 4/1990 Ohta et al. .................. 73/204.26
(Continued)

FOREIGN PATENT DOCUMENTS

JP    62-015869    1/1987
JP    10-004223    1/1998
(Continued)

OTHER PUBLICATIONS

Gordy et al., "Microwave Spectroscopy," Table A.2, John Wiley and Sons, Inc., New York, New York, pp. 337-344, 1953.
(Continued)

*Primary Examiner* — Edward Wojciechowicz
(74) *Attorney, Agent, or Firm* — Seed IP Law Group PLLC

(57) ABSTRACT

Various techniques and apparatus permit fabrication of superconductive circuits and structures, for instance Josephson junctions, which may, for example be useful in quantum computers. For instance, a low magnetic flux noise trilayer structure may be fabricated having a dielectric structure or layer interposed between two elements or layers capable of superconducting. A superconducting via may directly overlie a Josephson junction. A structure, for instance a Josephson junction, may be carried on a planarized dielectric layer. A fin may be employed to remove heat from the structure. A via capable of superconducting may have a width that is less than about 1 micrometer. The structure may be coupled to a resistor, for example by vias and/or a strap contact connector.

28 Claims, 38 Drawing Sheets

(51) Int. Cl.
  *B82Y 10/00*    (2011.01)
  *G06N 99/00*    (2010.01)
  *H01L 39/22*    (2006.01)
  *H01L 39/24*    (2006.01)

(56) References Cited

U.S. PATENT DOCUMENTS

| | | | | |
|---|---|---|---|---|
| 5,055,158 | A | * | 10/1991 | Gallagher et al. ............... 216/3 |
| 5,863,868 | A | * | 1/1999 | Chan et al. ..................... 505/162 |
| 5,869,846 | A | | 2/1999 | Higashino et al. ............... 257/31 |
| 7,533,068 | B2 | | 5/2009 | van den Brink et al. ........ 706/10 |
| 2005/0107261 | A1 | * | 5/2005 | Cantor et al. .................. 505/100 |
| 2008/0176750 | A1 | | 7/2008 | Rose et al. ..................... 505/170 |
| 2008/0215850 | A1 | | 9/2008 | Berkley et al. ..................... 712/1 |
| 2009/0078931 | A1 | | 3/2009 | Berkley ............................ 257/31 |
| 2009/0082209 | A1 | | 3/2009 | Bunyk et al. .................... 505/190 |
| 2009/0121215 | A1 | | 5/2009 | Choi ................................ 257/31 |

FOREIGN PATENT DOCUMENTS

| | | |
|---|---|---|
| KR | 2001-0067425 | 7/2001 |
| WO | 2009/120638 | 10/2009 |
| WO | 2009/149086 | 12/2009 |

OTHER PUBLICATIONS

Nagasawa et al., "Development of Advanced Nb Process for SFQ Circuits," Physica C 412-414:1429-1436, 2004.

Satoh et al., "Planarization of Josephson Junctions for Large-Scale Integrated Nb SFQ Circuits by Mechanical Polishing," Physica C 412-414:1447-1450, 2004.

Satoh et al., "Fabrication Process of Planarized Multi-Layer Nb Integrated Circuits," IEEE Transactions on Applied Superconductivity 15(2):78-81, 2005.

Hinode et al., "Fabrication of Reliable Via Conductors for Niobium SFQ Devices" Physica C 426-431:1533-1540, 2005.

"Superconducting Technology Assessment," National Security Agency Office of Corporate Assessments, 257 pages, Aug. 2005.

Vinante et al., "Hot-Electron Effect in Palladium Thin Films," Physical Review B 75:104303-1-104303-5, 2007.

International Search Report, mailed Sep. 28, 2010, for PCT/US2010/025403, 3 pages.

Written Opinion, mailed Sep. 28, 2010, for PCT/US2010/025403, 4 pages.

* cited by examiner

SYSTEMS AND METHODS FOR FABRICATION OF SUPERCONDUCTING INTEGRATED CIRCUITS

CROSS REFERENCE TO RELATED APPLICATIONS

This application is a U.S. national stage application filed under 35 U.S.C. 371 of International Patent Application PCT/US2010/025403, accorded an international filing date of Feb. 25, 2010 which claims benefit under 35 U.S.C. 119(e) of U.S. Provisional Patent Application Ser. No. 61/156,377, filed Feb. 27, 2009 and entitled "Systems and Methods for Fabrication of Superconducting Integrated Circuits," both of which are incorporated herein by reference in its their entirety.

BACKGROUND

Field

The present systems and methods relate to the fabrication of integrated circuits for superconducting applications.

Approaches to Quantum Computation

There are several general approaches to the design and operation of quantum computers. One such approach is the "circuit model" of quantum computation. In this approach, qubits are acted upon by sequences of logical gates that are the compiled representation of an algorithm. Much research has been focused on developing qubits with sufficient coherence to form the basic elements of circuit model quantum computers.

Another approach to quantum computation involves using the natural physical evolution of a system of coupled quantum systems as a computational system. This approach may not make use of quantum gates and circuits. Instead, the computational system may start from a known initial Hamiltonian with an easily accessible ground state and be controllably guided to a final Hamiltonian whose ground state represents the answer to a problem. This approach does not typically require long qubit coherence times and may be more robust than the circuit model. Examples of this type of approach include adiabatic quantum computation and quantum annealing.

Quantum Processor

Quantum computations may be performed using a quantum processor, such as a superconducting quantum processor. A superconducting quantum processor may comprise a superconducting integrated circuit including a number of qubits and associated local bias devices, for instance two or more superconducting qubits. Further details and embodiments of exemplary superconducting quantum processors that may be fabricated according to the present systems and methods are described in U.S. Pat. No. 7,533,068, US Patent Publication 2008-0176750, US Patent Publication 2009-0121215, and PCT Patent Application Serial No. PCT/US2009/037984.

Superconducting Qubits

Superconducting qubits are a type of superconducting quantum device that can be included in a superconducting integrated circuit. Superconducting qubits can be separated into several categories depending on the physical property used to encode information. For example, they may be separated into charge, flux and phase devices. Charge devices store and manipulate information in the charge states of the device. Flux devices store and manipulate information in a variable related to the magnetic flux through some part of the device. Phase devices store and manipulate information in a variable related to the difference in superconducting phase between two regions of the phase device. Recently, hybrid devices using two or more of charge, flux and phase degrees of freedom have been developed.

Superconducting integrated circuits may include single flux quantum (SFQ) devices. The integration of SFQ devices with superconducting qubits is discussed in, for example, U.S. Patent Publication 2008-0215850.

Superconducting Processor

A computer processor may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting "classical" processors. Due to their natural physical properties, superconducting classical processors may be capable of higher switching speeds and shorter computation times than non-superconducting processors, and therefore it may be more practical to solve certain problems on superconducting classical processors. The present systems and methods are particularly well-suited for use in fabricating both superconducting quantum processors and superconducting classical processors.

Integrated Circuit Fabrication

Traditionally, the fabrication of superconducting integrated circuits has not been performed at state-of-the-art semiconductor fabrication facilities. This may be due to the fact that some of the materials used in superconducting integrated circuits can contaminate the semiconductor facilities. For instance, gold may be used as a resistor in superconducting circuits, but gold can contaminate a fabrication tool used to produce CMOS wafers in a semiconductor facility. Consequently, superconducting integrated circuits containing gold are not processed by tools which also process CMOS wafers.

Superconductor fabrication has typically been performed in research environments where standard industry practices could be optimized for superconducting circuit production. Superconducting integrated circuits are often fabricated with tools that are traditionally used to fabricate semiconductor chips or integrated circuits. Due to issues unique to superconducting circuits, not all semiconductor processes and techniques are necessarily transferrable to superconductor chip manufacture. Transforming semiconductor processes and techniques for use in superconductor chip and circuit fabrication often requires changes and fine adjustments. Such changes and adjustments typically are not obvious and may require a great deal of experimentation. The semiconductor industry faces problems and issues not necessarily related to the superconducting industry. Likewise, problems and issues that concern the superconducting industry are often of little or no concern in standard semiconductor fabrication.

Niobium and aluminum oxide Josephson junctions, for instance, cannot, at least in some implementations, be exposed to temperatures much above 160 or 200 degrees Celsius without substantial risk of degradation of the aluminum oxide layer. Therefore, if a Josephson junction is deposited on the substrate of a superconducting integrated circuit, any dielectric layers, such as silicon dioxide, subsequently deposited within the circuit cannot be done at the semiconductor industry standard temperature of around 400 degrees Celsius. The semiconductor industry deposits silicon dioxide at such high temperatures to realize high quality, low defect dielectric layers. Low temperature deposition of silicon dioxide can result in a large number of defects within the dielectric. Such defects can be seen as noise during the operation of superconducting integrated circuits. Any impurities within superconducting chips may result in noise which can compromise or degrade the functionality of the individual devices, such as superconducting qubits, and of the superconducting chip as a whole. Since noise is a large concern to the operation of quantum computers, measures should be taken to reduce dielectric noise wherever possible. Also, niobium, a material chosen more for its high superconducting critical temperature than its suitability to fabrication, does not naturally fill via holes very well. This can result in poor contacts between wiring layers of superconducting integrated circuits. Plugs have been thought of as a way to avoid the problems of filling high aspect ratio holes with niobium, but unfortunately utilizing plug technology may result in contamination of semiconductor facilities with niobium. Further, magnetic noise is typically a major concern in the production of superconducting qubits, but may be of little or no concern for many semiconductor chip applications Etching Etching removes layers of, for example, substrates, dielectric layers, electrically insulating layers and/or metal layers according to desired patterns delineated by photoresists or other masking techniques. The two principal etching techniques are wet chemical etching and dry chemical etching.

Wet chemical etching or "wet etching" is typically accomplished by submerging a wafer in a corrosive bath such as an acid bath. In general, etching solutions are housed in polypropylene, temperature-controlled baths. The baths are usually equipped with either a ring-type plenum exhaust ventilation or a slotted exhaust at the rear of the etch station. Vertical laminar-flow hoods are typically used to supply uniformly-filtered, particulate-free air to the top surface of the etch baths.

Dry chemical etching or "dry etching" is commonly employed due to its ability to better control the etching process and reduce contamination levels. Dry etching effectively etches desired layers through the use of gases, either by chemical reaction such as using a chemically reactive gas or through physical bombardment, such as plasma etching, using, for example, argon atoms.

Plasma etching systems have been developed that can effectively etch, for example, silicon, silicon dioxide, silicon nitride, aluminum, tantalum, tantalum compounds, chromium, tungsten, gold, and many other materials. Two types of plasma etching reactor systems are in common use—the barrel reactor system and the parallel plate reactor system. Both reactor types operate on the same principles and vary primarily in configuration only. The typical reactor consists of a vacuum reactor chamber made usually of aluminum, glass, or quartz. A radiofrequency or microwave energy source (referred to collectively as RF energy source) is used to activate fluorine-based or chlorine-based gases which act as etchants. Wafers are loaded into the chamber, a pump evacuates the chamber, and the reagent gas is introduced. The RF energy ionizes the gas and forms the etching plasma, which reacts with the wafers to form volatile products which are pumped away.

Physical etching processes employ physical bombardment. For instance, argon gas atoms may be used to physically bombard a layer to be etched, and a vacuum pump system is used to remove dislocated material. Sputter etching is one physical technique involving ion impact and energy transfer. The wafer to be etched is attached to a negative electrode, or "target," in a glow-discharge circuit. Positive argon ions bombard the wafer surface, resulting in the dislocation of the surface atoms. Power is provided by an RF energy source. Ion beam etching and milling are physical etching processes which use a beam of low-energy ions to dislodge material. The ion beam is extracted from an ionized gas (e.g., argon or argon/oxygen) or plasma, created by an electrical discharge.

Reactive ion etching (RIE) is a combination of chemical and physical etching. During RIE, a wafer is placed in a chamber with an atmosphere of chemically reactive gas (e.g., $CF_4$, $CCl_4$ and many other gases) at a low pressure. An electrical discharge creates an ion plasma with an energy of a few hundred electron volts. The ions strike the wafer surface vertically, where they react to form volatile species that are removed by the low pressure in-line vacuum system.

BRIEF SUMMARY

At least one embodiment may be summarized as a superconducting circuit including a Josephson junction having a first electrode formed of a first material that superconducts at or below a first critical temperature, a second electrode formed of the first material that superconducts at or below the first critical temperature and an electrically insulative layer interposed between the first and the second electrodes to separate the first electrode from the second electrode; a first superconducting current path comprised of a second material that superconducts at or below a second critical temperature, wherein the second material has a magnetic flux noise coefficient less than about 1.0 and the first superconducting current path is coupled to the first electrode; and a second superconducting current path comprised of a material that superconducts at or below a critical temperature, wherein the material has a magnetic flux noise coefficient less than about 1.0 and the second superconducting current path is coupled to the second electrode. The second material may include at least one material selected from the group consisting of: zinc, tin, and lead. The material of which the second superconducting current path is comprised may be the second material. Alternatively, the material of which the second superconducting current path is comprised may be a third material that superconducts at or below a third critical temperature and has a magnetic flux noise coefficient less than about 1.0. For example, the third material may comprise at least one material selected from the group consisting of: zinc, tin, and lead. In some embodiments, the superconducting circuit may include a substrate which carries the Josephson junction, the first superconducting current path, and the second superconducting current path, wherein the substrate comprises at least one material selected from the group consisting of: silicon, and sapphire. The first and the second superconducting current paths may be galvanically coupled together to form a closed superconducting loop interrupted by the Josephson junction. The first and the second electrodes may be comprised of niobium and the electrically insulative layer may be comprised of at least a layer of aluminum oxide.

At least one embodiment may be summarized as an integrated circuit including a substrate; a metal layer carried by the substrate, wherein the metal layer includes at least one electrical current path that superconducts at or below a critical temperature; a planarized first dielectric layer carried by the metal layer; and a Josephson junction carried by the planarized first dielectric layer wherein the Josephson junction is comprised of a first electrode, a second electrode, and an electrically insulative layer interposed between the first and the second electrodes, and wherein the first and the second electrodes are each formed of a material that superconducts at or below a critical temperature. In some embodiments, the integrated circuit may include a second dielectric layer directly carried on the planarized first dielectric layer, wherein the Josephson junction is directly carried on the second dielectric layer. The at least one electrical current path may be comprised of at least one material selected from the group consisting of: niobium, aluminum, zinc, tin, and lead. In some embodiments, the integrated circuit may include a second dielectric layer carried by the Josephson junction; and a second metal layer carried by the second dielectric layer, wherein the second metal layer includes at least one electrical current path that superconducts at or below a critical temperature. In some embodiments, the integrated circuit may include a superconducting via that superconductingly electrically couples at least one electrical current path from the second metal layer with the first electrode of the Josephson junction, wherein the superconducting via comprises a hole extending through the second dielectric layer that is at least partially filled with a material that is superconducting at or below a critical temperature. The superconducting via may have a width that is less than 1 micrometer and/or a depth-to-width aspect ratio that is greater than 0.7:1. In some embodiments, the integrated circuit may include a superconducting via that superconductingly electrically couples at least one electrical current path from the second metal layer with at least one electrical current path from the first metal layer, wherein the superconducting via comprises a hole extending through both the first and the second dielectric layers, and wherein the hole is at least partially filled with a material that is superconducting at or below a critical temperature. The superconducting via may have a width that is less than 1 micrometer and/or a depth-to-width aspect ratio that is greater than 0.7:1.

In some embodiments, the integrated circuit may include a resistor. The resistor may comprise platinum. The resistor may be carried by the planarized first dielectric layer. The resistor may be thermally conductively coupled to the substrate. In some embodiments, the integrated circuit may include a fin thermally conductively coupled to the resistor.

At least one embodiment may be summarized as a method of fabricating a Josephson junction, the method including depositing a first dielectric layer; planarizing a surface of the first dielectric layer; depositing a first electrode that superconducts at or below a critical temperature over at least a portion of the planarized surface of the first dielectric layer; forming an electrically insulative layer over at least a portion of the first electrode; and depositing a second electrode that superconducts at or below the critical temperature over at least a portion of the electrically insulative layer. In some embodiments, the method may include depositing a second dielectric layer over at least a portion of the planarized surface of the first dielectric layer. The first dielectric layer may be deposited at a temperature higher than about 200 degrees Celsius. In some embodiments, the method may include depositing an additional dielectric layer over at least a portion of the second electrode; planarizing a surface of the additional dielectric layer; forming a hole in the additional dielectric layer to expose at least a portion of the second electrode; and at least partially filing the hole in the additional dielectric layer with a material that superconducts at or below the critical temperature. Forming a hole in the additional dielectric layer may include forming a hole with a width that is less than 1 micrometer and/or a depth-to-width aspect ratio that is greater than 0.7:1.

At least one embodiment may be summarized as a superconducting integrated circuit including a substrate; a resistor carried by the substrate; a first trilayer carried by the substrate wherein the first trilayer comprises a first electrode that superconducts at or below a critical temperature, a second electrode that superconducts at or below a critical temperature, and a first electrically insulative layer interposed between the first and the second electrodes wherein the first electrode of the first trilayer is electrically coupled to the resistor; and a second trilayer that is carried by the substrate wherein the second trilayer comprises a third electrode that superconducts at or below a critical temperature, a fourth electrode that superconducts at or below a critical temperature, and a second electrically insulative layer interposed between the third and the fourth electrodes and wherein the third electrode of the second trilayer is electrically coupled to the resistor. The resistor may comprise platinum. In some embodiments, the superconducting integrated circuit may include a dielectric layer carried by the substrate wherein the dielectric layer covers at least a portion of the resistor; a first via formed through the dielectric layer wherein the first electrode of the first trilayer is electrically coupled to the resistor through the first via; and a second via formed through the dielectric layer wherein the third electrode of the second trilayer is electrically coupled to the resistor through the second via. In some embodiments, the superconducting integrated circuit may include a dielectric layer carried by the substrate wherein the dielectric layer does not cover at least a portion of the resistor and wherein the first and the third electrodes each form a respective strap contact with the resistor.

At least one embodiment may be summarized as a method of fabricating a superconducting integrated circuit, the method including depositing a first layer of material that superconducts at or below a critical temperature; forming an electrical insulator layer over at least a portion of the first layer of material that superconducts at or below a critical temperature; depositing a second layer of material that superconducts at or below a critical temperature over at least a portion of the electrical insulator layer; depositing a hard mask over at least a portion of the second layer of material that superconducts at or below the critical temperature; depositing a photoresist over an area of the hard mask, wherein a first portion of the hard mask is covered by the photoresist and a second portion of the hard mask is not covered by the photoresist; removing the second portion of the hard mask to form a first portion of the second layer of material that superconducts at or below a critical temperature that is covered by the first portion of the hard mask and a second portion of the second layer of material that superconducts at or below a critical temperature that is not covered by the hard mask; removing the photoresist; and removing the second portion of the second layer of material that superconducts at or below a critical temperature. Removing the second portion of the hard mask may include etching by a microlithography process. Removing the photoresist may include etching by a wet etching process. Removing the second portion of the second layer of material that superconducts at or below a critical temperature may include etching by an argon gas plasma process. Removing the second portion of the second layer of material that superconducts at or below a critical temperature may include etching by a reactive ion etching process. At least one of the first and the second layer of material that superconducts at or below a critical temperature may comprise niobium. In some embodiments, the method may include depositing a cap over at least a portion of the integrated circuit. In some embodiments, the hard mask may comprise silicon nitride and the method may include exposing the silicon nitride to an oxygen plasma before depositing the photoresist.

In some embodiments, the method may include depositing a dielectric layer; planarizing a surface of the dielectric layer;

forming a hole in the dielectric layer wherein a width of the hole is less than about 1 micrometer and/or a depth-to-width aspect ratio of the hole is greater than about 0.7:1; and at least partially filling the hole with a material that superconducts at or below a critical temperature. Forming a hole in the dielectric layer may include forming a hole having a width of less than about 0.5 micrometers. The dielectric layer may cover at least a portion of the first portion of the second layer of material that superconducts at or below a critical temperature, forming a hole in the dielectric layer may expose at least a portion of the first portion of the second layer of material that superconducts at or below a critical temperature, and at least partially filling the hole may provide an electrical connection with the first portion of the second layer of material that superconducts at or below a critical temperature. Forming an electrical insulator layer over at least a portion of the first layer of material that superconducts at or below a critical temperature may include depositing a metal layer above at least a portion of the first layer of material that superconducts at or below a critical temperature; and exposing the metal layer to oxygen. In some embodiments, the method may include removing the first portion of the hard mask. Removing the first portion of the hard mask may include etching by a reactive ion etching process.

At least one embodiment may be summarized as a method of fabricating a superconducting integrated circuit including a Josephson junction having a first superconducting electrode and a second superconducting electrode, the method including depositing the first electrode of the Josephson junction, wherein the first electrode superconducts at or below a critical temperature; forming an electrically insulative layer over at least a portion of the first electrode; depositing the second electrode of the Josephson junction over at least a portion of the electrically insulative layer, wherein the second electrode superconducts at or below a critical temperature; depositing a photoresist over the second superconducting electrode; masking and developing the photoresist to produce an area of the second superconducting electrode not covered by the photoresist; removing the area of the second superconducting electrode not covered by the photoresist; removing the photoresist; depositing a dielectric layer over the Josephson junction; planarizing a surface of the dielectric layer; forming a hole having a width less than about 1 micrometer and/or a depth-to-width aspect ratio of greater than 0.7:1 in the dielectric layer, wherein the hole exposes at least a portion of the second superconducting electrode; and depositing a conductive layer comprising a material that superconducts at or below a critical temperature over at least a portion of the dielectric layer, wherein a portion of the conductive layer at least partially fills the hole and establishes electrical communication with the second superconducting electrode of the Josephson junction. At least one of the first and the second superconducting electrodes may be formed of a material that comprises at least one metal selected from the group consisting of: niobium, aluminum, zinc, tin, and lead. Forming an electrical insulative layer over at least a portion of the first superconducting electrode may include depositing a metal layer over at least a portion of the first superconducting electrode; and exposing the metal layer to oxygen. Removing the area of the second superconducting electrode not covered by the photoresist may include etching by an argon gas plasma process. Removing the photoresist may include etching by a wet etching process.

At least one embodiment may be summarized as a superconducting integrated circuit including a substrate having an etched portion; a resistor; a first portion of material that superconducts at or below a critical temperature electrically coupled to the resistor; and a second portion of material that superconducts at or below a critical temperature electrically coupled to the resistor; wherein the resistor is positioned within the etched portion of the substrate and is resistive at a temperature at which both the first and the second portions of superconducting material superconduct. The resistor may comprise platinum.

At least one embodiment may be summarized as a method of fabricating a superconducting integrated circuit, the method including forming a platinum resistor; and forming a trilayer comprising two layers of material that are superconducting at and below a critical temperature and an electrically insulative layer interposed between the two layers of material that are superconducting, wherein the trilayer is directly electrically coupled to the resistor through at least one strap contact. The method may include forming a fin thermally conductively coupled to the resistor.

At least one embodiment may be summarized as a superconducting integrated circuit including a first layer, wherein the first layer is a first dielectric layer; a Josephson junction carried on the first layer; a second layer; and a second Josephson junction carried on the second layer, wherein the first dielectric layer is carried by the second layer. The second layer may be a substrate. Alternatively, the second layer may be a second dielectric layer. The first Josephson junction may include a first material and the second Josephson junction may include a second material that is different from the first material. At least one of the first and the second Josephson junctions may be a component of a single flux quantum circuit. At least one of the first and the second Josephson junctions may be a component of a superconducting qubit.

At least one embodiment may be summarized as a superconducting integrated circuit including a first layer, wherein the first layer is a first dielectric layer; a first resistor carried on the first dielectric layer; a second layer; and a second resistor carried on the second layer wherein, the first dielectric layer is carried by the second layer. The second layer may be a second dielectric layer. The second layer may be a substrate. At least one of the first resistor and the second resistor may be comprised of platinum. In some embodiments, the superconducting integrated circuit may include a thermally conductive connection that provides thermal communication between the resistor and a substrate of the superconducting integrated circuit.

At least one embodiment may be summarized as a method of fabricating a superconducting integrated circuit, the method including depositing a first conductive layer comprising a material that superconducts at or below a critical temperature; depositing a dielectric layer; forming a hole having a width less than about 1 micrometer and/or a depth-to-width aspect ratio of greater than 0.7:1 in the dielectric layer; and depositing a second conductive layer comprising a material that superconducts at or below a critical temperature over at least a portion of the dielectric layer, wherein the a portion of the second conductive layer at least partially fills the hole. The method may include planarizing the dielectric layer. Forming a hole may include forming the hole in the dielectric layer to have a width of less than 0.5 micrometers.

At least one embodiment may be summarized as a method of depositing superconducting electrical current paths, the method including depositing a dielectric layer having a surface; etching a trench in the surface of the dielectric layer; depositing a material that superconducts at or below a critical temperature wherein a first portion of the material is carried on the surface of the dielectric layer and a second portion is deposited in the trench; and polishing the material carried on the surface of the dielectric layer. The material that superconducts at or below a critical temperature may be comprised of at least one material selected from the group consisting of: niobium, aluminum, zinc, tin, and lead.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION

Figure 1:
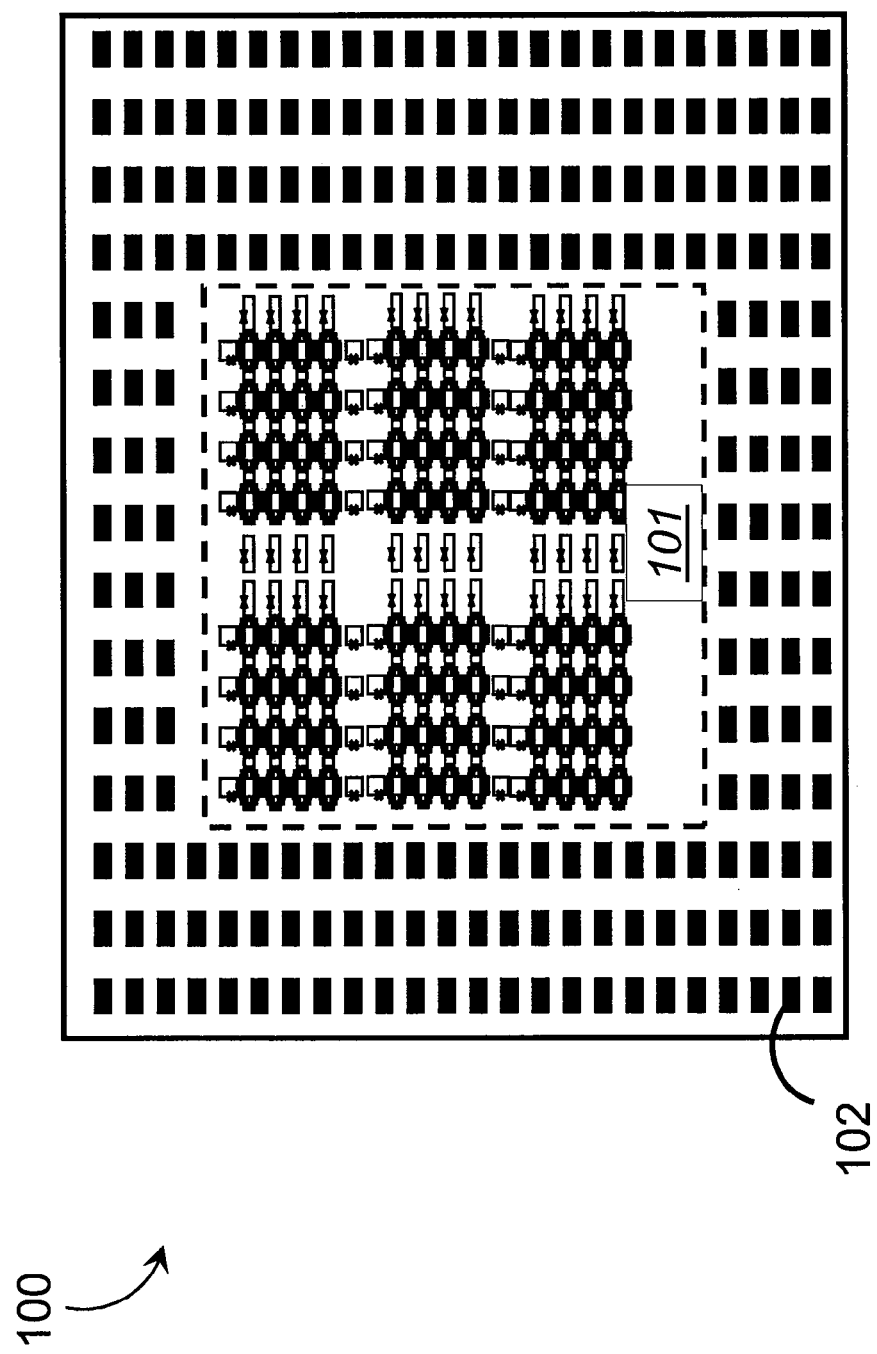
FIG. 1 is a top plan view of a die including a superconducting integrated circuit spread over a portion of the total die area and a plurality of metal filler structures to make the overall density of metal more uniform over the total die area.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with superconductive circuits or structures, quantum computer circuits or structures and/or cooling systems such as evaporative refrigerators have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in this specification and the appended claims the term "carried by" or variants thereof means that one structure is directly or indirectly supported in at least some instances by another structure, for example directly on a surface thereof, spaced above or below a surface thereof by one or more intervening layers or structures or located therein.

The headings and Abstract of the Disclosure provided herein are for convenience only and do not interpret the scope or meaning of the embodiments.

An integrated circuit is typically fabricated over an area known as a chip or a die. In many instances, the density of circuit elements (i.e., the density of metal wiring) is not uniform over the area of the die. In multi-layered circuits involving at least one stage of planarization, these non-uniformities in wiring density can result in non-uniformities in the surface(s) of the various layers. For an evenly applied planarization force, the rate at which a dielectric layer recedes during planarization may depend on the composition of the underlying layer(s). That is, a portion of a dielectric layer that overlies a metal structure may recede at a different rate during planarization than a portion of the same dielectric layer that overlies another dielectric layer. For example, when a first dielectric layer that has a first portion carried directly on a metal layer and a second portion carried directly on a second dielectric layer is planarized, the resulting thickness of the first dielectric layer may not be uniform. In various embodiments, the non-uniformities in the planarized surface may include pits, steps, protrusions, and/or a general curvature. Such non-uniformities can adversely affect the deposition of subsequent layers and/or adversely affect the operation of the integrated circuit. In particular, non-uniformities in the thickness of a dielectric layer can introduce potentially detrimental parametric spreads in the devices included in the integrated circuit. In semiconductor fabrication practices, these non-uniformities may be mitigated by designing the integrated circuit to include idle (i.e., electrically inactive and unused) structures of filler metal in order to improve the uniformity of metal wiring density over the area of the die. In accordance with the present systems and methods, a similar approach may be adapted for use in superconducting integrated circuits, where the structures of filler metal are formed of a material that is superconducting below a critical temperature in order to avoid introducing unwanted sources of thermal energy and/or magnetic fields into the circuit.

FIG. 1 is a top plan view of a die 100 including a superconducting integrated circuit 101 spread over a portion of the total die area and a plurality of metal filler structures 102 (only one called out in the Figure to reduce clutter) to make the overall density of metal more uniform over the total die area. In accordance with the present systems and methods, each of metal filler structures 102 may be formed of a material that is superconducting below a critical temperature, such as niobium, aluminum, zinc, lead, tin, or a superconducting alloy. Each of metal filler structures 102 is electrically isolated from the other metal filler structures 102 and from any and all components of integrated circuit 101, including any wiring (not shown) that may connect the components of circuit 101 to the perimeter of die 100 (e.g., to connect to wire-bonding pads [not shown]). Those of skill in the art will appreciate that the metal filler structures 102 may not be drawn to scale in FIG. 1 (relative to the size of the elements of circuit 101 and to the size of the die itself) and the illustrated density of components is used for exemplary purposes only. In some embodiments, metal filler structures 102 may be included within the area of circuit 101 and among the components therein if there are spaces that are sufficiently large to require and accommodate filler material. Those of skill in the art will also appreciate that individual metal filler structures 102 may each embody any size and/or shape in order to accommodate the spatial restrictions throughout the die. In various embodiments, metal filler structures 102 may be separated by different distances and/or included in one or multiple layers of die 100 in regular and/or irregular patterns. Superconducting integrated circuit 101 may include a superconducting processor, such as a superconducting quantum processor implementing superconducting qubits.

The present systems and methods describe multi-material processes for the fabrication of superconducting integrated circuits. The temperature at and below which a superconductor is superconducting (the "critical temperature") is a characteristic of the specific material being used. In some applications, it may be desirable to incorporate different materials (each with a different critical temperature) each suited to a different purpose within the integrated circuit. As an example, a superconducting integrated circuit may include components designed for magnetometry and/or thermometry for which it is desirable that the critical current be higher than it is for other components (e.g., processor components such as qubits) of the circuit. As another example, a superconducting integrated circuit may include certain components made of a first material or set of materials that produce less noise than other components made of a second material or set of materials.

Quantum computers having quantum devices that can only be programmed with relatively few (e.g., approximately one or two) bits of precision may not be well-suited to solve certain types of problems. The number of bits of precision that may be achieved is typically limited by noise which may, for example, induce decoherence in quantum devices. Therefore, it can be advantageous for a superconducting quantum processor to be constructed in such a way as to minimize noise, and thereby maximize the number of bits of precision the quantum processor is able to achieve during calculations. Noise reduction is an important design consideration, and operation of superconducting qubits in the presence of noise can, among other things, limit the number of bits of precision with which data may be manipulated. The degree of susceptibility to noise is substantially greater for superconducting devices such as quantum devices, than for more traditional semiconductor devices such as digital microprocessors and/or memories. Various embodiments described herein provide systems and methods for fabricating superconducting circuits in such a way as to reduce the noise affecting the circuit elements.

Magnetic Flux Noise

Magnetic flux noise acting on a superconducting device may be due, at least in part, to magnetic moments, for example nuclear magnetic moments, in the materials of which the device and the materials proximate to the device are formed.

A computer system, for example a quantum computer system, is formed of atoms. Atoms comprise nuclei. Nuclei can have magnetic moments, the strength of which varies by atomic isotope (see, for example, Table A.2 on pp. 337-344 of Gordy, Walter, William V. Smith, and Ralph F. Trambarulo. Microwave Spectroscopy. New York: John Wiley and Sons, Inc., 1953). The magnetic moments of these nuclei create magnetic flux noise which can adversely act on sensitive computing systems or devices, for example superconducting devices such as superconducting qubits.

It is highly desirable to lower magnetic flux noise in certain computing systems. For example, in systems comprising devices that store or process information using magnetic fields, magnetic flux noise can compromise or degrade the functionality of the individual devices and the computing system as a whole. Superconducting flux qubits within a quantum computer may communicate with each other, and/or with other superconducting devices, through the exchange and manipulation of magnetic flux signals. Therefore, quantum devices within a quantum computer comprising superconducting flux qubits can be highly sensitive to the effects of magnetic flux noise.

The amplitude of magnetic flux noise coming from a specific material can be characterized by a dimensionless coefficient, F, referred to herein as a magnetic flux noise coefficient. The magnetic flux noise coefficient F may be defined as:

$$F = \sum_{j=0}^{N} \left| \frac{S_j \gamma_j}{\gamma_0} x_j \right|$$

where the material contains N different atomic isotopes, $\gamma_0$ is the nuclear magneton, $S_j$ is the maximum value of the nuclear spin associated with the $j^{th}$ isotope, $\gamma_j$ is the magnetic moment of the nuclear spin associated with the $j^{th}$ isotope, and $x_j$ is the fraction of the material containing the $j^{th}$ isotope. The lower the magnetic flux noise coefficient F, the less magnetic flux noise arising from nuclear magnetic moments is created by the particular material.

For example, the material $^{116}$Sn has zero nuclear spin and therefore has a magnetic flux noise coefficient of zero, whereas $^{115}$Sn has $S_j=1/2$, $\gamma_j=-0.91779\gamma_0$ and therefore has a magnetic flux noise coefficient of 0.458895. An equal mixture of the two has a magnetic flux noise coefficient of 0.229448.

While the composition of isotopes within the system is not adjustable in situ after production and fabrication, by selecting materials with low magnetic flux noise coefficient F, magnetic flux noise arising from nuclear magnetic moments can be reduced.

Superconducting quantum devices may be made primarily from niobium. For example, a superconducting quantum device may comprise a loop of superconducting niobium interrupted by a Josephson junction, wherein the Josephson junction may be formed by a layer of aluminum oxide between two layers of niobium. Niobium is often chosen as a material to produce superconducting quantum devices due to its critical temperatures of ~9.3 K, well above the evaporation temperature of liquid helium at ~4.2 K which allows for simplified testing procedures.

Niobium, however, has a very high magnetic flux noise coefficient value, with $S_j=9/2$ and $\gamma_j=6.1659\gamma_0$ giving a magnetic flux noise coefficient of 27.747. A person of skill in the art would appreciate that this value is high compared to most other elements of the periodic table. Aluminum, another material often used in the fabrication of Josephson junctions, also has a high value of magnetic flux noise coefficient, with $S_j=5/2$ and $\gamma_j=3.6408\gamma_0$ giving a magnetic flux noise coefficient of 9.102. Zinc, tin, and lead, however all exhibit relatively low nuclear spins and nuclear magnetic moments. Zinc has zero nuclear spin for all isotopes except $^{68}$Zn which has a spin of 5/2 and a nuclear magnetic moment of $0.87378\gamma_0$. The magnetic flux noise coefficient of zinc is 0.0873. Tin has zero nuclear spin for all isotopes except $^{115}$Sn, $^{117}$Sn and $^{119}$Sn which all have spins of 1/2 and respective nuclear magnetic moments of $-0.91779\gamma_0$, $-0.99982\gamma_0$ and $-1.04600\gamma_0$. The magnetic flux noise coefficient of tin is 0.0843. Lead has zero spin for all isotopes except $^{207}$Pb which has nuclear spin 1/2 and a nuclear magnetic moment of $0.58950\gamma_0$. The magnetic flux noise coefficient of lead is 0.06222.

By reducing the amount of niobium and aluminum within the quantum devices, such as within qubit structures and coupler structures, magnetic flux noise due to nuclear spins may be reduced. While eliminating niobium completely from the structures of quantum devices may significantly reduce magnetic flux noise arising from nuclear spins, technologies developed to produce Josephson junctions from a layer of aluminum oxide between two bulk depositions of niobium are well-suited to produce Josephson junctions of high quality. It may therefore be beneficial to construct quantum devices of at least one distinct bulk material which has more favorable characteristics regarding its contribution to magnetic flux noise, in conjunction with Josephson junctions formed of aluminum oxide and niobium.

Figure 2:
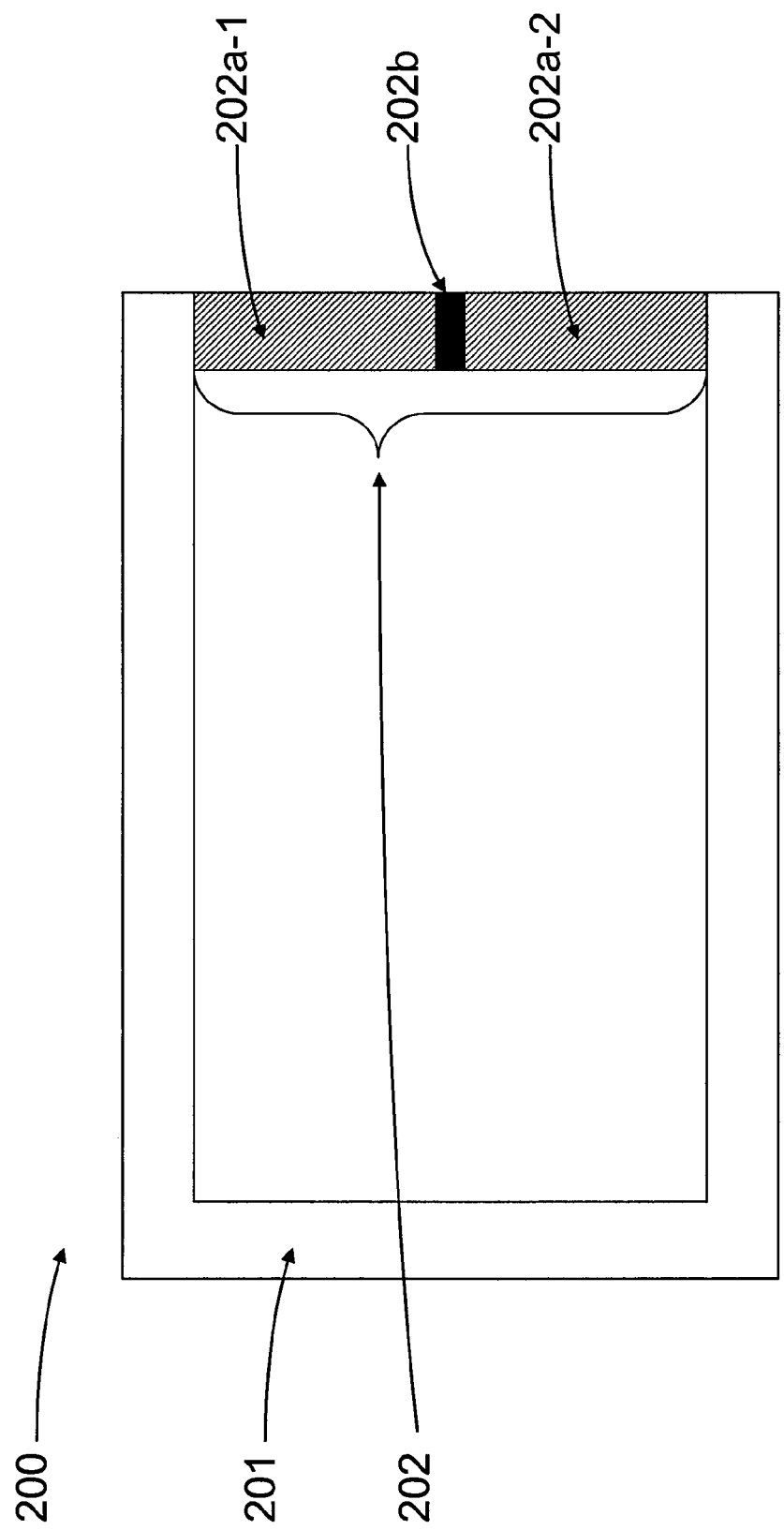
FIG. 2 is a schematic diagram of an exemplary quantum device.

A quantum computer may take the form of an integrated circuit comprising a plurality of quantum devices such as a quantum device 200 depicted in FIG. 2. Quantum device 200 comprises a loop of superconducting material 201 (the bulk material) interrupted by a Josephson junction 202. The Josephson junction 202 may be made from a "trilayer" process which implements multiple materials such as niobium, aluminum and aluminum oxide. For instance, layers 202a-1, 202a-2 may be formed of niobium and separated (or interrupted) by aluminum on which is grown a thin layer 202b of aluminum oxide. In accordance with the present systems and methods, loop of superconducting material 201 may be made from a different material than that of layers 202a-1, 202a-2. The interfaces between loop of superconducting material 201 and layers 202a-1, 202a-2 form respective superconducting interfaces having respective critical currents with magnitudes greater than the critical current of Josephson junction 202. The loop of superconducting material 201 may, for example, be made from zinc, tin, lead or any other superconducting material (including, for example, a superconducting alloy) whose magnetic flux noise due to nuclear spins is lower than that for niobium or aluminum.

Figure 3:
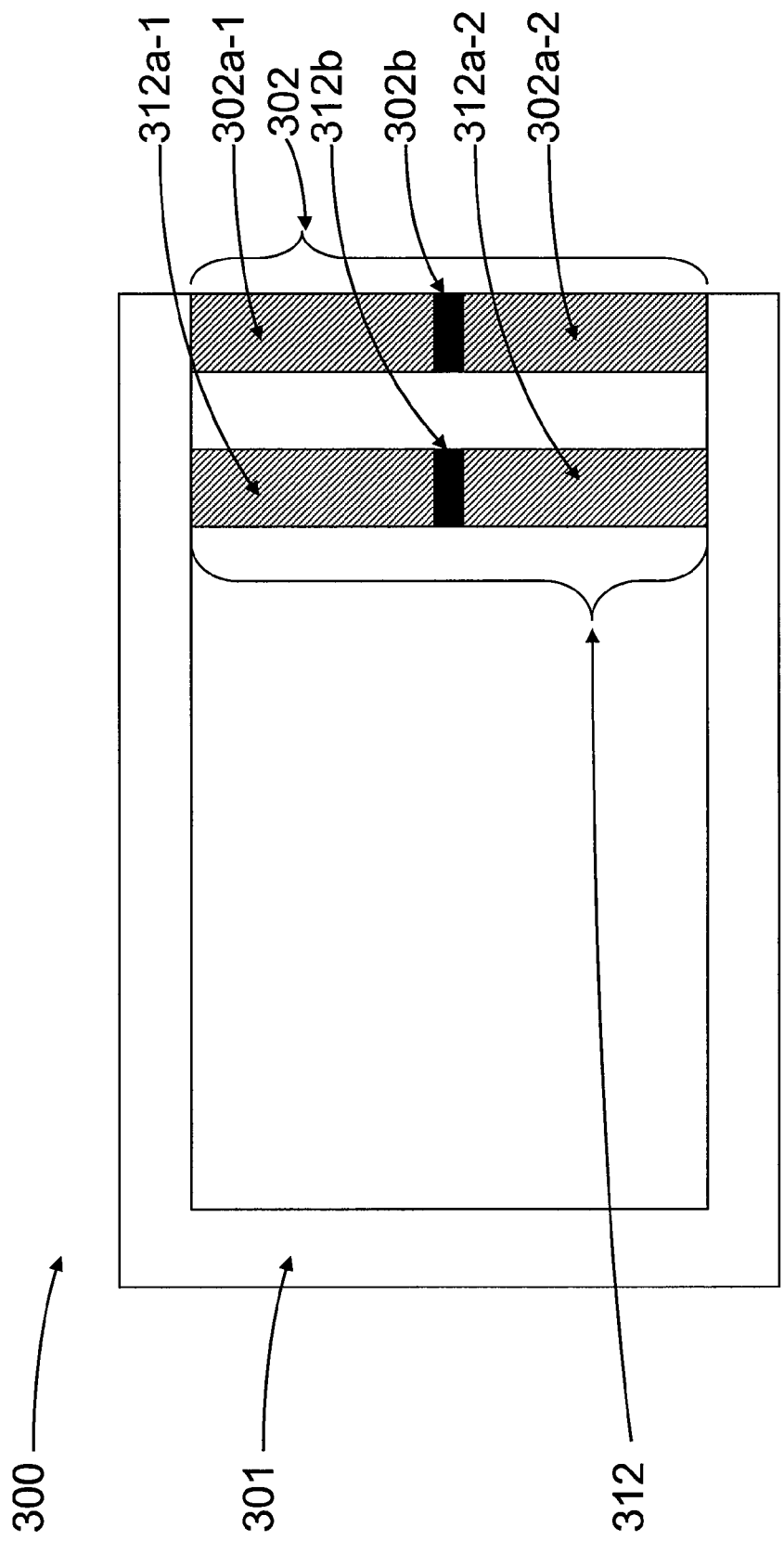
FIG. 3 is a schematic diagram of a further exemplary quantum device.

A person of skill in the art would appreciate that FIG. 2 depicts a simple quantum device, and more complicated quantum devices may be made using the same principles. For instance, FIG. 3 shows a quantum device 300 comprising a loop of superconducting material 301 interrupted by a compound Josephson junction comprising a first Josephson junction 302 and a second Josephson junction 312 in parallel with the first Josephson junction 302. The first Josephson junction 302 may include a trilayer comprising at least two layers 302a-1, 302a-2 of niobium interrupted by a thin layer 302b of aluminum oxide. The second Josephson junction 312 may include a trilayer comprising at least two layers 312a-1, 312a-2 of niobium interrupted by a thin layer 312b of aluminum oxide. The interfaces between loop of superconducting material 301 and layers 302a-1, 302a-2 and layers 312a-1, 312a-2 form superconducting interfaces having respective critical currents with respective magnitudes greater than the critical currents of Josephson junctions 302, 312. The loop of superconducting material 301 may be made from zinc, tin, lead or any other superconducting material (including, for example, a superconducting alloy) whose magnetic flux noise due to nuclear spins is lower than that for niobium or aluminum.

The same principles described for FIGS. 2 and 3 above may also be applied in circuits implementing a superconducting current path that does not form a closed loop. For instance, a trilayer Josephson junction may include first and second electrodes that are each formed of a first material (e.g., niobium) that is superconducting below a first critical temperature and an electrically insulative layer that separates the two electrodes. The first electrode may be coupled to a first superconducting current path that is formed of a second material that is superconducting below a second critical temperature and has a magnetic flux coefficient less than about 1.0. The second electrode may be coupled to a second superconducting current path that is formed or either the second material or a third material that is superconducting below a third critical temperature and has a magnetic flux coefficient less than about 1.0. The first and second superconducting current paths may be coupled together to form a closed superconducting loop (e.g., 201, 301) interrupted by the Josephson junction, or the first and second superconducting current paths may not be coupled together such that the Josephson junction simply interrupts an otherwise continuous current path defined by the first and second superconducting current paths.

Planarization

Figure 4:
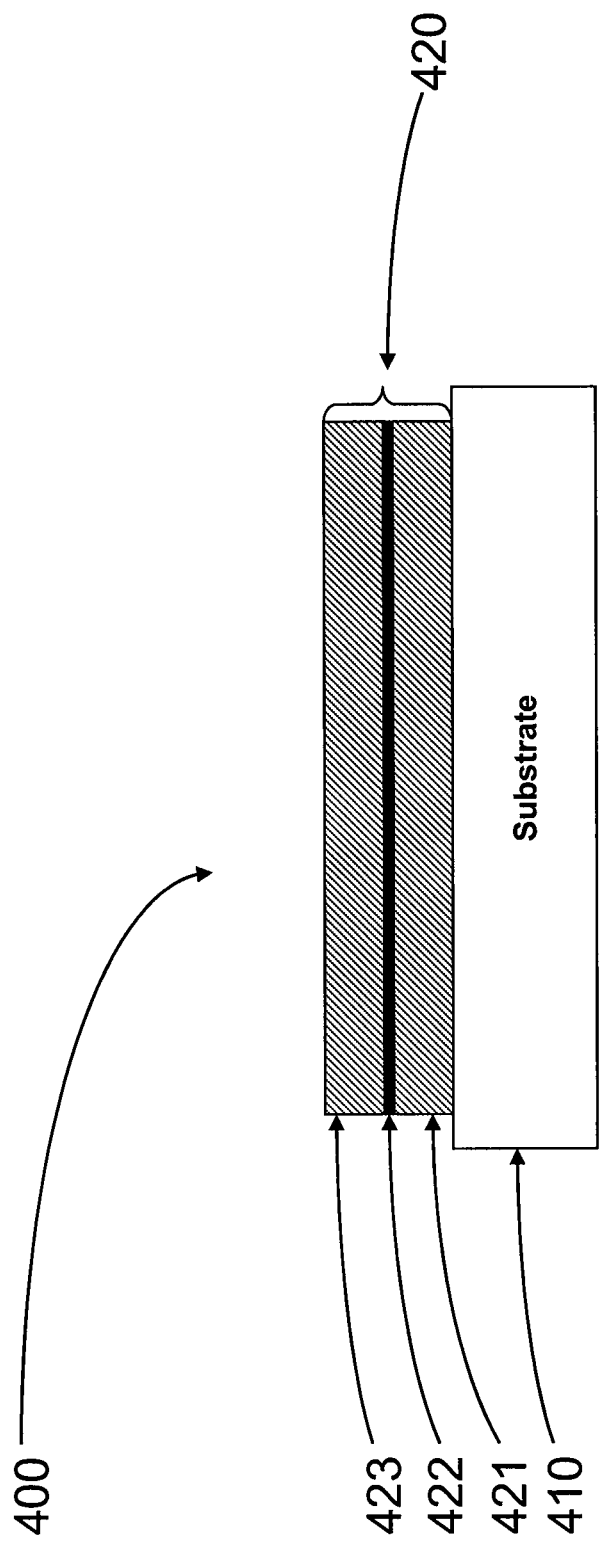
FIG. 4 is a cross-sectional view of an integrated circuit.

Traditionally, as shown in FIG. 4, a superconducting integrated circuit 400 may incorporate a trilayer Josephson junction 420 deposited upon a substrate 410, wherein substrate 410 may, for example, comprise silicon or sapphire. A Josephson junction 420 may comprise a first superconducting (e.g., niobium, aluminum, rhenium, niobium nitride, hafnium) layer 421 or "bottom electrode", an electrically insulating layer 422 (e.g., aluminum oxide, magnesium oxide, aluminum nitride, hafnium oxide, hafnium nitride) and a second superconducting (e.g., niobium, aluminum, rhenium, niobium nitride, hafnium) layer 423 or "top electrode." By depositing trilayer Josephson junction 420 upon substrate 410, the Josephson junction 420 may be aligned and more easily integrated with additional layers of metal which may be deposited, for example, atop the Josephson junction 420. Substrates are, by design, very flat and have few if any surface features which could cause misalignment or adversely impact the deposition of first metal layer 421, electrically insulating layer 422 and second metal layer 423. Should Josephson junction 420 not be built upon a planar surface, the alignment of other devices within integrated circuit 400 with first and second metal layers 421 and 423 may be unreliable, which may adversely affect the performance of Josephson junction 420. Further, a non-uniform thickness of electrically insulating layer 422 over the area of the Josephson junction 420 may cause current leakage between first metal layer 421 and second metal layer 423 degrading Josephson junction quality. Gap and subgap resistance may degrade due to a non-planar insulating layer 422. In fabrication processes in which a plurality of Josephson junctions 420 are included in an integrated circuit, misalignment of Josephson junctions is a serious concern. The deposition of Josephson junctions 420 upon surfaces having topographies with features such as bumps, scratches and changes in elevation may cause misalignment and may make it difficult to reliably manufacture Josephson junctions with substantially uniform critical currents.

Trilayer Josephson junctions have been deposited upon dielectric layers such as silicon dioxide. See, for example, Nagasawa et al., Physica C 412-414 (2004) 1429-1436, Satoh et. al., Physica C 412-414 (2004) 1447-1450, and Satoh, et al., IEEE Transactions on Applied Superconductivity, Vol. 15, No. 2, June 2005. In particular, a planarization technology called caldera is discussed. Reactive ion etching (RIE) with a reverse mask, bias sputtering and mechanical polishing planarization (MPP) were used to produce flat surfaces upon which Josephson junctions were deposited. This approach has allowed six or more successive metal layers, having Josephson junctions, and dielectric layers to be deposited and planarized, wherein the layers may have been made substantially flat such that the number of and severity of surface features present on the planarized metal and dielectric layers did not interfere with the performance of the superconducting integrated circuit produced in this fabrication process. First a niobium wiring layer is deposited and a silicon dioxide ($SiO_2$) or similar dielectric layer is deposited. Then photoresist is deposited using a reverse mask of the niobium wiring layer. The $SiO_2$ not covered by photoresist is then etched away through reactive ion etching (RIE) and then the photoresist is removed through a wet chemical process. Minimizing the amount of photoresist used within the fabrication process of circuits having Josephson junctions is desirable as the chemicals used to remove photoresist can result in the degradation and/or destruction of delicate Josephson junctions. Narrow convex $SiO_2$ features along the edges of the niobium wiring which are formed through this process are then removed through MPP. Then, Josephson junctions are deposited upon the now fairly flat and featureless $SiO_2$ surface. It should be noted that this process of using the reverse mask creates "volcano" structures atop the $SiO_2$ surrounding metal wiring deposited in the layer below the $SiO_2$ which may not be fully removed during planarization. The number of steps required in this process is high and with each process step, the yield of the process tends to decrease. Therefore, a simpler process having relatively fewer steps would be advantageous if such simpler process were able to produce the same if not better results. Such a simpler process is now described.

The use of chemical-mechanical polishing planarization (CMP) allows for a near flat surface to be produced. Also, CMP is a standard process in the semiconductor industry. Satoh, et al., IEEE Transactions on Applied Superconductivity, Vol. 15, No. 2, June 2005 however states "it is difficult to obtain sufficient flatness when using CMP to produce patterns of various sizes and densities. Wider or denser patterns need a longer polishing time to achieve the required flatness." The CMP process uses an abrasive and corrosive chemical slurry in conjunction with a polishing pad and retaining ring, typically of a greater width than the wafer. The pad and wafer are pressed together by a dynamic polishing head and held in place by a plastic retaining ring. The dynamic polishing head is rotated with different axes of rotation (i.e., not concentric). This removes material and tends to even out any irregular topography, making the wafer flat or planar. The process of material removal is not simply that of abrasive scraping, like sandpaper on wood. The chemicals in the slurry also react with and/or weaken the material to be removed such that certain materials can be preferentially removed while leaving others relatively intact. The abrasive accelerates this weakening process and the polishing pad helps to wipe the reacted materials from the surface. Advanced slurries can be used to preferentially remove areas of the wafer which are relatively high or protrude in relation to areas of the wafer which are relatively low in order to planarize the topography of the wafer.

Further, multiple superconducting layers require superconducting interconnection vias to allow for superconducting electrical communication between layers of superconducting wiring. Hinode et al., Physica C 426-431 (2005) 1533-1540 discusses vias produced to allow for this integration and difficulties unique to superconducting vias. Vias produced here are 0.4 micrometers in depth and 0.6 micrometers in width therefore having a depth-to-width "aspect ratio ~70%" or 0.667:1. Persons of skill in the art would appreciate that niobium does not fill high aspect ratio holes well due to its inherent chemical nature, making it difficult to form high aspect ratio vias using niobium. Further, see, e.g., National Security Agency: Office of Corporate Assessments, "Superconducting Technology Assessment" (August 2005) where plug technology for vias is discussed but no discussions of interconnection vias are made. Plug technology may require either MPP or CMP processing of niobium. Semiconductor fabrication facilities may not allow MPP or CMP processing of niobium due to the risk of contamination of MPP and CMP equipment. This risk can be avoided by the use of interconnection vias.

Figure 5A:
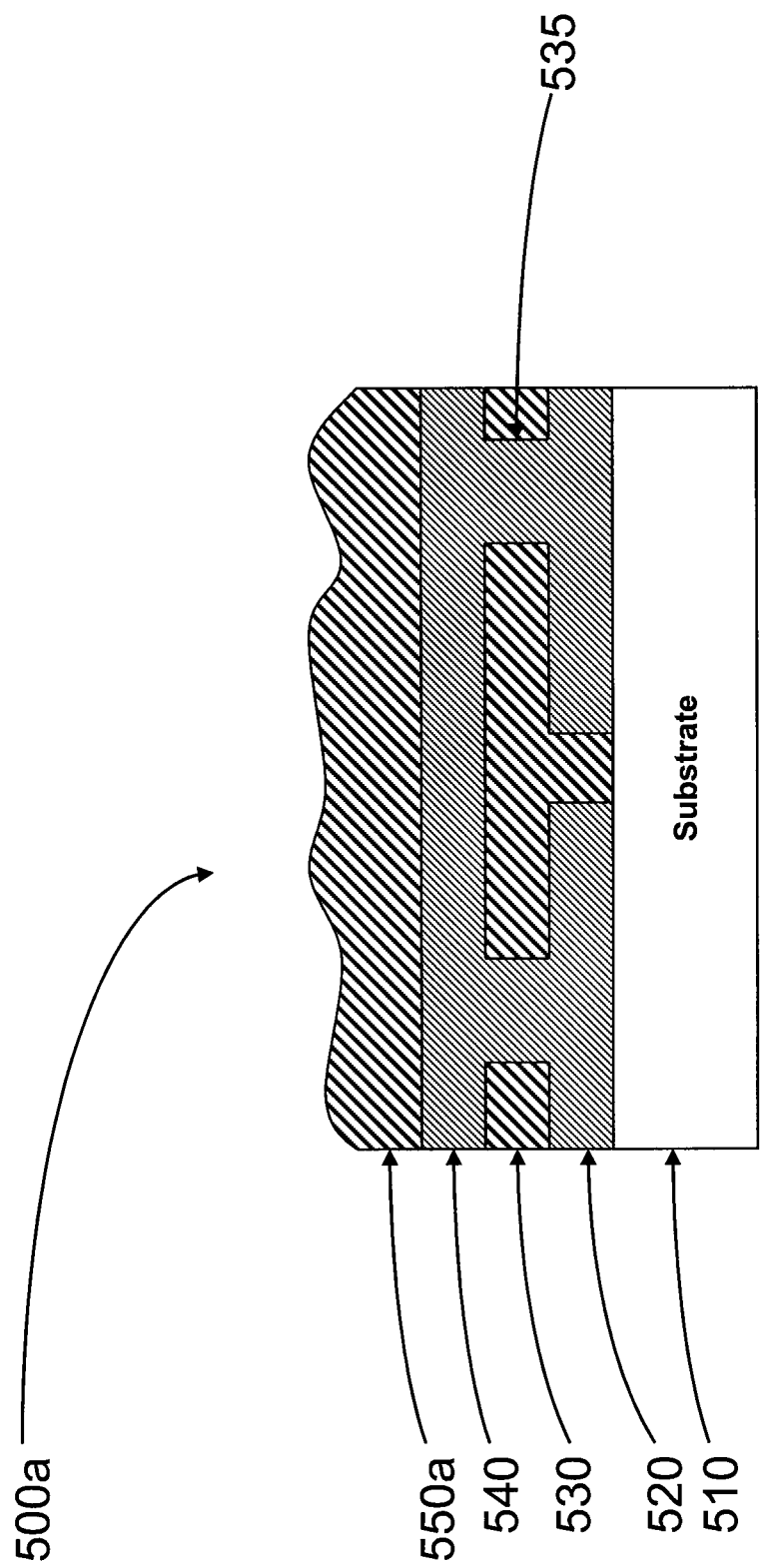
FIGS. 5A, 5B, 5C, 5D, 5E and 5F are cross-sectional representations of a superconducting integrated circuit at different phases of a fabrication process.

FIG. 5A shows an integrated circuit 500a having a substrate 510, a first metal layer 520, a first dielectric layer 530, a second metal layer 540, and a second dielectric layer 550a. There may exist vias 535 between first metal layer 520 and second metal layer 540. Niobium vias able to carry appreciable amounts of current can be difficult to fabricate. See, e.g., Hinode et al., Physica C 426-431 (2005) 1533-1540 regarding via degradation related to niobium deposition conditions and via degradation due to ILD $SiO_2$. In some applications, capacitive crosstalk between first metal layer 520 and second metal layer 540 may be undesirable. Such crosstalk may be reduced by increasing the thickness of first dielectric layer 530 in order to increase the distance between first metal layer 520 and second metal layer 540. However, increasing the thickness of first dielectric layer 530 can force vias 535 to have aspect ratios much greater than 70%, such as 100%, 200%, 600% or more. By producing vias 535 with high aspect ratios between first metal layer 520 and second metal layer 540, capacitive crosstalk may be reduced while still allowing for highly integrated circuits. Further discussion of these high aspect ratio vias follows below. Above first metal layer 520 there may be a thickness of approximately 1000 or 2000 Angstroms of first dielectric layer 530. Then a hole is formed, for example a hole having a width of less than about 1 micrometer, for example 0.5 micrometers (500 Angstroms) or less, such as 0.3 micrometers (300 Angstroms). The hole may be produced by a photoresist deposition and subsequent etching, or other process able to produce holes (e.g., submicron holes) within dielectric materials. The hole may then be at least partially filled with niobium or a similar metal capable of superconducting. The depth of the hole depends on (and, in some embodiments, is at least approximately equal to) the thickness of the dielectric layer 530 that separates the first and second metal layers 520 and 540, respectively. The width of the hole may be chosen to allow a desired density of components to be packed within the limited area of the die; for example, the smaller the width of the hole, the higher the density of components that may be packed within the limited area of the die. The depth-to-width aspect ratio of the hole may be chosen to allow niobium to provide a superconducting electrical contact between first metal layer 520 and second metal layer 540. The depth-to-width aspect ratio of the hole may be greater than 0.7:1, 1:1, 2:1, 3:1, 5:1 or greater. A person of skill in the art would appreciate that vias with smaller aspect ratios may be made, such as the 0.667:1 aspect ratio discussed in Hinode et al., Physica C 426-431 (2005) 1533-1540, but the density of components of integrated circuit 400 may not be as high. Higher yields from fabrication of integrated circuit 500 may, however, be attained should the requirements for small vias be relaxed. Substrate 510 may include, for example, silicon, sapphire or a similar substrate material providing a flat surface upon which integrated circuit 500 may be deposited. Metal layers 520, 540 may include niobium, aluminum, lead, zinc, tin, or similar metal capable of superconducting. Dielectric layers 530, 550a may include $SiO_2$, silicon nitride (SiN), hydrogenated amorphous silicon, organic polymer dielectric or similar dielectric material. Second dielectric layer 550a may be planarized by, for example, CMP.

Figure 5B:
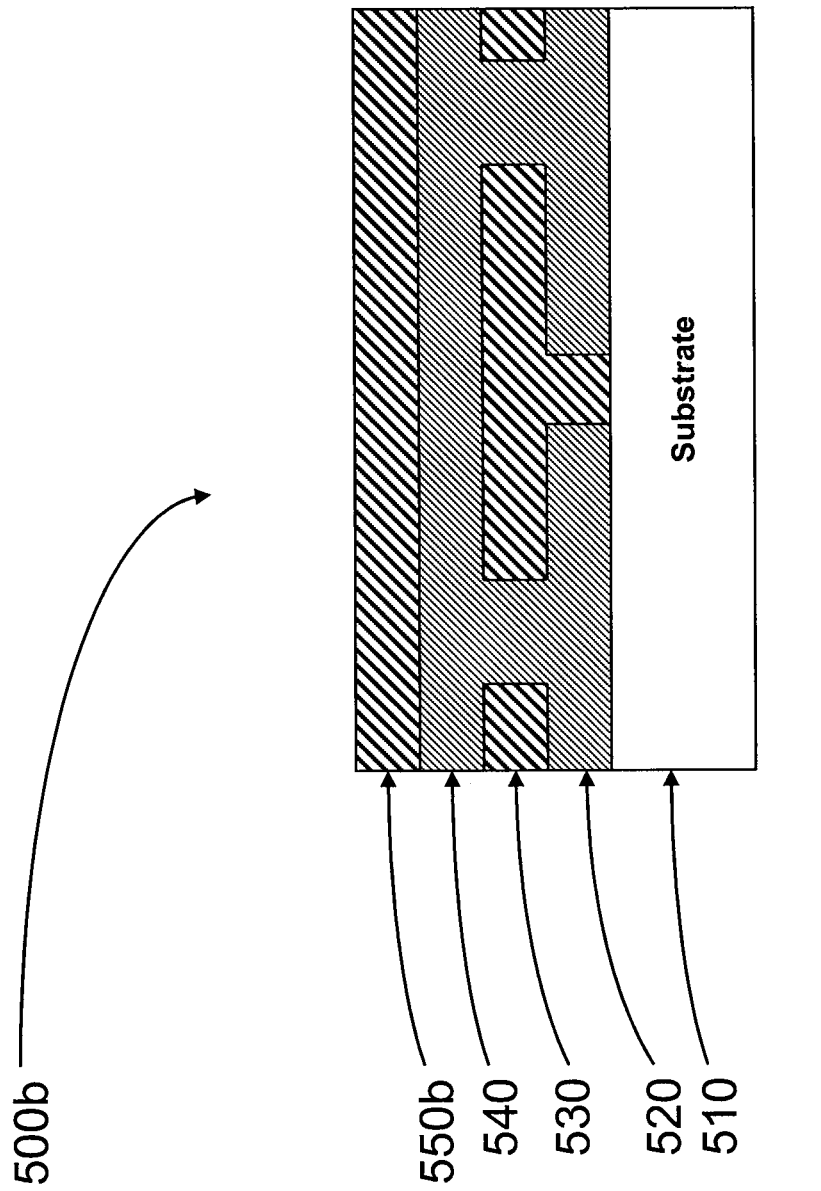
Figure 5C:
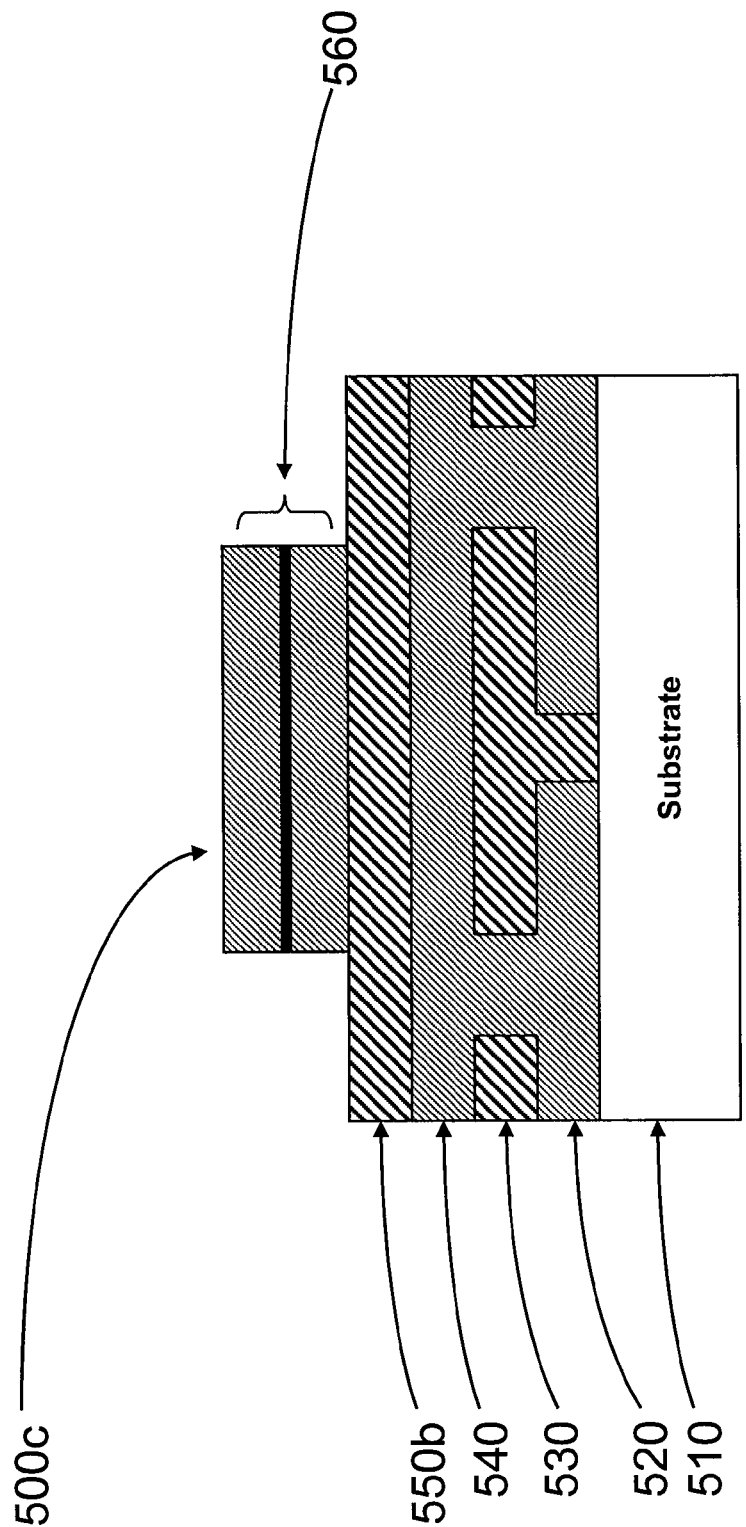

The CMP process may flatten second dielectric layer 550a into a smoother dielectric layer having few surface features and a relatively flat topology, such as second dielectric layer 550b of FIG. 5B. As shown in FIG. 5C, a trilayer Josephson junction 560 may be deposited upon second dielectric layer 550b.

Figure 5D:
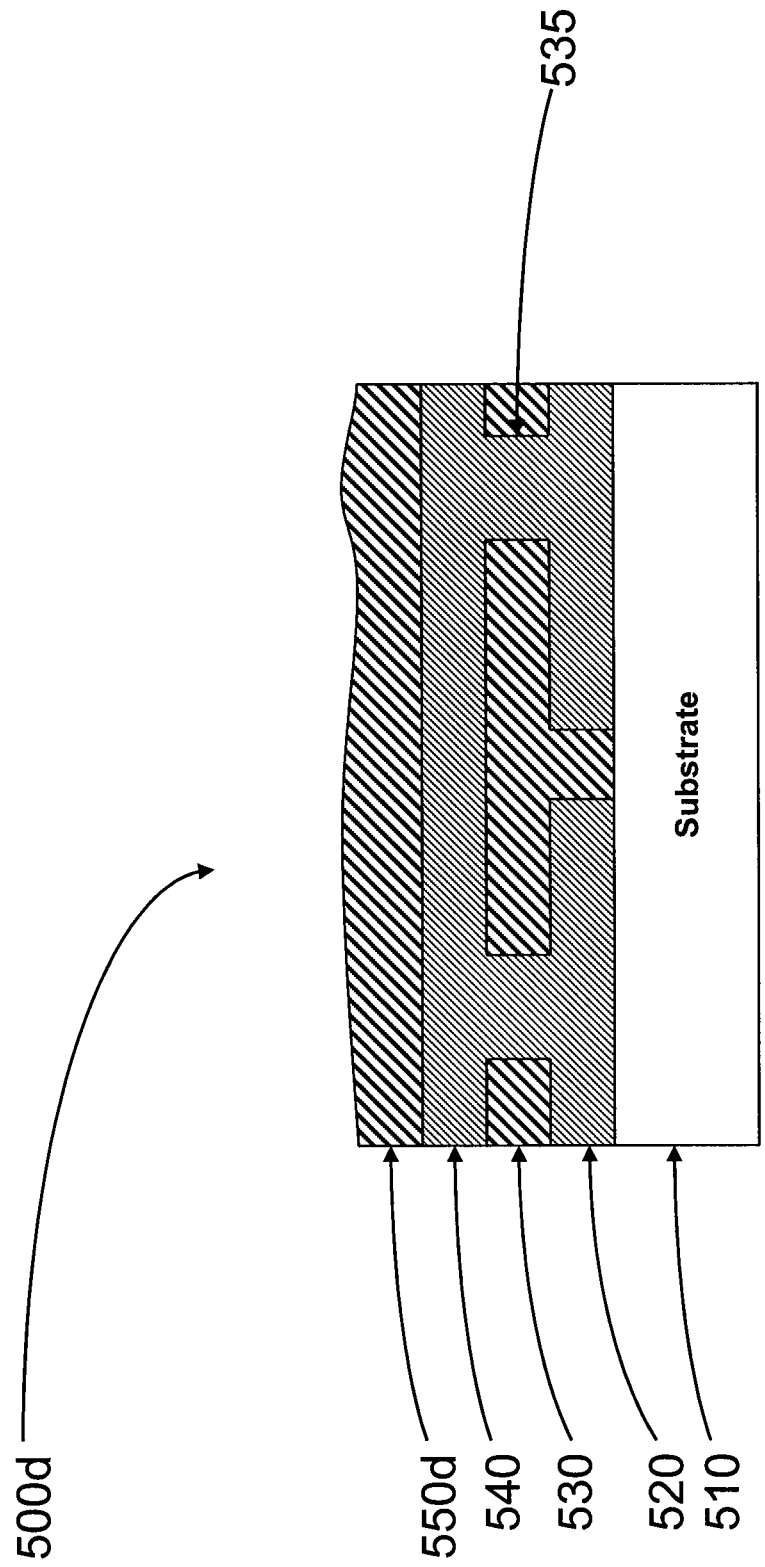
Figure 5E:
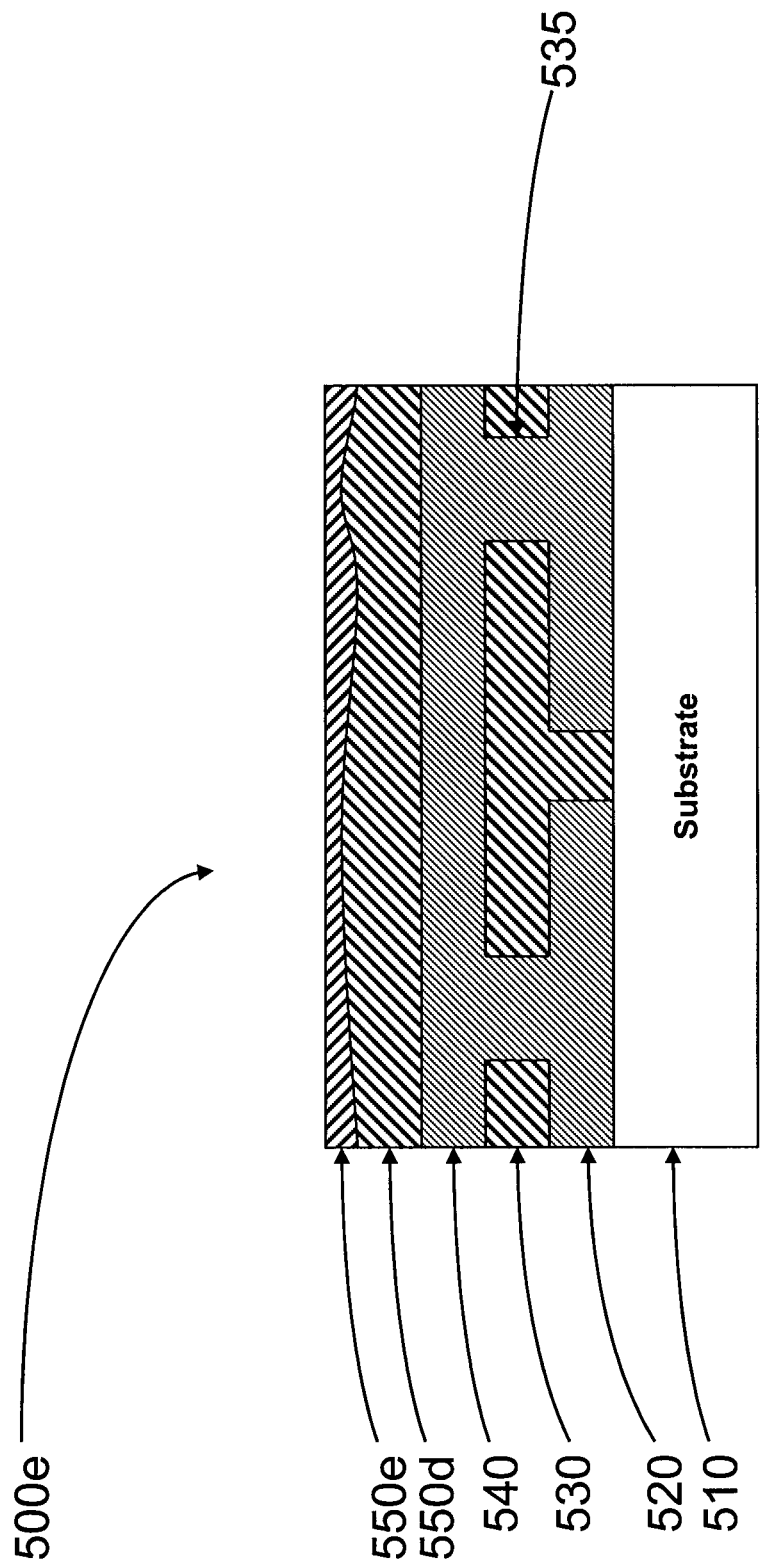
Figure 5F:
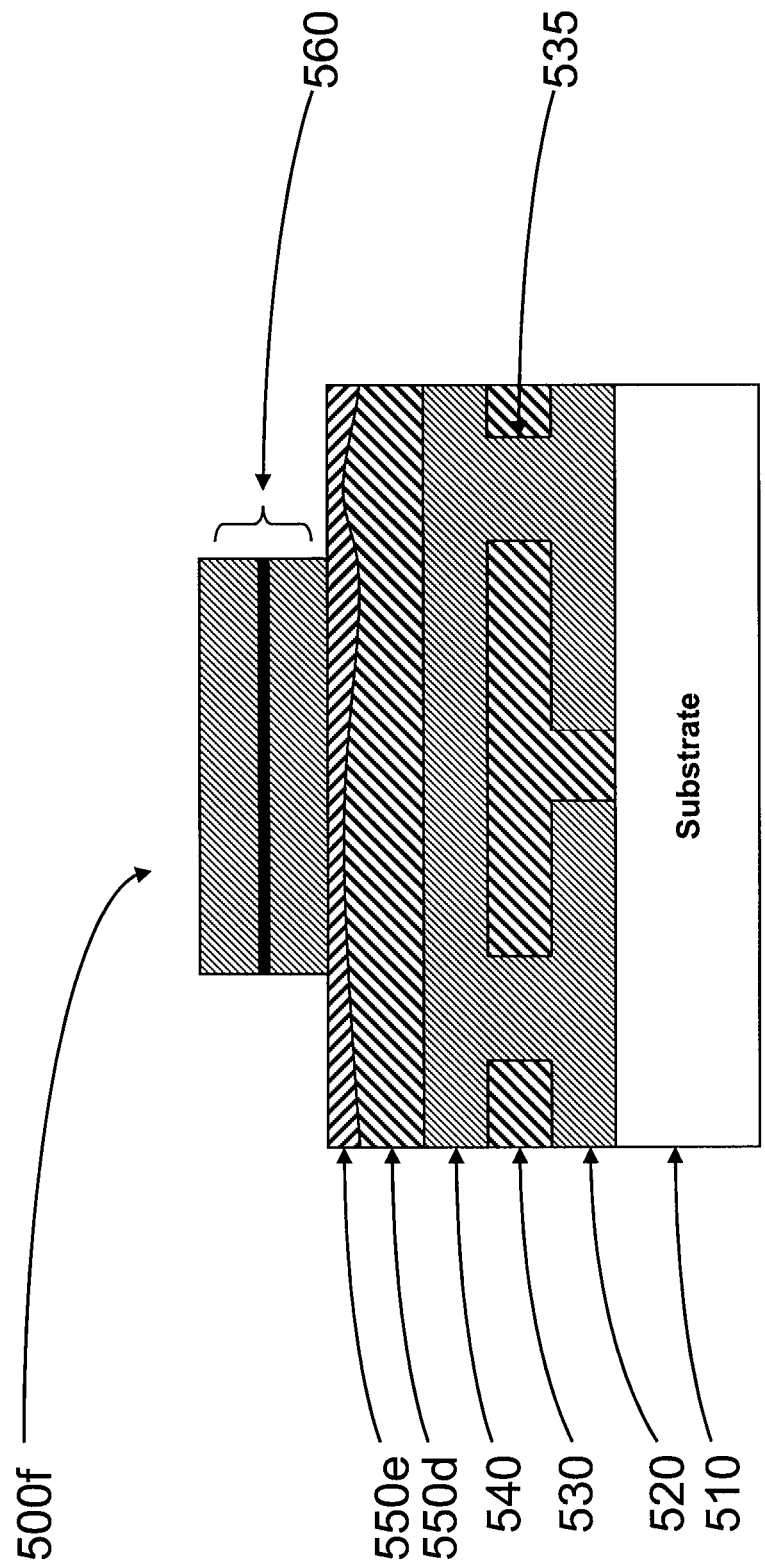

The CMP process may not provide a sufficiently flat second dielectric layer 550b to allow for the deposition of Josephson junctions with high yields. This situation is illustrated by second dielectric layer 550d in FIG. 5D. Scratches may be formed during the CMP process which may be deep and adversely affect the deposition and formation of Josephson junction 560. In FIG. 5E, a third dielectric layer 550e may be deposited upon second dielectric 550d thereby smoothing and bridging scratches formed during the CMP process. Third dielectric layer 550e may include $SiO_2$, SiN, hydrogenated amorphous silicon, organic polymer dielectrics or a similar dielectric material. The deposition of third dielectric layer 550e upon second dielectric layer 550d may advantageously provide a dielectric surface with reduced surface features. The third dielectric layer 550e may provide a surface with sufficiently few surface features so as to allow the deposition of Josephson junction 560 upon third dielectric layer 550e, as shown in FIG. 5F without the need for further planarization.

Dielectric layers 530, 550a-550e are used to isolate metal layers within integrated circuit 500. Defects, such as voids and impurities, in the dielectric layers 530, 550a-550e may introduce noise within superconducting quantum devices due to voltage fluctuations within two level systems caused by the defects. If the dielectric layers 530, 550a-550e do not each form a respective uniform crystalline or polycrystalline structure and, instead, contain random bonds and voids, two level systems may be created where electrons tunnel between two energy potentials at microwave frequencies. This tunneling may generate noise within the dielectric which can affect quantum devices, such as those devices made in metal layers 520, 540 and Josephson junction 560. Quantum devices may interact with the defects which may cause the coherence of the quantum devices to be disrupted thereby producing errors during quantum computation or other forms of computation requiring a high number of bits of precision. Standard semiconductor devices are typically not adversely affected by such noise.

To reduce the amount of interference produced by imperfections within dielectric layers 530, 550a-550e, these layers may be incorporated into the integrated circuit 500 at high temperatures. Producing dielectric layers 530, 550a-550e at temperatures at and/or below about 200 degrees Celsius may result in high numbers of defects within dielectric layers 530, 550a-550e. Increasing the temperature at which the dielectric layers 530, 550a-550e are deposited may decrease the number of defects within the dielectric. At higher temperatures, such as temperatures above ~400 degrees Celsius, low-defect density dielectrics may be formed by the dielectric layers 530, 550a-550e which may reduce noise which adversely affects quantum devices.

Superconducting devices, such as Josephson junction 560, may be delicate and susceptible to damage should they be heated above temperatures of about 200 degrees Celsius. After incorporating Josephson junction 560 into the integrated circuit 500, all additional fabrication acts which follow the deposition and formation of Josephson junction 560 should typically not be performed at temperatures above about 200 degrees Celsius to avoid the risk of degradation of the Josephson junction 560. Therefore, creating an integrated circuit 500 with Josephson junction 560 deposited atop of dielectric layers 530, 550a-550e, allows dielectric layers 530, 550a-550e to be advantageously produced at higher temperatures before Josephson junction 560 is formed. This process may result in better performance of integrated circuit 500 compared to, for example, circuit 400 that has the Josephson junction trilayer 420 deposited on the substrate 410.

Silicon deposited at lower temperatures may be passivated, for example with hydrogen, to create hydrogenated amorphous silicon. The hydrogen bonds itself to defects within the silicon so as to reduce the number of two level systems within the dielectric and at surface interfaces of the dielectric. Further, deuterium may be used to passivate the dielectric so as to reduce the amount of noise from spins in the nucleus of $^1H$. Such may reduce the amount of noise coupled into the quantum devices from the environment.

Figure 5G:
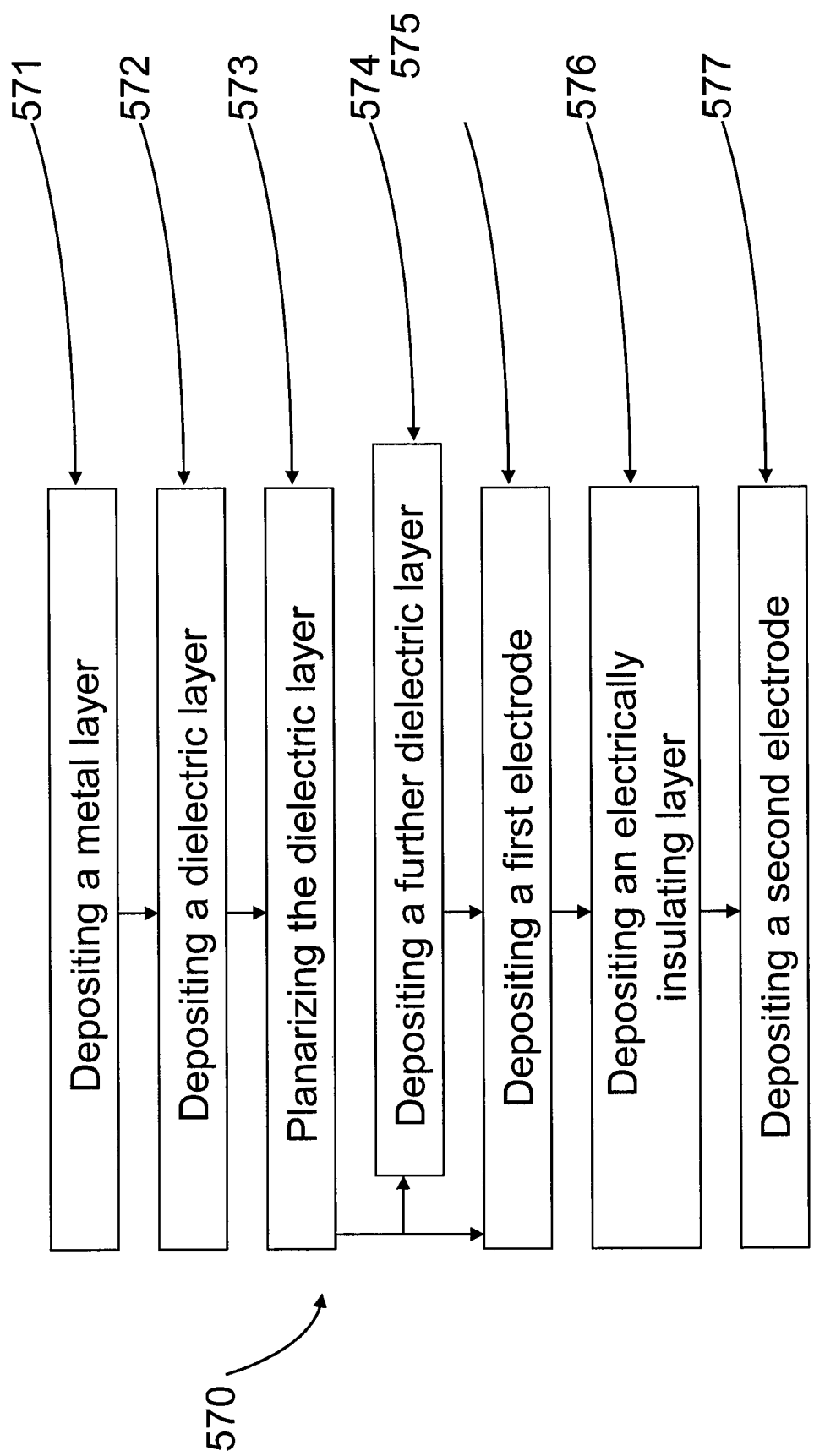
FIG. 5G is a flow chart illustrating a fabrication method to produce the structures illustrated in FIGS. 5A-5F, according to one illustrated embodiment.

FIG. 5G summarizes a process 570 described in FIGS. 5A-5F. Process 570 begins at 571 with depositing a metal layer, such as second metal layer 540. For example, the metal layer may be deposited on a substrate or on a previously-deposited dielectric layer, such as dielectric layer 530. Then, at 572, depositing a dielectric layer on top of the metal layer, such as second dielectric layer 550a on top of second metal layer 540, is done. At 573, second dielectric layer 550a is planarized (e.g., by MPP or CMP) to become dielectric layer 550b or 550d. Optionally, at 574, a further dielectric layer, such as third dielectric layer 550e may be deposited upon dielectric layer 550d. At 575 a first electrode is deposited, followed by, at 576, an electrically insulating layer, and a second electrode is deposited at 577 ending process 570. These three actions form a Josephson junction, such as Josephson junction 560. In some embodiments, acts 575-577 may correspond to the deposition of a trilayer Josephson junction according to techniques known in the art.

The process 570 described in FIG. 5G and illustrated in FIGS. 5A through 5F allows the dielectric layers 530, 550a-550e to be deposited at high temperatures in order to reduce defects and impurities that can give rise to detrimental noise in the circuit. This is accomplished by preparing the circuit in such a way (i.e., high quality planarization of the topmost dielectric 550e) that trilayer Josephson junction 560 may be deposited on top of the dielectric after the high temperature process is complete. In accordance with the present systems and methods, undesirable noise from dielectric layers may be further/alternatively reduced by perforating the dielectric layer(s). For example, a dielectric layer carrying a superconducting metal layer (forming, for example, at least a portion of a superconducting quantum device such as a superconducting qubit) may be perforated with gaps, pockets of gas and/or vacuum holes (to resemble a foam, sponge, or swiss cheese) in order to reduce the quantity of dielectric material within any given layer volume.

As previously described, depositing a dielectric layer at a higher temperature can be advantageous because it can help reduce the number of defects in the dielectric. As a specific example, depositing a dielectric material at a higher temperature can help reduce the size and/or number of and/or presence of unwanted voids in the dielectric. Voids may be unwanted in a dielectric layer if a metal layer is to be subsequently deposited, since the voids may then be filled with the metal to provide an unwanted conduit for electrical conduction through the dielectric. Deposition at higher temperatures can help to mitigate voids because a dielectric material may flow more readily at higher temperatures than at lower temperatures. Unfortunately, any dielectric layer that is deposited after the deposition of a Josephson junction trilayer is typically done so at a lower temperature in order to reduce the risk of junction degradation. In accordance with the present systems and methods, the presence of voids in a dielectric layer may be mitigated by using a high density plasma ("HDP") process during deposition of the dielectric layer. In some embodiments, the HDP process may involve alternating between depositing and etching the dielectric layer in order to ensure that at least some voids are exposed and filled during the deposition process.

Resistors

Superconducting integrated circuits may incorporate devices which rely on resistors to function. At cryogenic temperatures, many metals superconduct which makes them poorly suited to function as resistors. Some materials, such as palladium and gold, which function well as resistors, are not easily integrated into existing multipurpose semiconductor fabrication facilities. Palladium reacts readily with many materials used within multipurpose semiconductor fabrication facilities and therefore the fabrication facilities will typically not allow the use of palladium on machines which are used by other clients or processes. Similarly, gold is not allowed in most conventional semiconductor fabrication facilities as it may contaminate machines used during CMOS production. Nevertheless, the use of both palladium and/or gold as resistors may be desirable in superconducting integrated circuits.

Platinum is very nonreactive with other materials and may act as a resistor at milliKelvin temperatures, so is well suited to form resistors for superconducting integrated circuits produced in multipurpose semiconductor fabrication facilities.

Further materials which may act as resistors at cryogenic temperatures include, but are not limited to, palladium gold, molybdenum and non-stoichiometric niobium nitride ($NbN_x$).

Figure 6A:
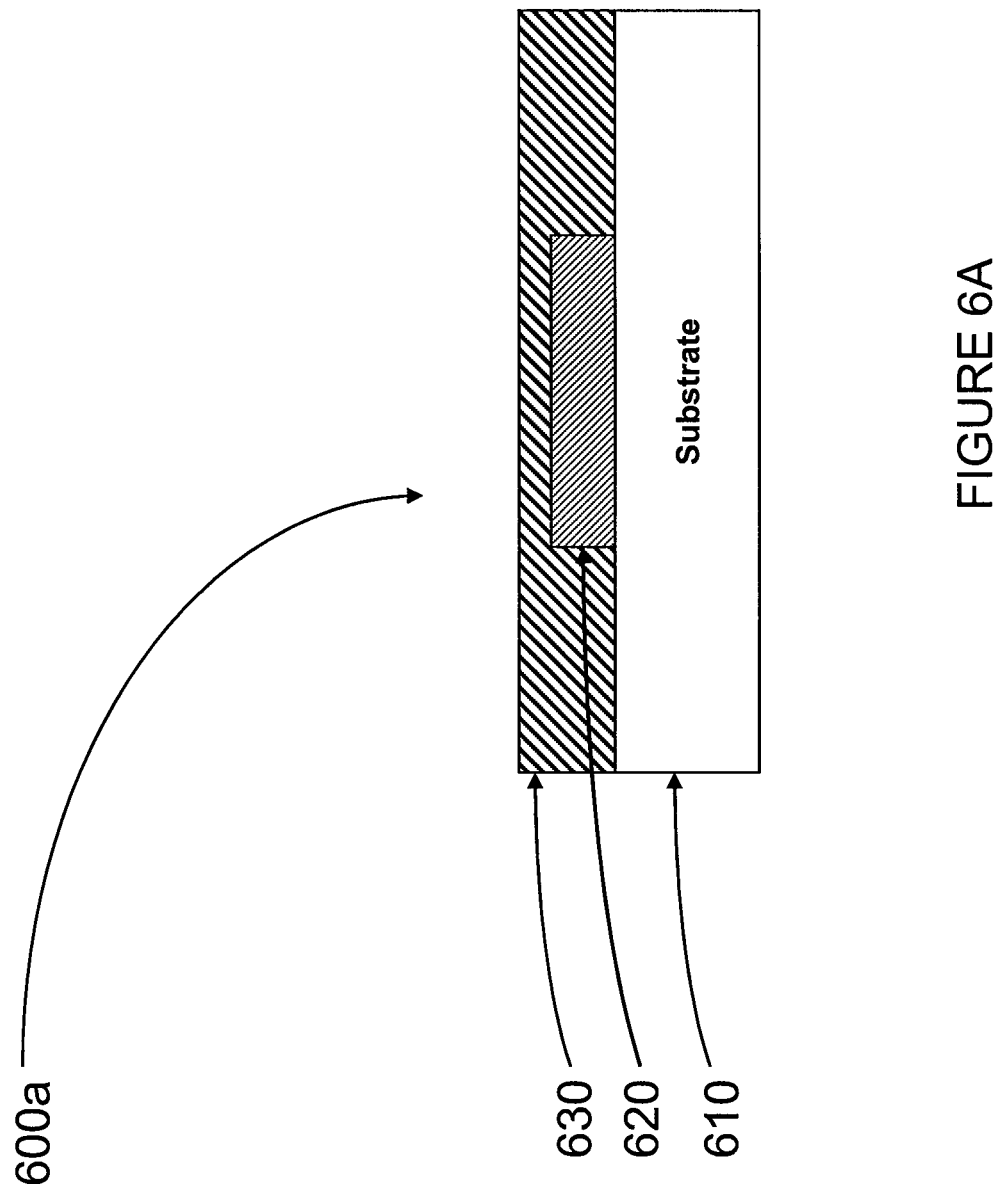
FIGS. 6A, 6B, 6C, 6D and 6E are cross-sectional views of a superconducting integrated circuit at different phases of a fabrication process.

FIG. 6A shows an integrated circuit 600a having a substrate 610, a resistor 620 and a dielectric layer 630. Substrate 610 may include silicon, sapphire or a similar substrate material providing a flat surface upon which integrated circuit 600a may be deposited. Resistor 620 may include platinum or a similar material which is resistive at operating temperatures of integrated circuit 600a. Resistor 620 may be made, for example, approximately 600 Angstroms thick, though a person of skill in the art would appreciate that alternative embodiments may employ resistors of other thicknesses. A thickness of 2000 Angstroms or more may be suitable for certain systems and methods whereas thinner resistors may be more suited to other applications. By having resistor 620 directly carried on substrate 610 the thickness of resistor 620 does not impact the design of the rest of integrated circuit 600a due to planarizable dielectrics. Some embodiments of the present systems and methods may require resistors having thick depositions where other embodiments may function with thinner depositions of resistive material. Dielectric layer 630 may include $SiO_2$, SiN, hydrogenated amorphous silicon, organic polymer dielectric materials or similar dielectric material. Resistor 620 is advantageously positioned near substrate 610 such that any heat generated within resistor 620 during the operation of integrated circuit 600a will quickly and efficiently be removed from integrated circuit 600a via substrate 610 to reduce adverse heating of other regions of integrated circuit 600a. Heat generation may be a problem during the operation of integrated circuit 600a since metal layers within integrated circuit 600a may be made of superconducting metal, and such metal must be kept below its critical temperature else the metal will cease superconducting.

A resistor may be placed within a wiring layer carried on a dielectric layer which is not the substrate. There may be thermal coupling (i.e., "syncing") between the resistor carried on the dielectric layer and the substrate wherein the thermal contact between the resistor and the substrate is strong to allow heat generated within the resistor to be removed from the integrated circuit efficiently and quickly without heating up components near the resistor. The thermal coupling may advantageously be thermally conductive coupling. There may be a resistor carried on two different layers of an integrated circuit. There may be thin-film cooling fins attached to the resistor, as described by Vinante et al., Physical Review B 75, 104303 (2007), where fins may cool resistors by increasing the likelihood of electron-phonon interactions. The volume of the fin may be several orders of magnitude larger than the volume of the resistor to give a much larger effective volume available for electron-phonon interactions, reducing the overheating due to the hot-electron effect. FIG. 6F shows integrated circuit 600f having resistor 620 and an associated fin 680. Fin 680 may have a much larger volume and/or surface area than resistor 620. Fin 680 may be made of a material that is non-resistive at temperatures below a critical temperature for circuit 600f. In some embodiments, cooling fins may be placed on resistors not carried directly on substrate 610. FIG. 6G shows integrated circuit 600g having a first metal layer 690 carried by substrate 610. Dielectric layer 630 is carried by substrate 610 and first metal layer 690. A resistor 625 and a cooling fin 685 are carried by dielectric layer 630. Fin 685 may reduce overheating in resistors not in direct thermal contact with substrate 610. Fin 685 may be in thermal contact (not shown) with substrate 610.

Figure 6B:
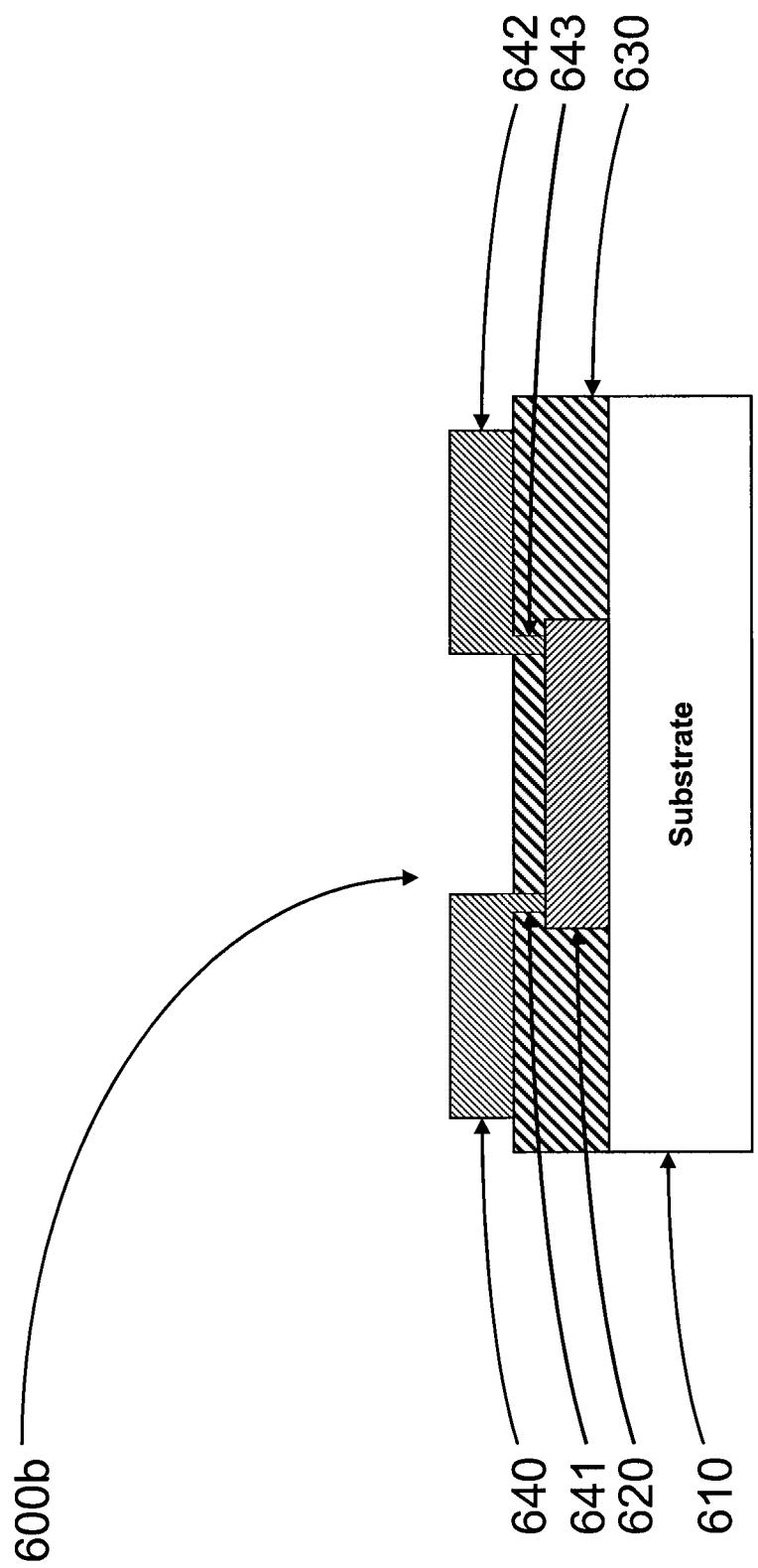

FIG. 6B shows an integrated circuit 600b. Two vias 641, 643 exist through dielectric layer 630 and at least partially include a superconducting metal, such as niobium. Vias 641, 643 may be made by first using a CMP process to thin dielectric layer 630 to, for example, approximately 1000 or 1500 Angstroms. Dielectric layers having thicknesses of 1000 or 1500 Angstroms may be needed to isolate adjacent layers of integrated circuit 600b due to the low noise requirements of integrated circuit 600b. The thickness of dielectric layer 630 will depend on many factors, such as the thickness of resistor 620 and the size of other components within superconducting integrated circuit 600b. After dielectric layer 630 has been thinned, a hole of approximately 1 micrometer in width or less (e.g., 0.5 micrometers in width or less) may be produced by, for example, a photoresist deposition and etching, or by other processes capable of producing holes in dielectric materials. The hole may then be at least partially filled with niobium or similar metal capable of superconducting to produce the via (e.g., 641, 643). The hole formed in dielectric layer 630 may, for example, have a width of about 1 micrometer or greater where the thickness of dielectric layer 630 is such that vias 641, 643 provide sufficient electrical contact for the critical current between adjacent layers of integrated circuit 600b. Some holes may have a width of about 300 Angstroms or less where dielectric layers having a thickness of 2000 Angstroms or more are used, resulting in depth-to-width aspect ratios of greater than 6:1. The depth-to-width aspect ratio of vias 641, 643 may be such that it allows niobium to produce an electrical contact between metal layers 640, 642 and resistor 620. Should the width of a hole be less than about two or three times the depth of the hole, the niobium may not adequately fill the hole to reliably form the via 641, 643 and provide sufficient electrical contact between metal layers 640, 642 and resistor 620. Metal layers 640, 642 may make connections with vias 641, 643 respectively such that electric current flowing through metal layer 640 has a connective path through via 641, resistor 620, via 643, and metal layer 642. Metal layers 640, 642, and vias 641, 643 may be superconducting at operational temperatures of integrated circuit 600b whereas resistor 620 may not superconduct at operational temperatures of integrated circuit 600b. A person of skill in the art would appreciate that holes with smaller depth-to-width aspect ratios for vias may be made, but the density of components of integrated circuit 600b may not be reduced compared to when wider vias are included in integrated circuit 600b. The thickness of dielectric layer 630 above resistor 620 may be increased or decreased. Higher yields of integrated circuit 600b may, however, be attained should the requirements for large depth-to-width aspect ratio vias be relaxed. In some embodiments, the depth-to-width aspect ratio of vias 641, 643 may be greater than 0.7:1, 1:1, 2:1, 3:1, 6:1 or greater.

Figure 6C:
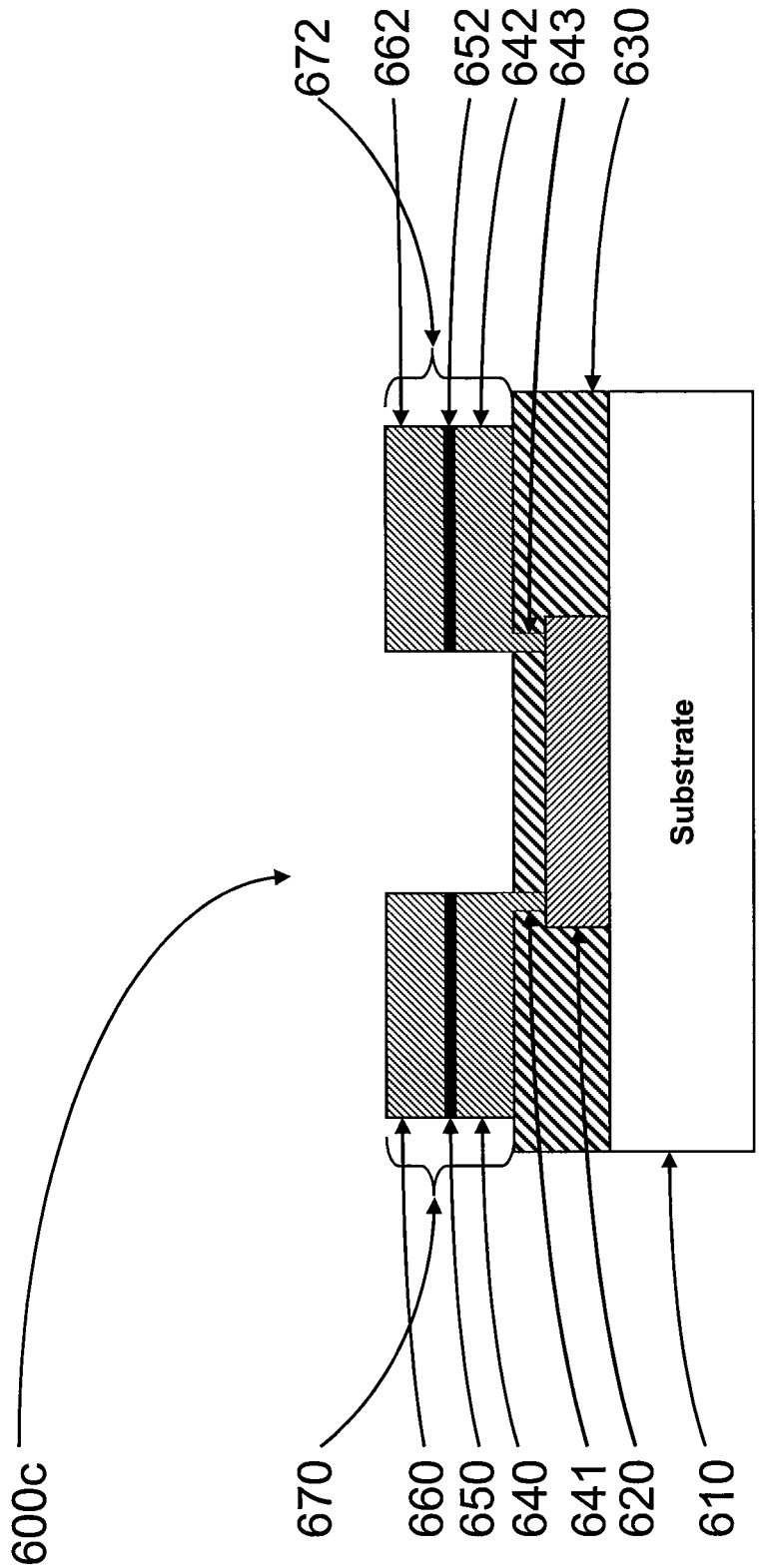

Further, integrated circuit 600c is shown in FIG. 6C. Metal layers 640, 642 may respectively have electrically insulating layers 650, 652 deposited upon them, and second metal layers 660, 662 may be deposited upon electrically insulating layers 650 and 652, respectively. Electrically insulating layers 650, 652 may comprise aluminum oxide or a similar suitable material. Metal layers 660, 662 may comprise niobium, aluminum, lead, zinc, tin, or similar metal capable of superconducting. Metal layer 640, oxide layer 650 and second metal layer 660 may form a trilayer Josephson junction 670. Metal layer 642, electrically insulating layer 652 and second metal layer 662 may form a trilayer Josephson junction 672. Resistor 620 may be required for or useful to achieve a desired operation of integrated circuit 600c. Reducing the inductance between Josephson junctions 670, 672 and resistor 620 may improve performance of integrated circuit 600c, and by placing via 641 between Josephson junction 670 and resistor 620, as well as via 643 between Josephson junction 672 and resistor 620, the parasitic inductance between Josephson junctions 670, 672 and resistor 620 may be reduced substantially as compared to alternative integrated circuits which may utilize extensive wiring to connect Josephson junctions 670, 672 and a resistor, such as resistor 620.

Figure 6D:
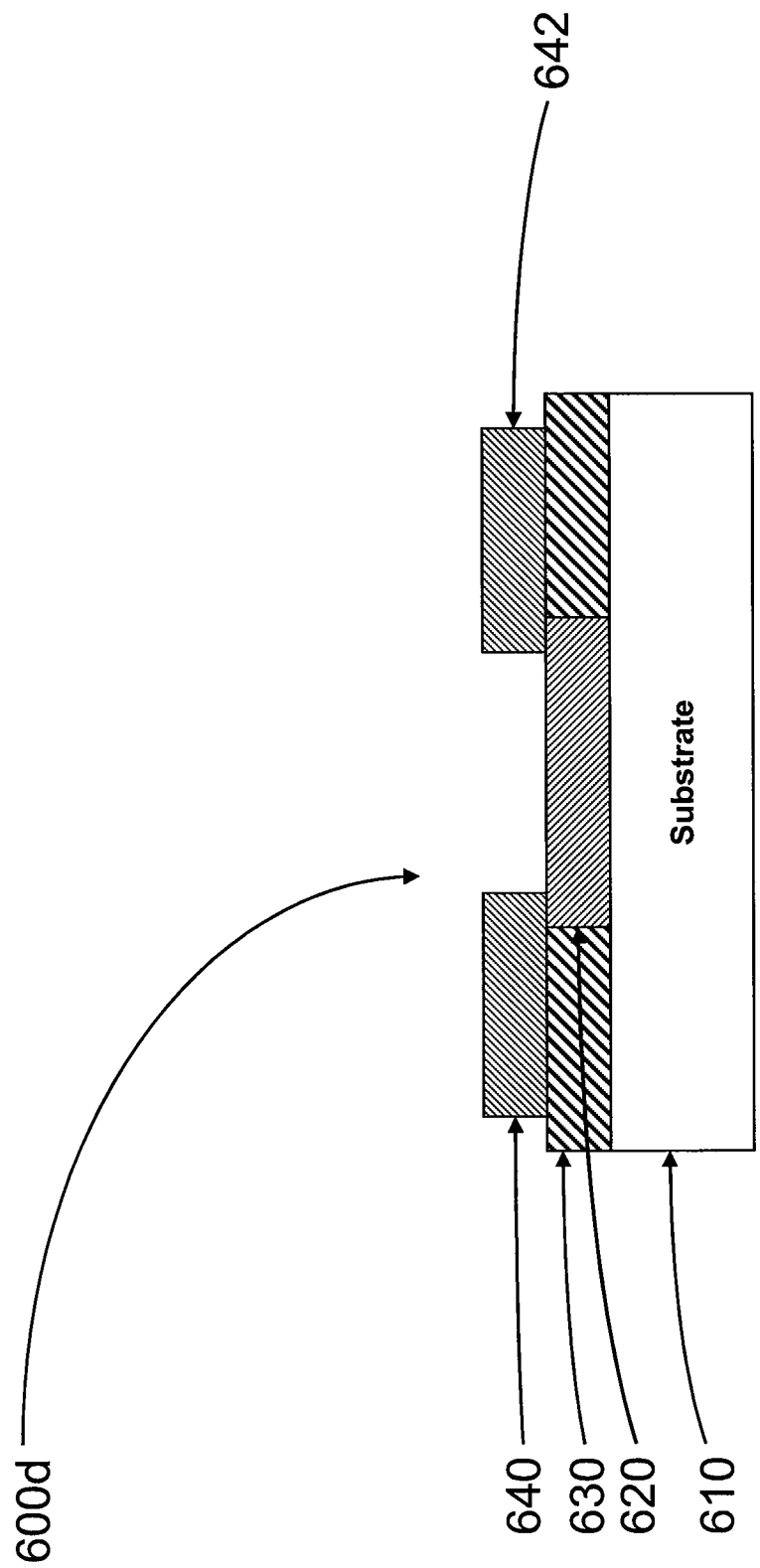

FIG. 6D shows a superconducting integrated circuit 600d. A CMP process may be applied to integrated circuit 600a from FIG. 6A in order to thin dielectric layer 630 such that dielectric layer 630 is of similar (e.g., equal) height with resistor 620, as shown in FIG. 6D. Metal layers 640, 642 may then be deposited to make strap contact connections with resistor 620 such that electric current flowing through metal layer 640 has a connective path through resistor 620 and metal layer 642. Metal layers 640, 642 may be superconducting at operational temperatures of integrated circuit 600d whereas resistor 620 may not superconduct at operational temperatures of integrated circuit 600d.

Figure 6E:
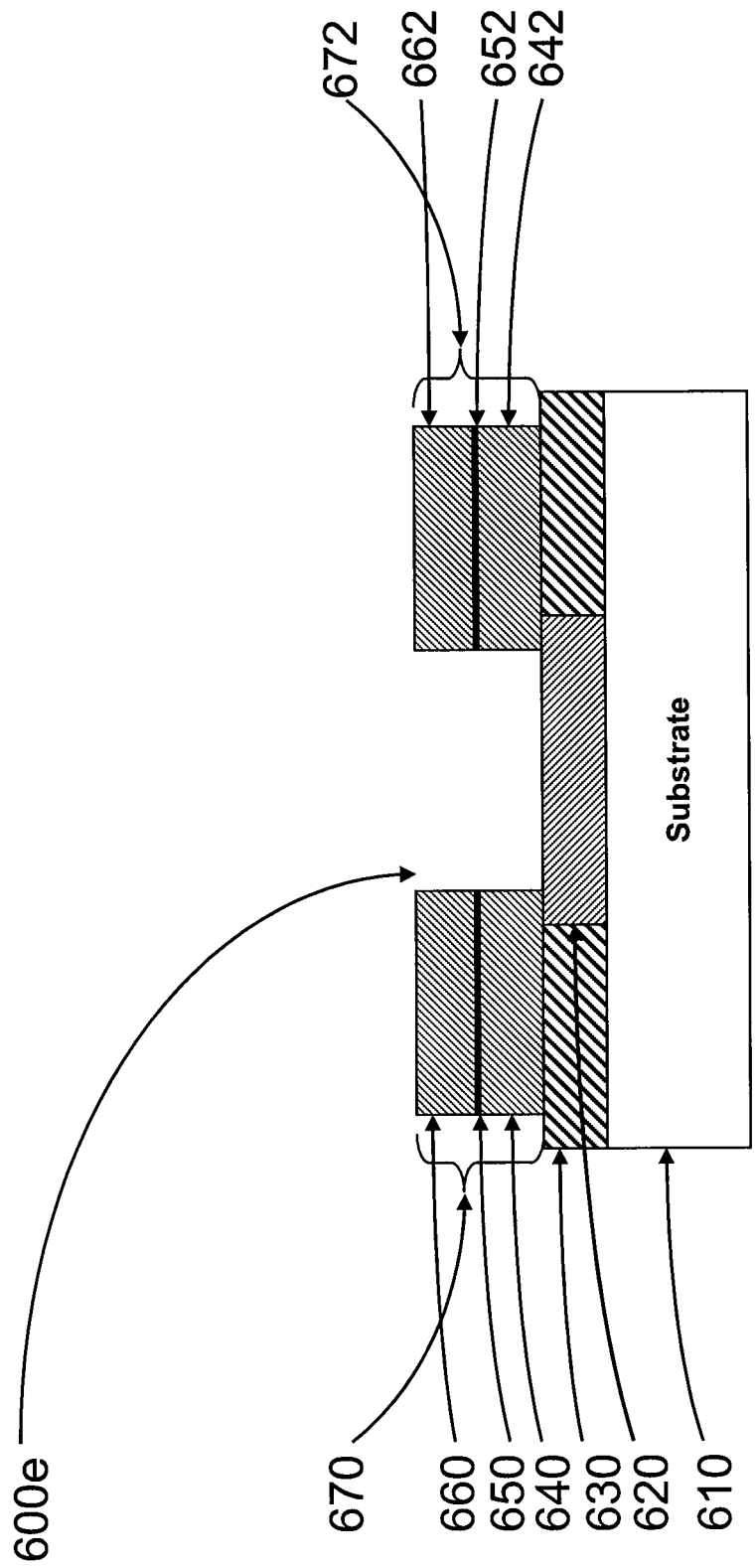
Figure 6F:
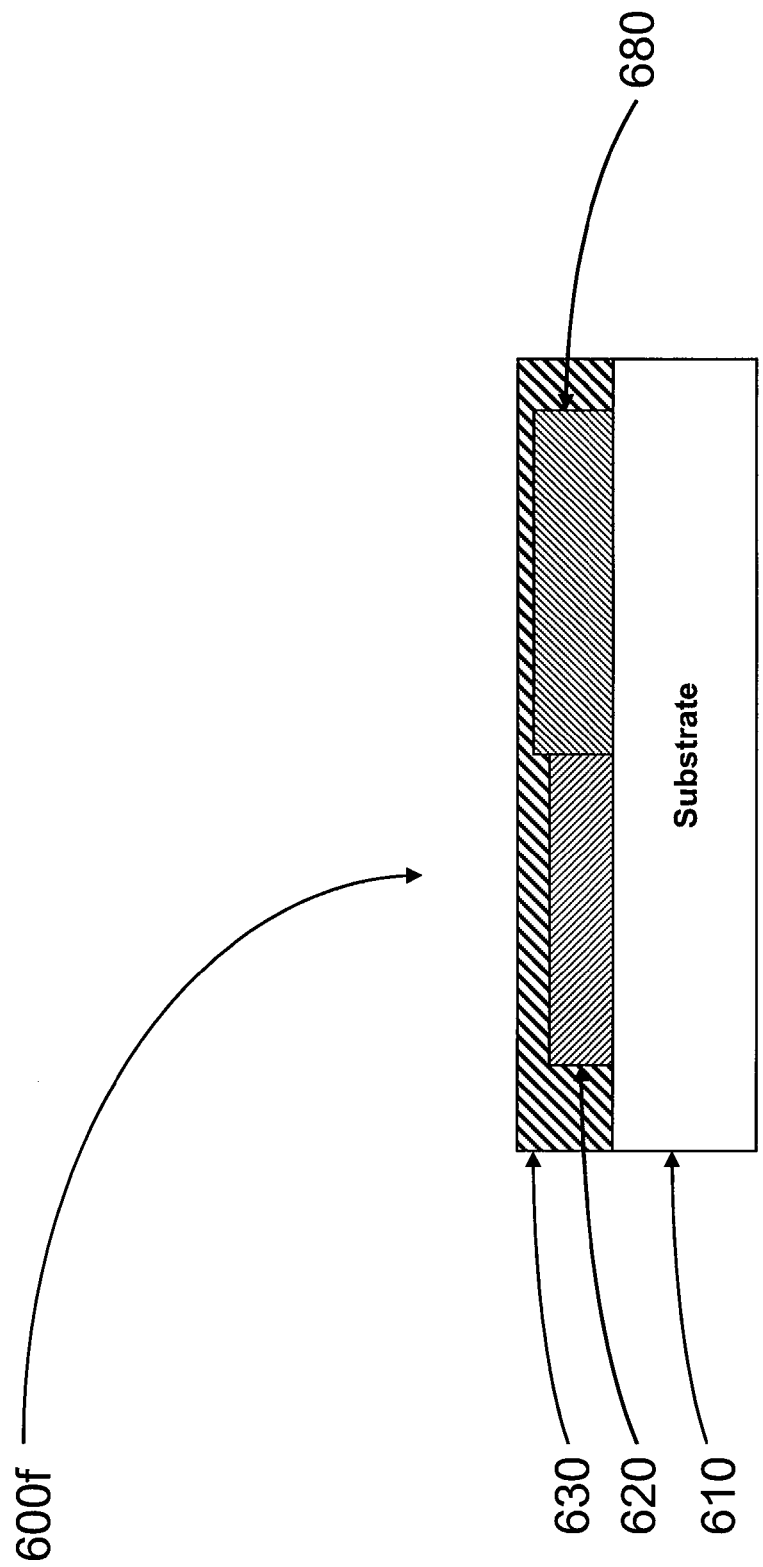
FIG. 6F is cross-sectional view of an integrated circuit having a resistor and an associated fin to dissipate heat from the resistor, according to one illustrated embodiment.
Figure 6G:
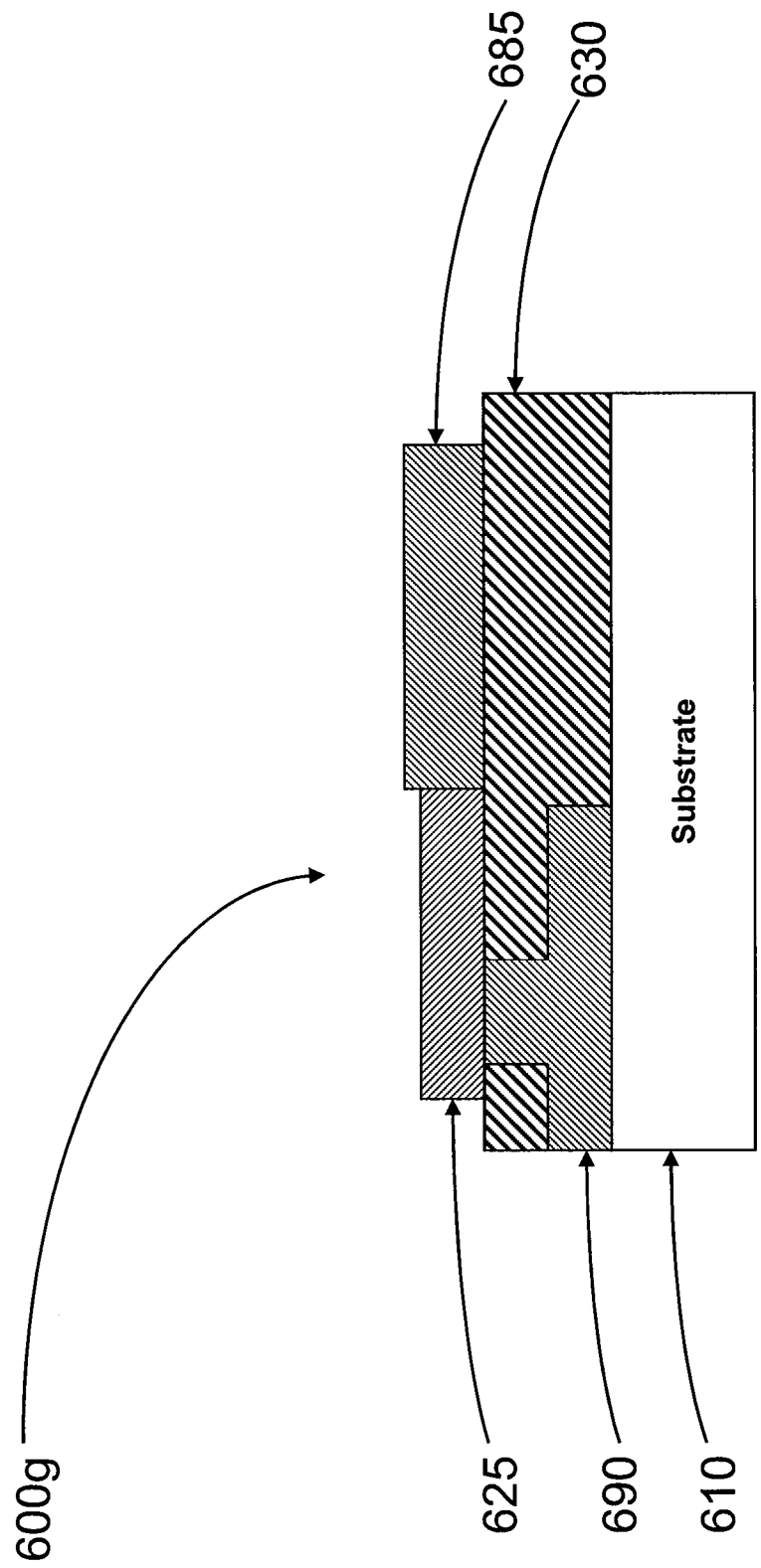
FIG. 6G is a cross-sectional view of an integrated circuit having a resistor and an associated fin to dissipate heat from the resistor, according to another illustrated embodiment.

Further, integrated circuit 600e is shown in FIG. 6E. Metal layers 640, 642 may have electrically insulating layers 650, 652 respectively deposited upon them, and second metal layers 660, 662 may be deposited upon electrically insulating layers 650 and 652, respectively. Electrically insulating layers 650, 652 may include aluminum oxide or a similar suitable material. Metal layers 660, 662 may include niobium, aluminum, lead, zinc, tin, or similar metal capable of superconducting. Metal layer 640, electrically insulating layer 650 and second metal layer 660 may form a trilayer Josephson junction 670. Metal layer 642, electrically insulating layer 652 and second metal layer 662 may form a trilayer Josephson junction 672. Resistor 620 may be required for or useful to achieve a desired operation of integrated circuit 600e. Reducing the inductance between Josephson junctions 670, 672 and resistor 620 may improve performance of integrated circuit 600e. By providing strap contacts to establish sufficient electrical contact for the critical current needed by the process between resistor 620 and Josephson junctions 671, 672, the parasitic inductance between Josephson junctions 670, 672 and resistor 620 may be reduced substantially compared to alternative integrated circuits which may utilize extensive wiring to connect Josephson junctions 670, 672 and resistor 620.

Figure 7A:
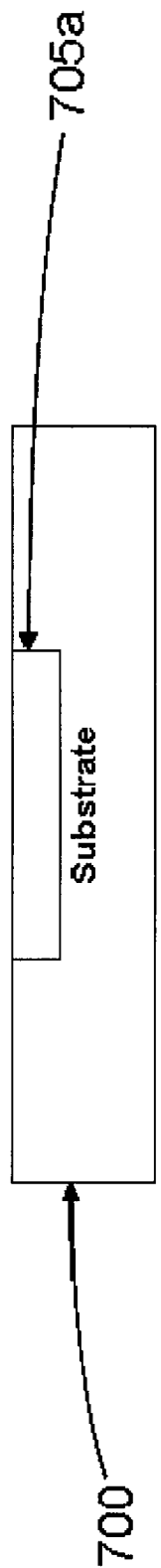
FIGS. 7A, 7B and 7C are cross-sectional views of a superconducting integrated circuit at different phases of a fabrication process.
Figure 7B:
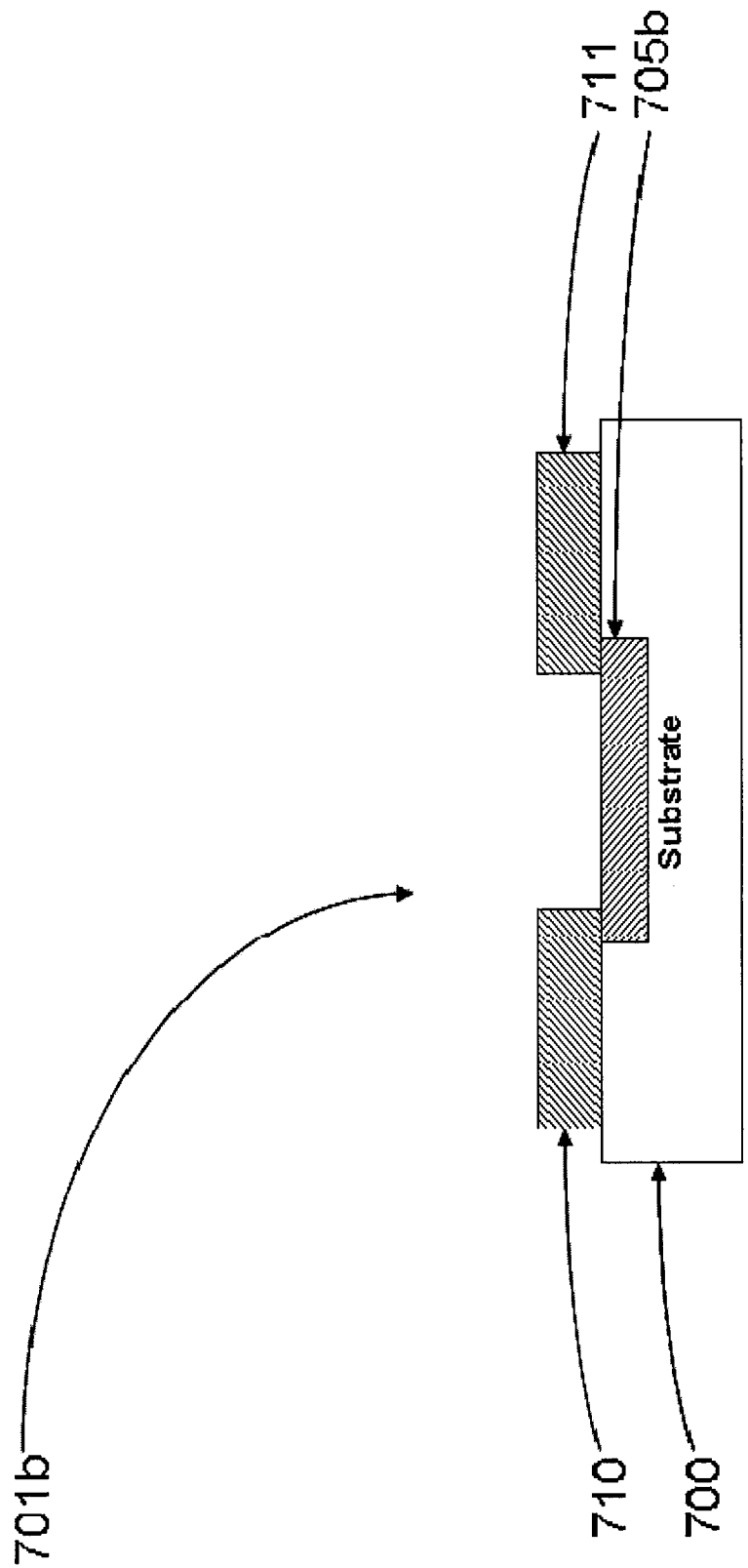

FIG. 7A shows a substrate 700 having a region 705a etched away. There may exist a dielectric layer deposited atop substrate 700 such that the region 705a is etched into the deposited dielectric layer. Substrate 700 may include silicon, sapphire or a similar substrate material providing a flat surface upon which integrated circuits may be deposited. FIG. 7B shows integrated circuit 701b having resistor 705b filling region 705a from FIG. 7A. Resistor 705b may include platinum or a similar material which is resistive at operating temperatures of integrated circuit 701b. By having resistor 705b fill region 705a, the thickness of resistor 705b does not impact the design of the rest of integrated circuit 701b. Further, by having resistor 705b fill region 705a, a large amount of surface area is created between resistor 705b and substrate 700 which may increase the speed at which heat is conducted away from resistor 705b. Thermalization of integrated circuit 701b may be, for example, directly related to the amount of time needed by certain types of quantum processors to compute a solution. By reducing the thermalization time of an adiabatic quantum processor, the speed of operating the processor may increase. Opposite ends of resistor 705b are in sufficient electrical contact with a metal layer 710 and a metal layer 711 to meet the critical current requirement of the integrated circuit 701b. Metal layers 710, 711 may include niobium, aluminum, lead, zinc, tin, or similar metal capable of superconducting. Resistor 705b is effectively embedded within substrate 700 such that any heat generated within resistor 705b during the operation of integrated circuit 701b will quickly and efficiently be conducted through substrate 700. Heat generation may be a problem during the operation of integrated circuit 701b since metal layers 710, 711 comprise superconducting metal which must be kept below its critical temperature to prevent metal layers 710, 711 from ceasing to superconduct.

Figure 7C:
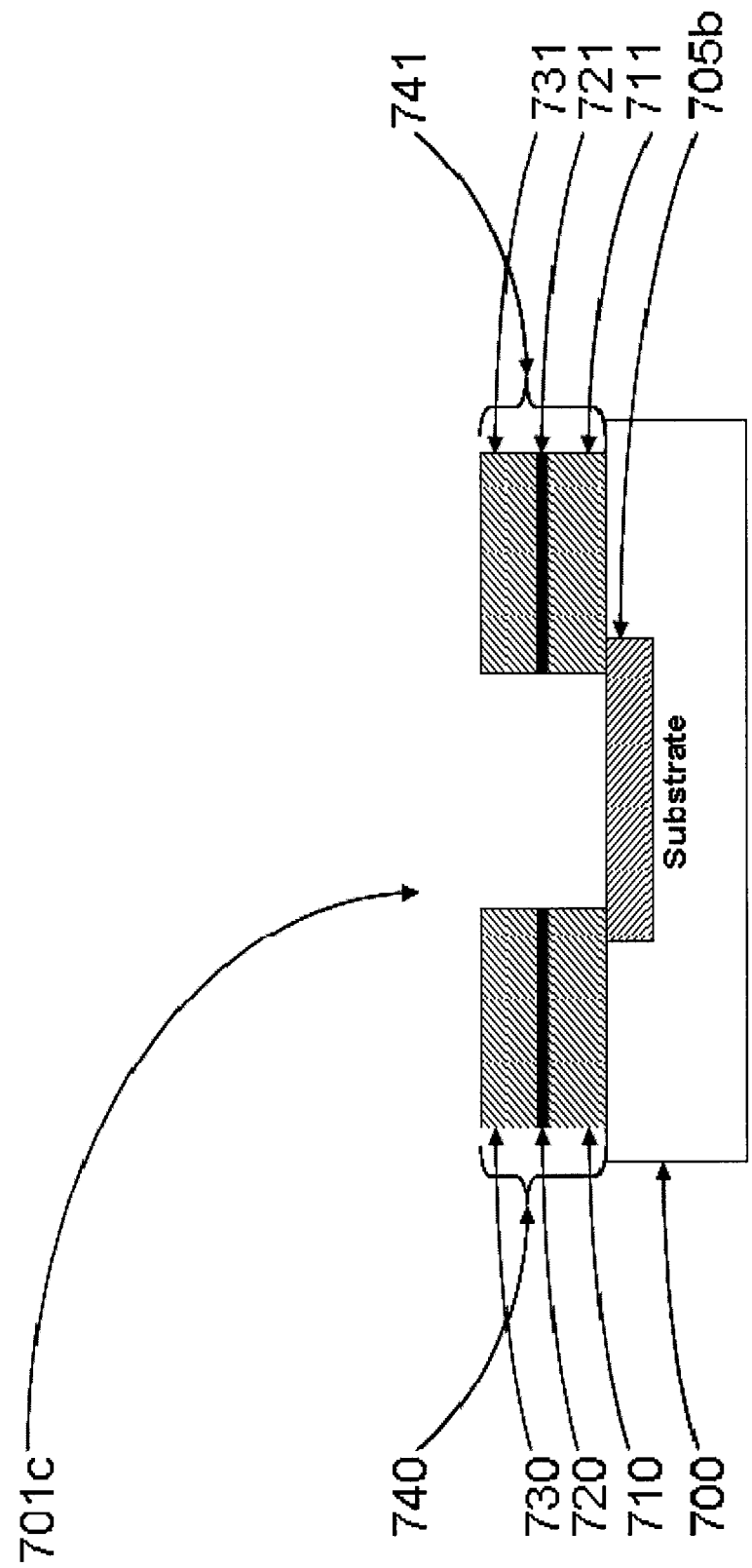

Further, integrated circuit 701c is shown in FIG. 7C. Metal layers 710, 711 may have electrically insulating layers 720, 721 respectively, deposited thereon, and second metal layers 730, 731 may be respectively deposited upon electrically insulating layers 720, 721. Electrically insulating layers 720, 721 may comprise aluminum oxide or a similar suitable material. Metal layers 730, 731 may comprise niobium, aluminum, lead, zinc, tin, or similar metal capable of superconducting. Metal layer 710, electrically insulating layer 720 and second metal layer 730 may form a trilayer Josephson junction 740. Metal layer 711, electrically insulating layer 721 and second metal layer 731 may form a trilayer Josephson junction 741. Resistor 705b may be required for or useful to achieve a desired operation of integrated circuit 701c. Reducing the inductance between Josephson junctions 740, 741 and resistor 705b may improve performance of integrated circuit 701c. By using a strap contact (as illustrated) between Josephson junction 740 and resistor 705b, as well as between Josephson junction 741 and resistor 705b, the parasitic inductance between Josephson junctions 740, 741 and resistor 705b may be minimized.

Figure 8A:
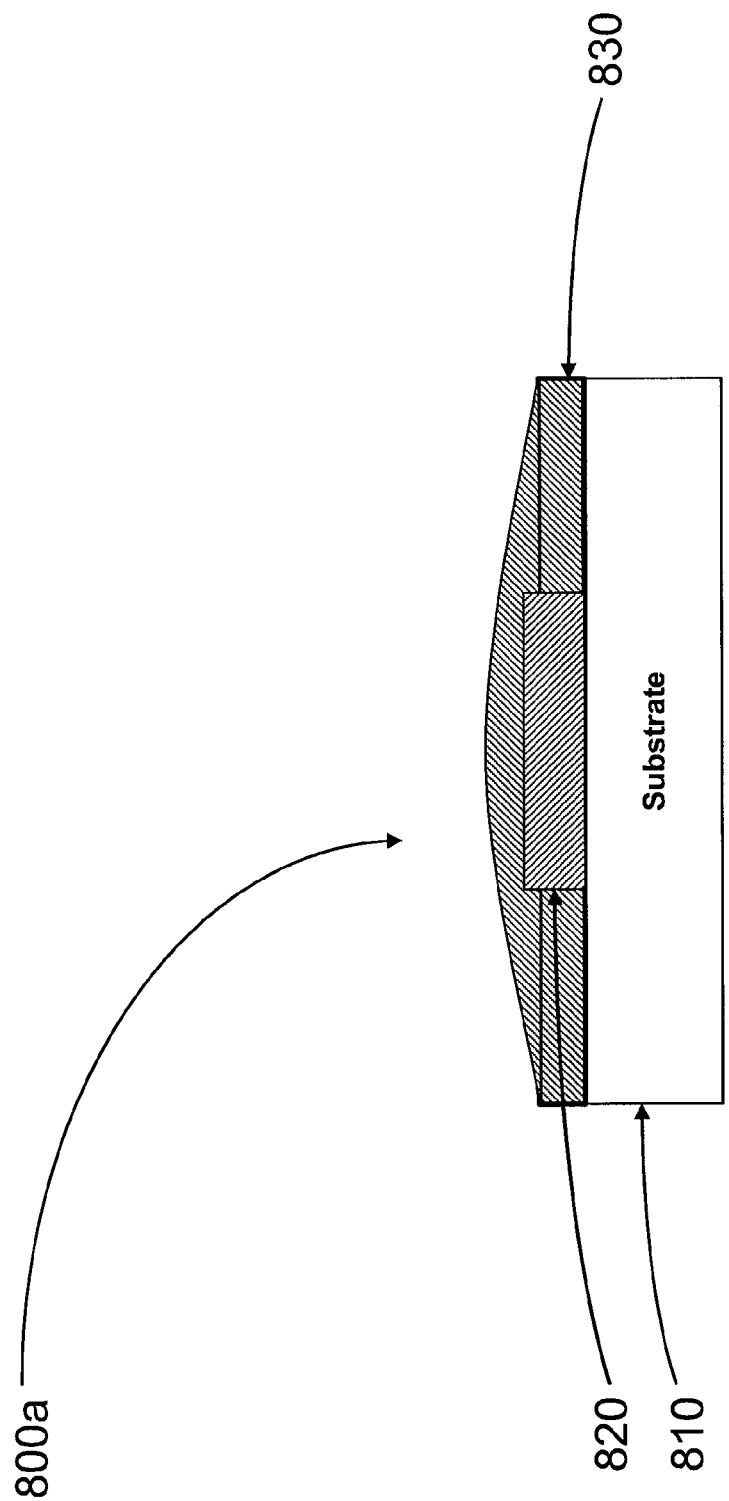
FIGS. 8A and 8B are cross-sectional views of a superconducting integrated circuit at different phases of a fabrication process.
Figure 8B:
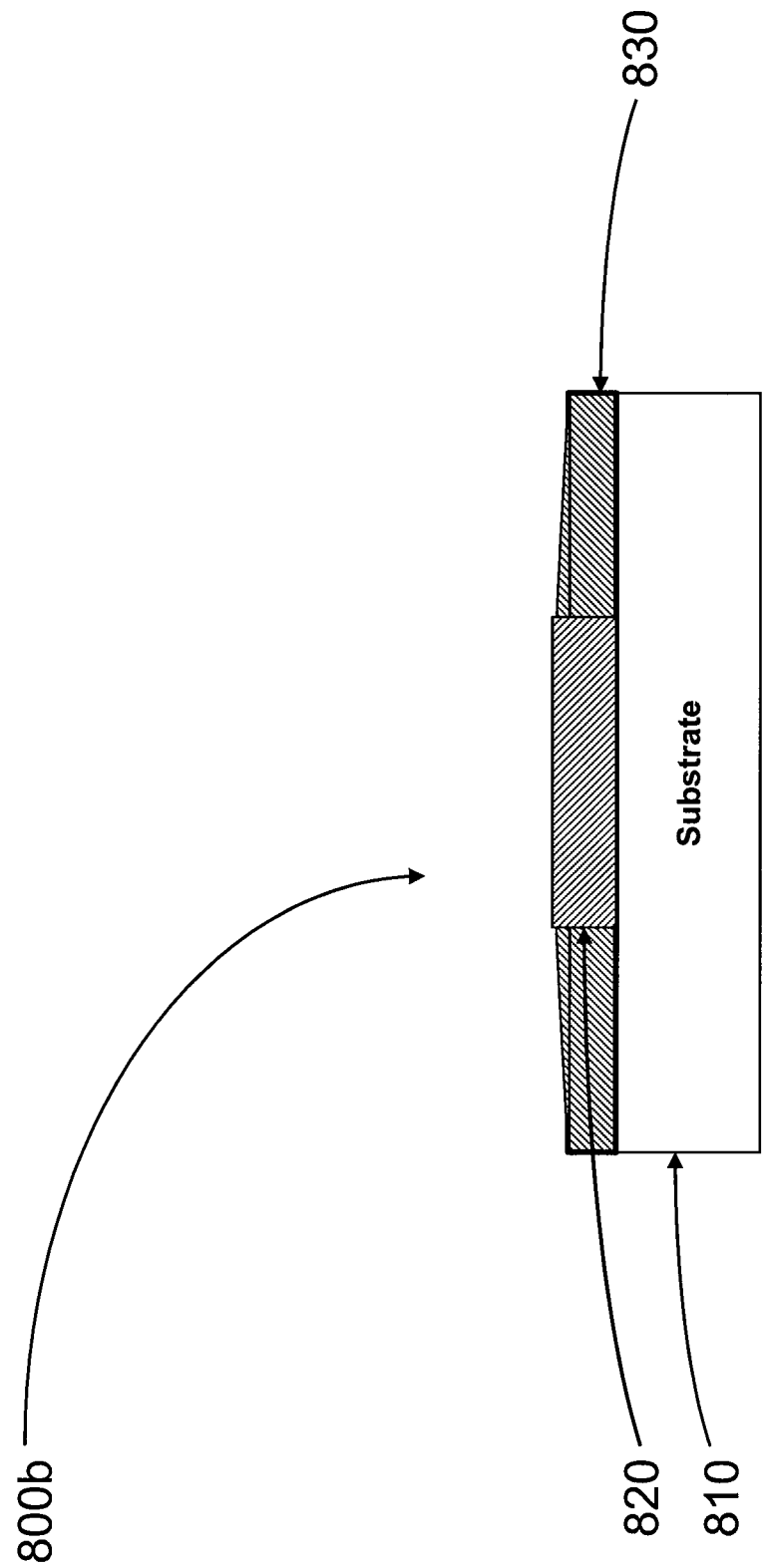

FIG. 8A depicts an integrated circuit 800a having a substrate 810, a resistor 820 and a metal layer 830. Resistor 820 may comprise platinum or a similar substrate material which is resistive at operating temperatures of integrated circuit 800a. Metal layer 830 may comprise niobium, aluminum, lead, zinc, tin, or similar metal capable of superconducting. In FIG. 8B, metal layer 830 has been etched. Metal layer 830 etches at a different (e.g., faster) rate than resistor 820 such that metal layer 830 can selectively be etched while leaving resistor 820 intact. The regions above and to the sides of resistor 820 have been etched in FIG. 8B such that electric current cannot flow from one side of metal layer 830 to the opposite side without flowing through resistor 820. A strong electrical connection is made between both sides of metal layer 830 and resistor 820, and resistor 820 is positioned near substrate 810 such that any heat generated within resistor 820 during the operation of integrated circuit 800b is quickly and efficiently conducted away from integrated circuit 800b to reduce heating of other regions of integrated circuit 800b. Heat generation may be a problem during the operation of integrated circuit 800b since metal layer 830 is a superconducting metal, and therefore it must be kept below its critical temperature else metal layer 830 may cease superconducting.

Hard Mask for Josephson Junction

The behavior of a typical Josephson junction is very sensitive to its structure and composition. Circuits relying on uniformity between the critical currents of multiple Josephson junctions will not operate as desired when there is large variability of critical current due to the structure of the electrically insulating layers in different Josephson junctions.

Many processes used in the fabrication of integrated circuits which include Josephson junctions have the potential to degrade the integrity of the electrically insulating layer of a Josephson junction. For example, the process of wet etching has the potential to damage previously-deposited Josephson junctions. Photoresist is patterned on wafers to enable selective etching of portions of the wafer that are not covered by the photoresist, while leaving areas under the photoresist intact. The removal of such photoresist is typically accomplished through a wet etch process where a chemical is brought into contact with the wafer to dissolve the photoresist while leaving the other layers (e.g., the dielectric layers and metal layers) substantially intact. The chemical, however, may have the ability to not only dissolve photoresist but to also damage the electrically insulating layer and/or the superconducting layers of a Josephson junction if such layers are exposed to the wet etching.

Figure 9A:
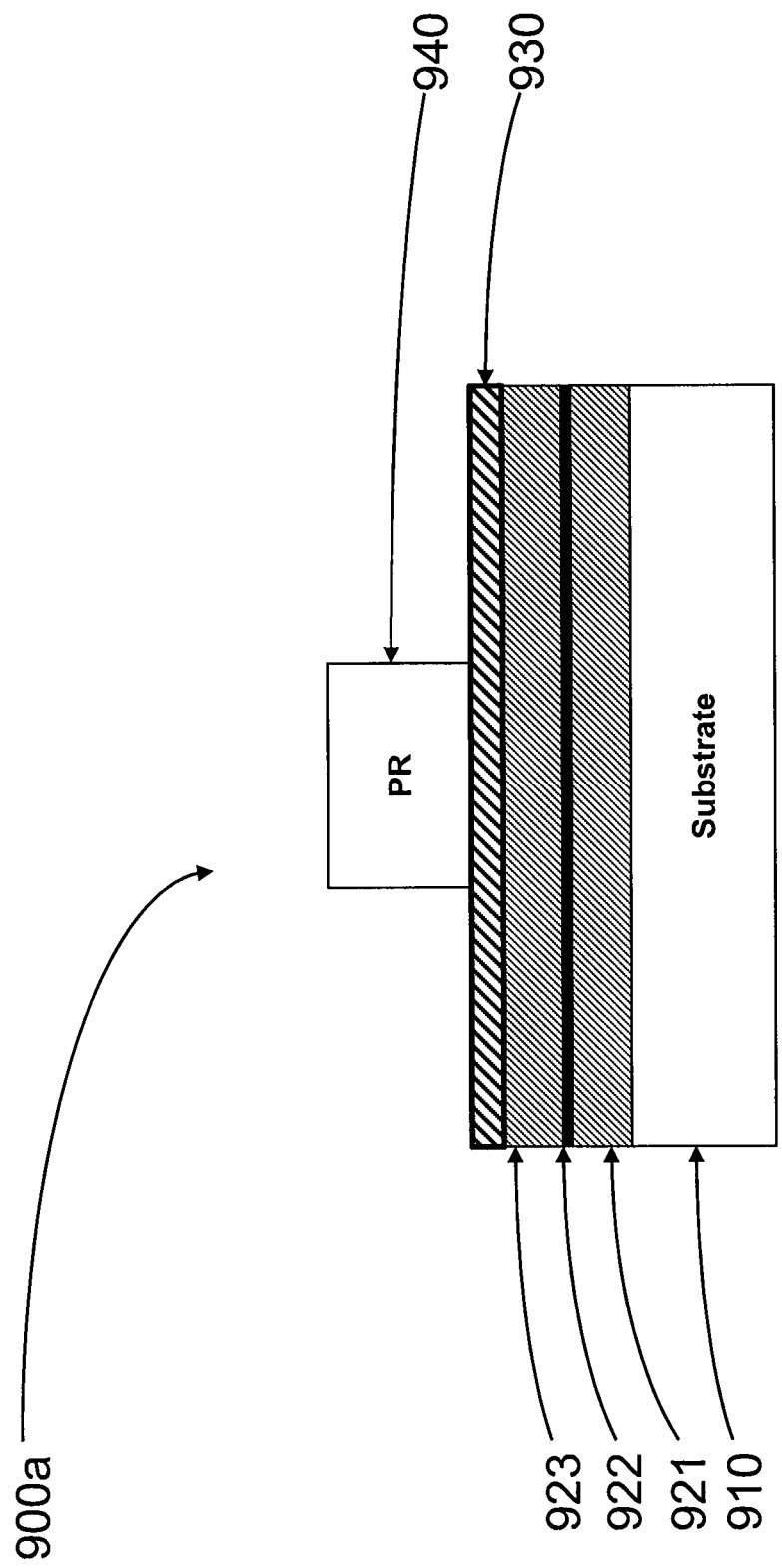
FIGS. 9A, 9B, 9C, 9D, 9E, 9F and 9G are cross-sectional views of a superconducting integrated circuit at different phases of a fabrication process.

FIG. 9A shows an integrated circuit 900a having a first metal layer 921 carried on a substrate 910, an electrically insulating layer 922 carried on the first metal layer 921, and a second metal layer 923 carried on electrically insulating layer 922. Note that for the purposes of the present systems and methods, second metal layer 923 may be considered to be carried on or by each of electrically insulating layer 922, first metal layer 921, and substrate 910. First and second metal layers 921, 923 may comprise niobium, aluminum, lead, zinc, tin, or similar a metal capable of superconducting. Electrically insulating layer 922 may comprise aluminum oxide or a similar suitable material. A hard mask 930 may be deposited atop at least a portion of second metal layer 923 and a photoresist 940 may be patterned atop at least a portion of hard mask 930. Hard mask 930 may, for example, comprise SiN or another material with reaction chemistry favorable to the process described herewithin. Integrated circuit 900a may be exposed to an oxygen plasma after the deposition of hard mask 930 to, for example, bind with any free nitrogen within hard mask 930. Such may result in a near-stoichiometric hard mask 930 such that, for example, there is about equal numbers of silicon as there is nitrogen in the SiN hard mask 930. Photoresists 940 are known chemical compounds which, when exposed to an etch, prevent portions of thin films below the photoresist 940 from interacting with the etch while those portions not covered by photoresist 940 may be removed by the etch.

Figure 9B:
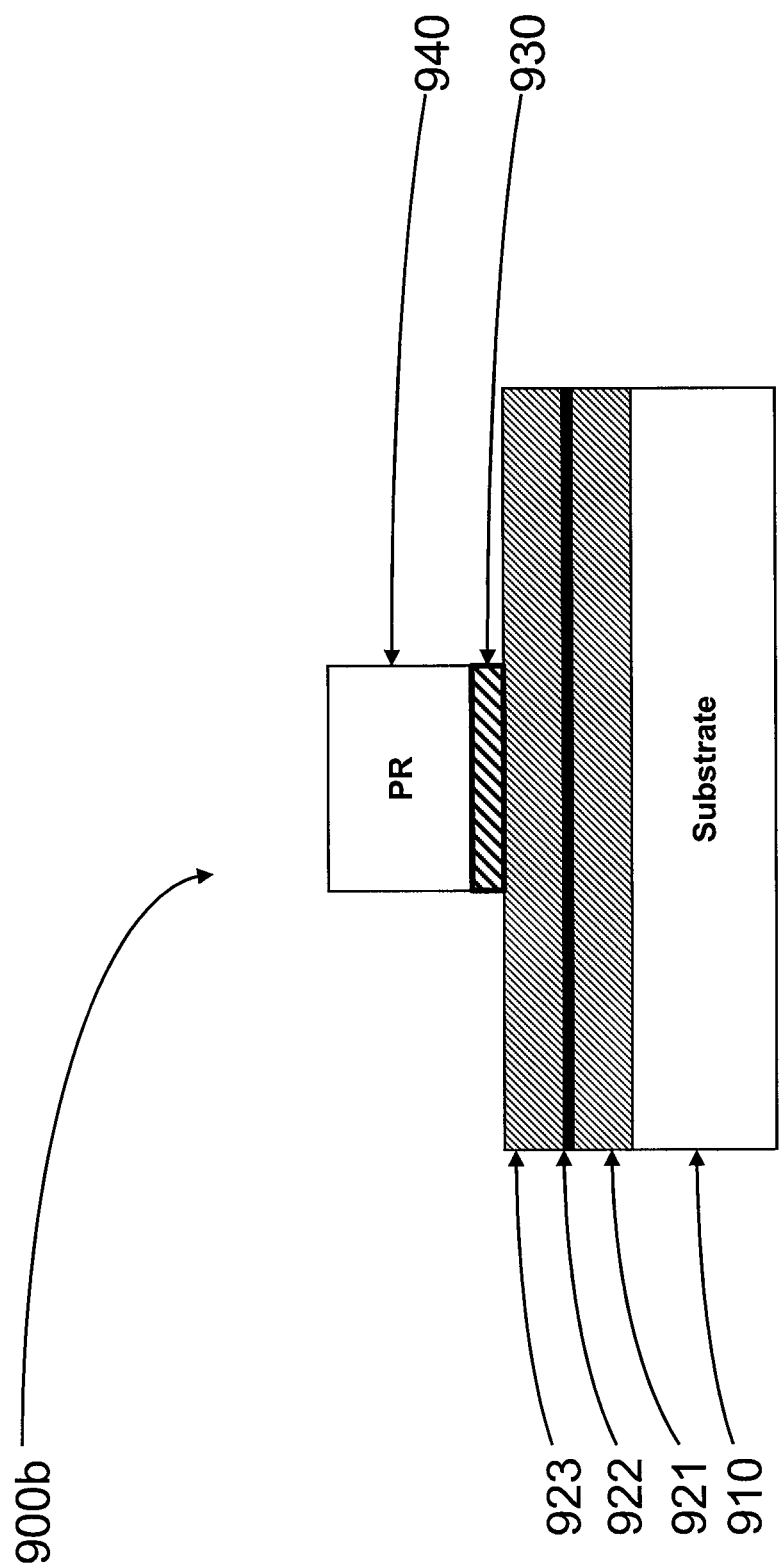

An etch may be conducted upon integrated circuit 900a such that portions of hard mask 930 not covered with photoresist 940 are substantially etched away leaving integrated circuit 900b, as shown in FIG. 9B.

Figure 9C:
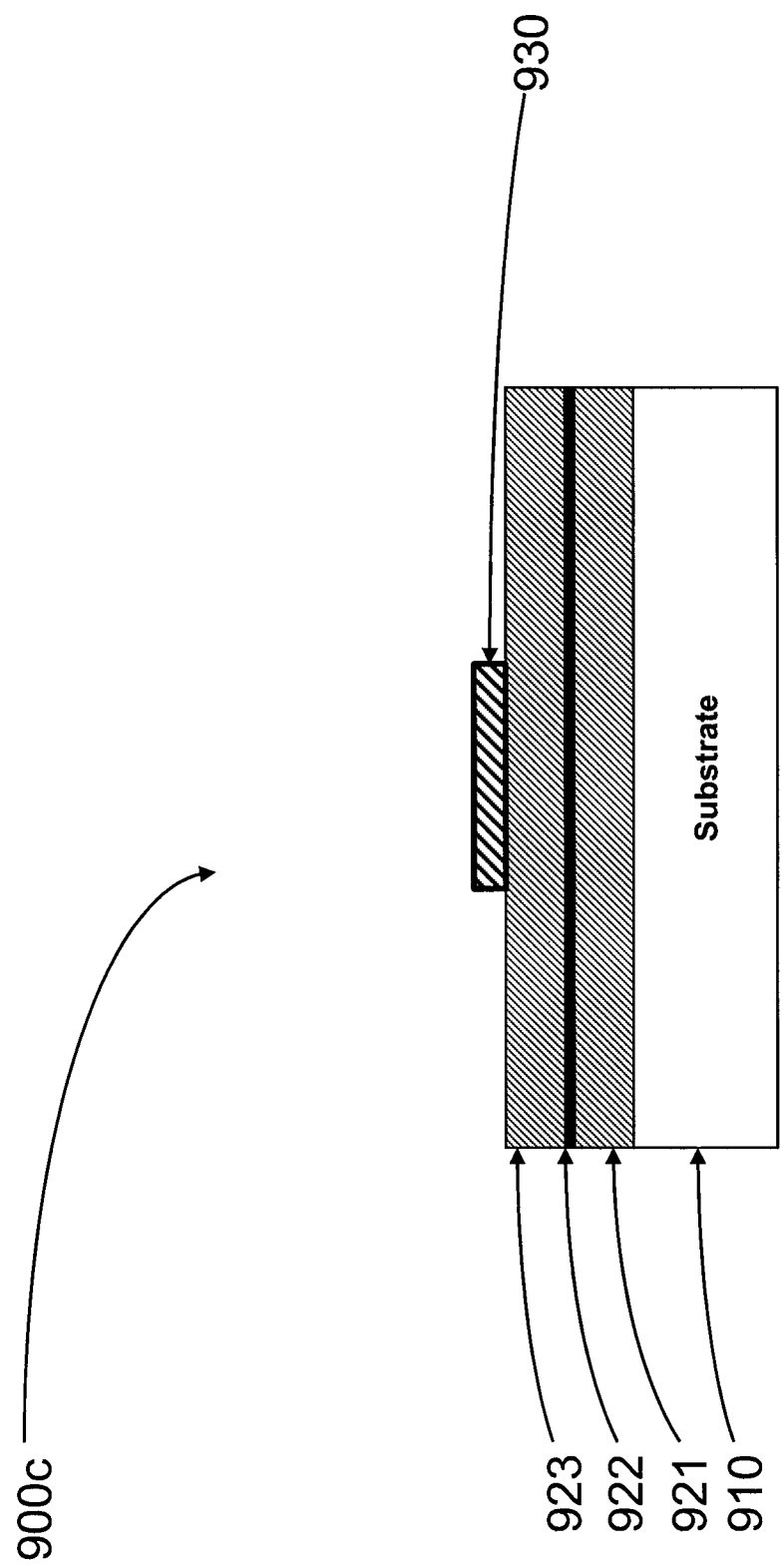

A wet etch is conducted upon integrated circuit 900b to produce integrated circuit 900c, as seen in FIG. 9C. The typical chemicals used in this etching process (which removes photoresist 940) may be harmful to electrically insulating layer 922, but since electrically insulating layer 922 is covered by metal layer 923 and not exposed to the wet etch, the chemicals do not typically affect the integrity of electrically insulating layer 922.

Figure 9D:
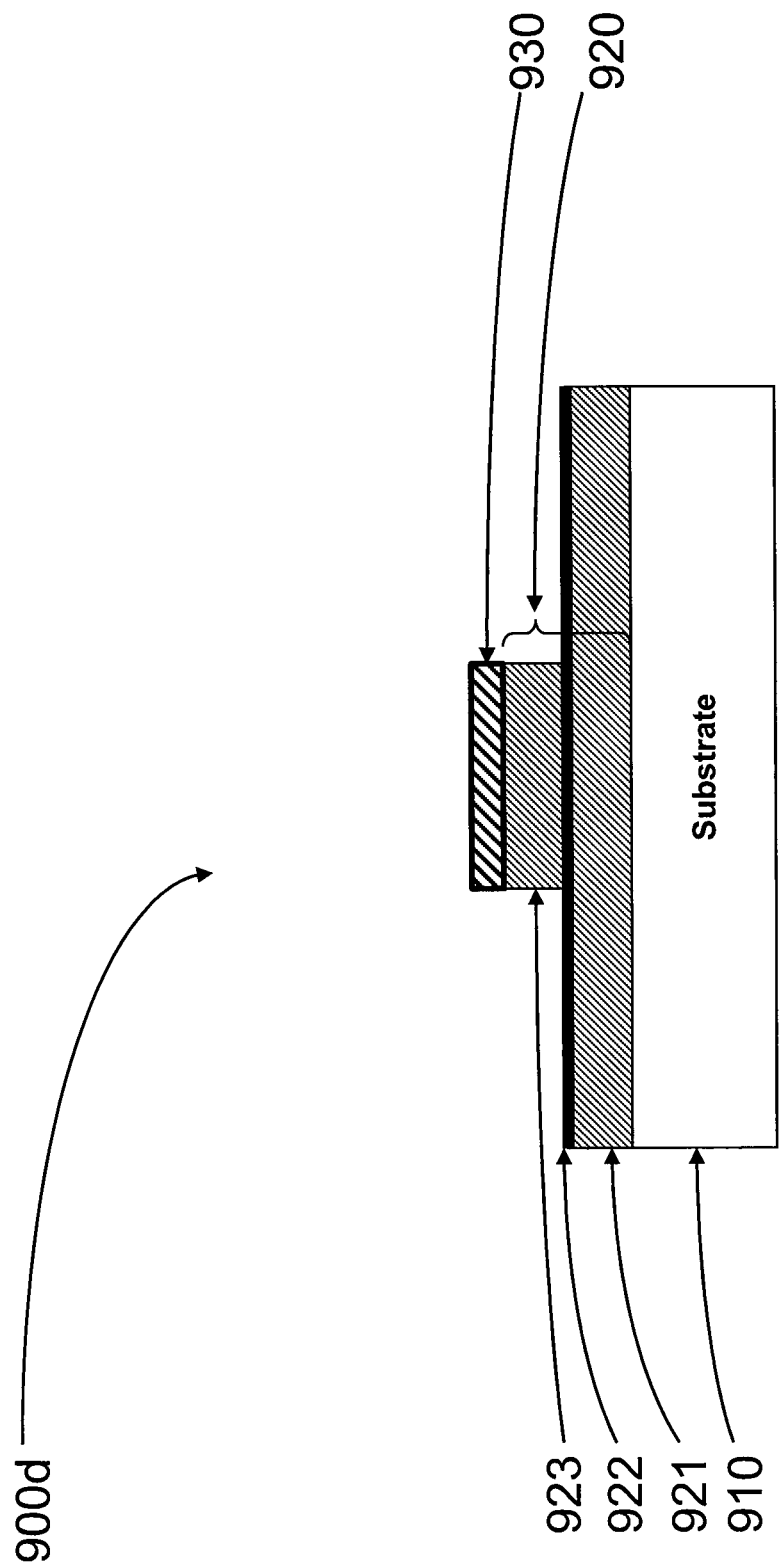

A physical etching process, such as bombardment with argon gas atoms, may then be applied to integrated circuit 900c to produce integrated circuit 900d of FIG. 9D. The portions of second metal layer 923 that are not covered by the remaining hard mask 930 are removed by this physical etching process, but the portion of second metal layer 923 that is covered by hard mask 930 is left intact. In this way, a Josephson junction 920 of specified size may be formed.

Figure 9E:
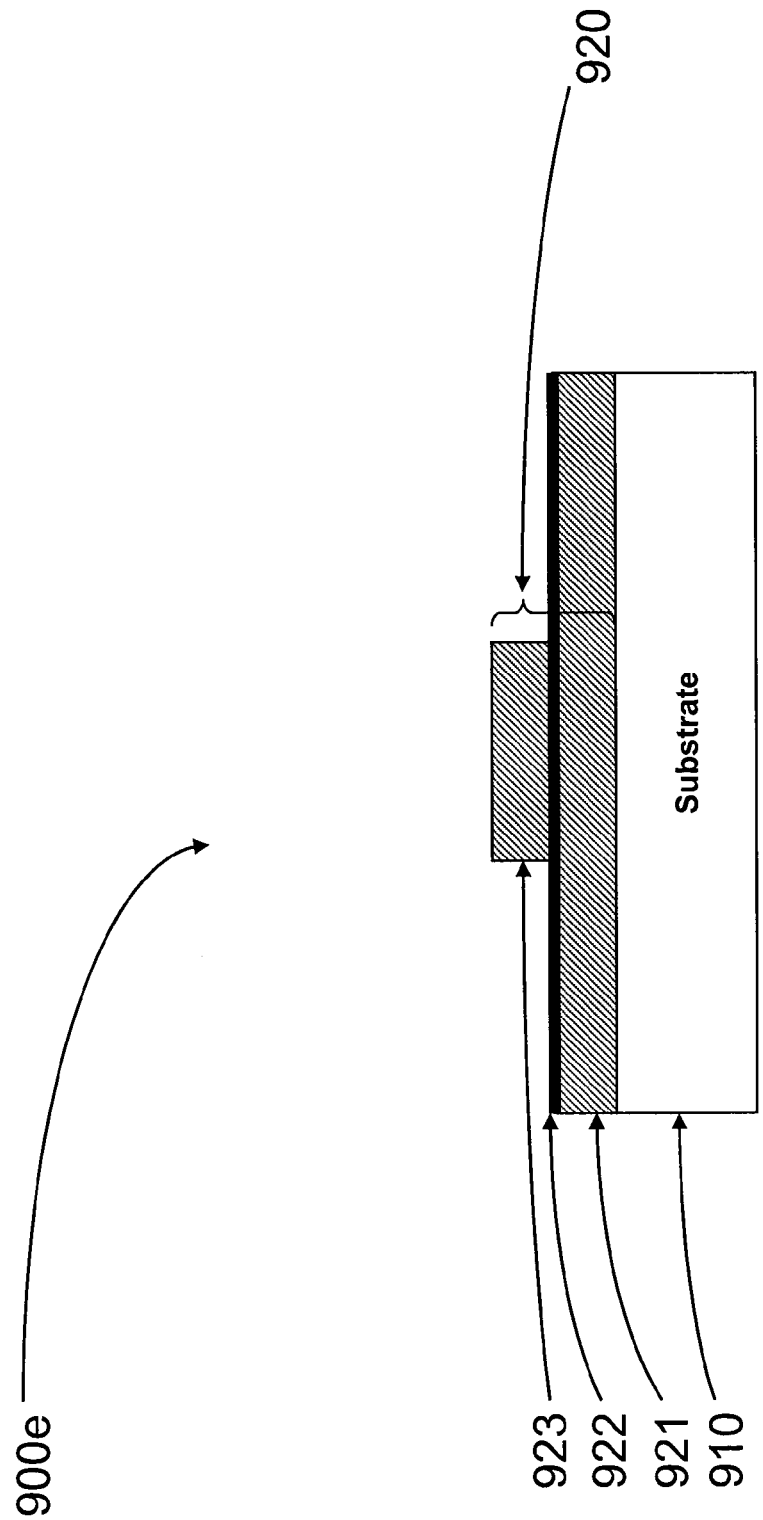

FIG. 9E shows integrated circuit 900e. Here, the remaining portion of hard mask 930 has been removed by, for example, RIE. Thus, a Josephson junction 920 may be fabricated with little to no exposure of electrically insulating layer 922 to wet etching. In some embodiments, the remainder of hard mask 930 may be left in place (i.e., as in circuit 900d) and further steps or acts may be completed with hard mask 930 carried on second metal layer 923.

Figure 9F:
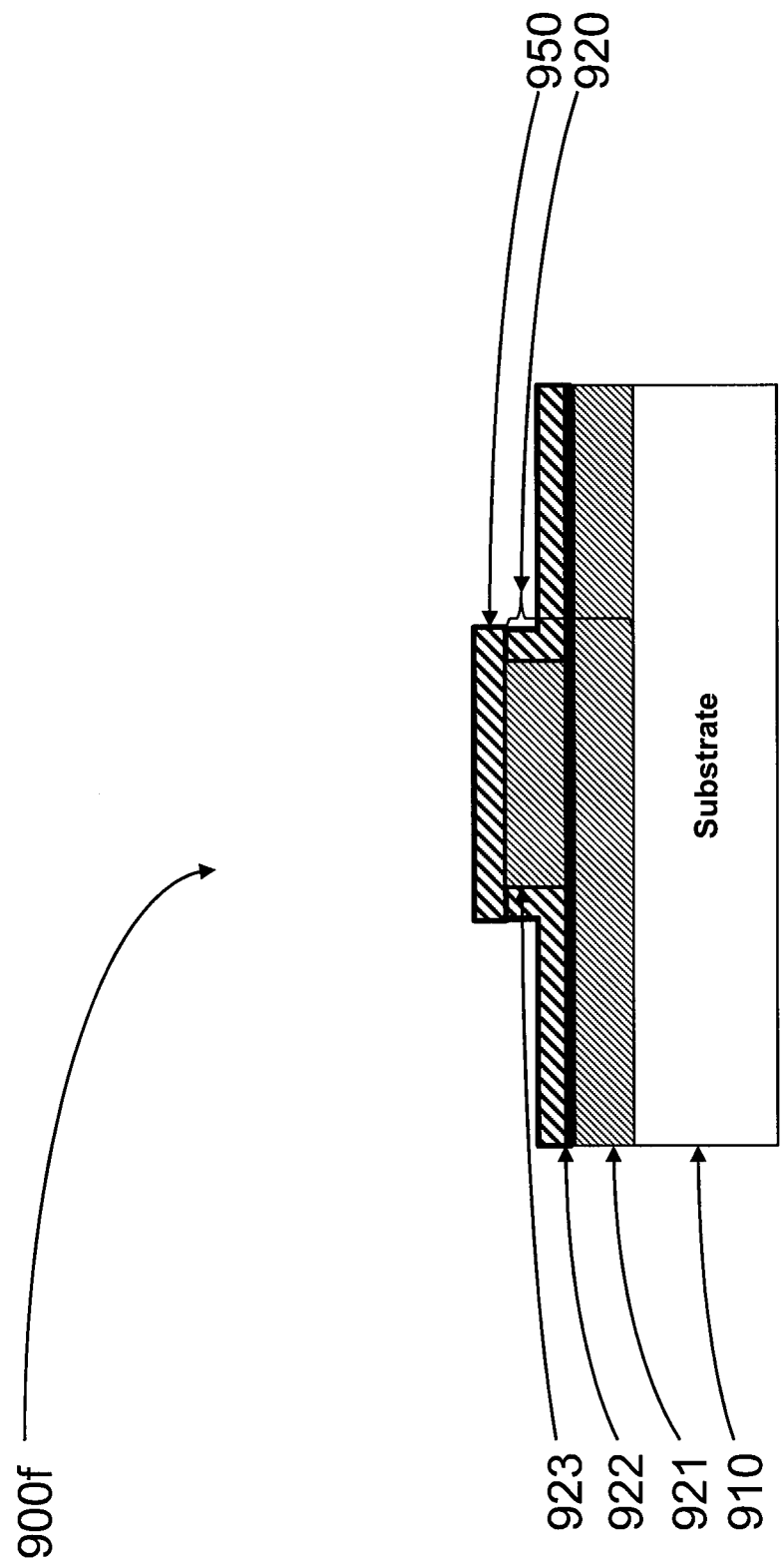

A cap 950 may be deposited on to integrated circuit 900e to produce integrated circuit 900f shown in FIG. 9F. The cap 950 may serve to protect Josephson junction 920 from subsequent etch processes. Cap 950 may comprise, for example, SiO$_2$, SiN, hydrogenated amorphous silicon, organic polymer dielectric materials or a similar dielectric material.

Figure 9G:
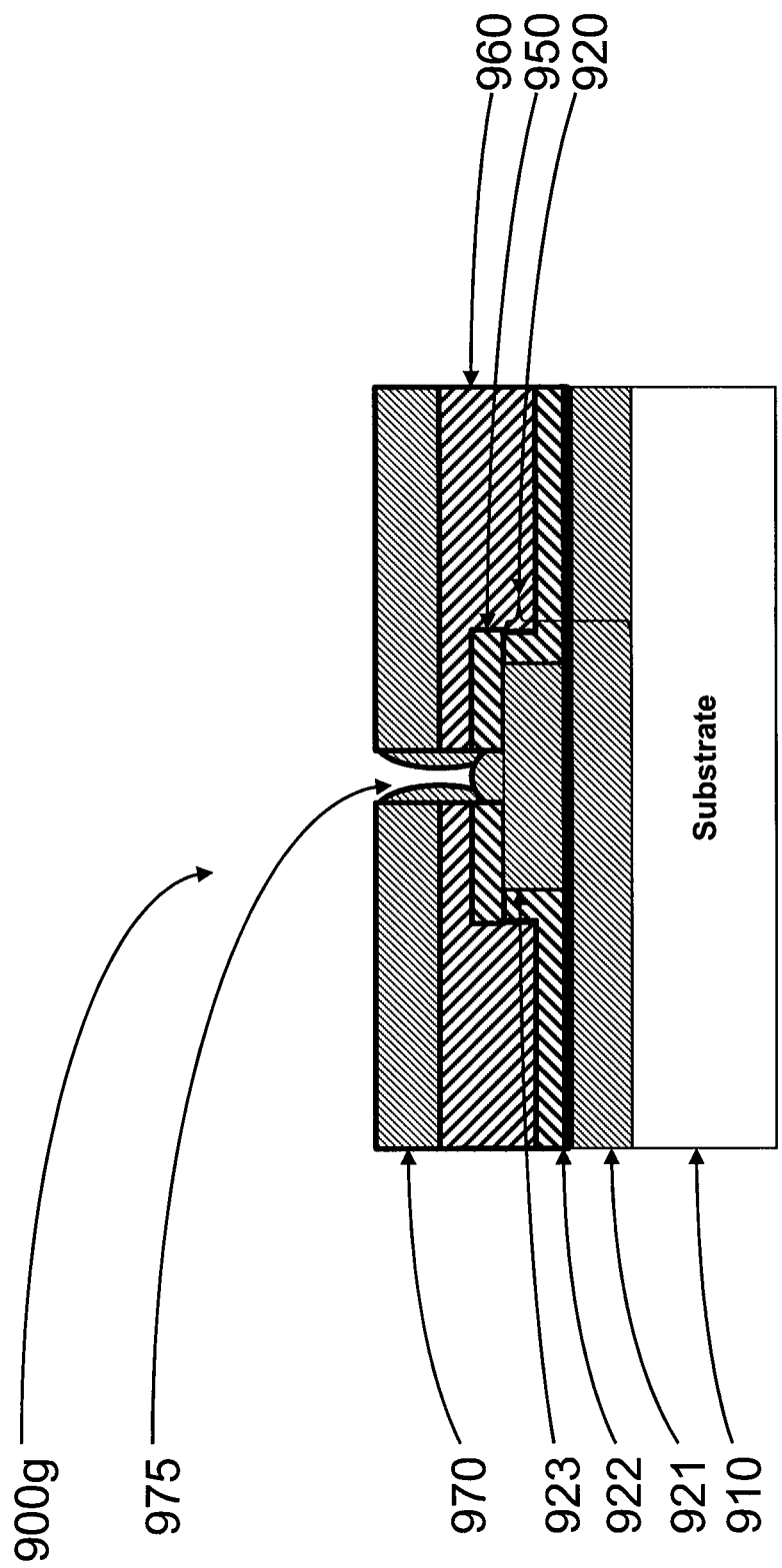

FIG. 9G shows integrated circuit 900g having an additional dielectric layer 960 deposited upon cap 950, a hole 975 etched through both dielectric layer 960 and cap 950 in order to expose the top electrode of Josephson junction 920, and a wiring layer 970 deposited atop dielectric layer 960. The hole 975 may be at least partially filled with superconducting metal to form a via that provides a superconducting electrical contact between wiring layer 970 and the top electrode of Josephson junction 920. Dielectric layer 960 may comprise $SiO_2$, SiN, hydrogenated amorphous silicon, organic polymer dielectric materials or a similar dielectric material. Wiring layer 970 may include niobium, aluminum, lead, zinc, tin, or similar metal capable of superconducting. The formation of the via may include a number of steps or acts.

In some embodiments, a CMP process may be used to thin or remove at least a portion of dielectric layer 960 and/or cap 950. Above second metal layer 923 there may be a thickness of approximately 1000 or 2000 Angstroms of at least one of cap 950 and second dielectric layer 960. Then a hole 975 is formed, for example a hole having a width of 1 micrometer or less (e.g., 0.5 micrometers or less). The hole 975 may be produced by a photoresist deposition and subsequent etching, or other process able to produce holes (e.g., submicron holes) within dielectric materials. The hole 975 may then be at least partially filled with niobium or a similar metal capable of superconducting. The depth-to-width aspect ratio of the hole 975 may be chosen to allow niobium to provide a superconducting electrical contact between second metal layer 923 and wiring layer 970. In some embodiments, the depth-to-width aspect ratio of hole 975 may be greater than 0.7:1, 1:1, 2:1, 3:1, 5:1 or greater. A person of skill in the art would appreciate that vias with smaller aspect ratios may be made, such as the 0.667:1 aspect ratio discussed in Hinode et al., Physica C 426-431 (2005) 1533-1540, but the density of components of integrated circuit 900g may not be reduced as a result. Higher yields from fabrication of integrated circuit 900g may, however, be attained should the requirements for small vias be relaxed.

After the deposition of wiring layer 970, and before its exposure to oxygen, a layer of SiN or titanium nitride (TiN) may be deposited in-situ atop wiring layer 970 to passivate wiring layer 970; otherwise oxides may form if oxygen is allowed to contact wiring layer 970. Oxides may cause paramagnetic impurities to form on the surface of wiring layer 970 which could cause noise within quantum devices which incorporate, or are in close proximity to, wiring layer 970. Current flowing within the metal wire 970 may couple to the paramagnetic impurities and result in, e.g., 1/f or flux noise due to fluctuating paramagnets at the surface of metal wire 970. A high quality wiring layer 970 having few impurities will enable current to flow near the surface of wiring layer 970. The current may then be affected by the effective fluctuating paramagnets due to the oxidation of wiring layer. Further, SiN and TiN layers may be used as diffusion barriers. Oxygen may diffuse into wiring layer 970 in an uncontrolled manner resulting in wiring characteristics which may be undesirable. By preventing oxidation of wiring layer 970, the current may experience reduced noise which may increase the level of precision at which a quantum computer is able to operate. Further, surface passivation of superconducting shielding, such as those discussed in US Patent Publication 2009-0008632, through the deposition of a layer of SiN or TiN may further reduce the amount of noise within a quantum computer.

The purity of wiring layer 970 may also be optimized. One may deposit Nb in less than optimal conditions resulting in higher impurities within wiring layer 970 which will increase the penetration depth of wiring layer 970 from approximately 550 Angstroms to 1000 Angstroms or greater while still producing high quality Nb near Josephson junctions. Also, should niobium nitride (NbN) be deposited for wiring layer 970, as opposed to niobium, the penetration depth of wiring layer 970 would greatly increase. The penetration depth of NbN is approximately 3000 Angstroms whereas the penetration depth of high quality niobium is approximately 500 Angstroms while at superconducting temperatures. Additional materials which provide large penetration depths, such as NbTiN, may also be suitable for use in wiring layer 970.

Figure 10:
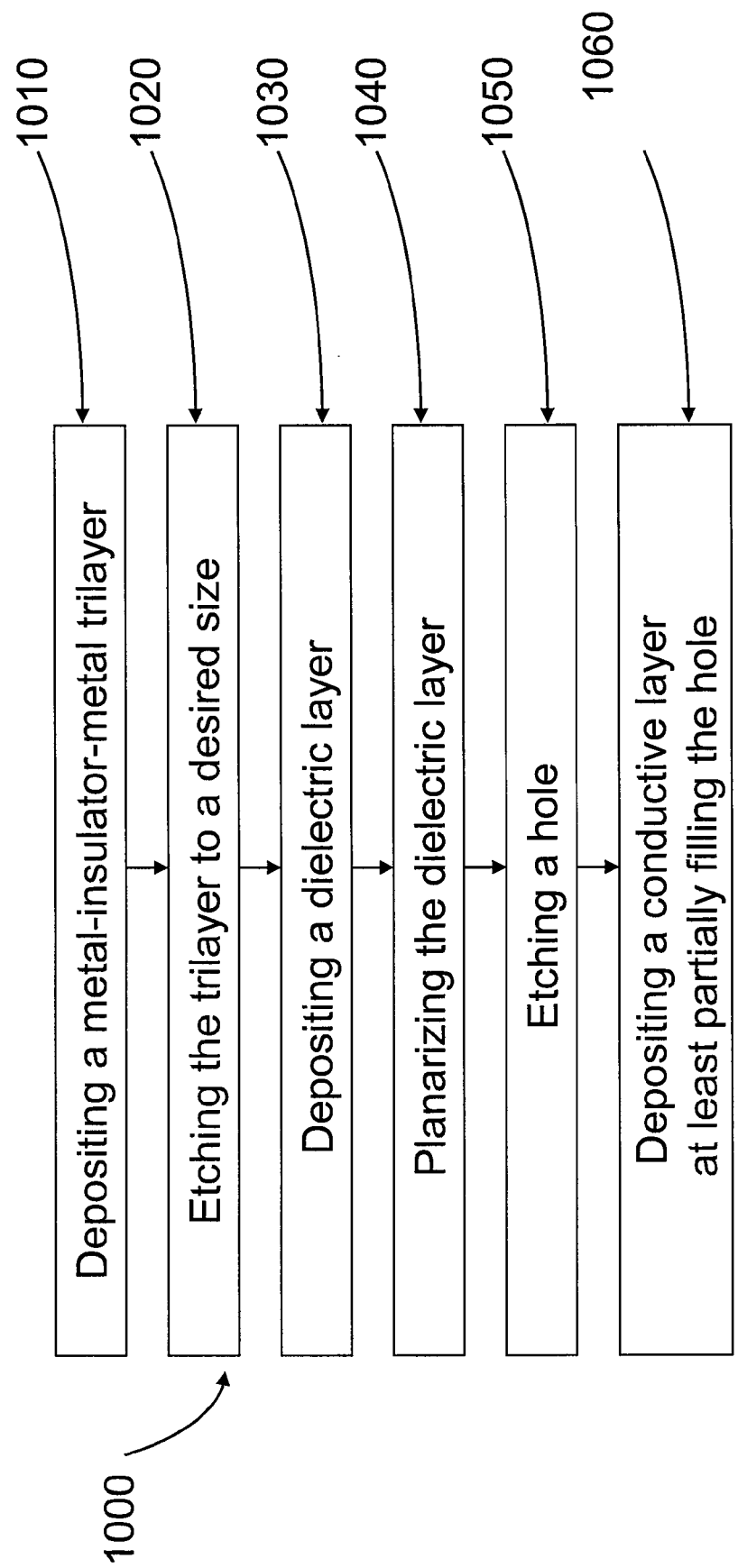
FIG. 10 is a flow chart illustrating a fabrication method to produce a structure capable of superconducting, according to another illustrated embodiment.

FIG. 10 shows a process 1000. Process 1000 begins with depositing of a metal-insulator-metal trilayer, such as a Josephson junction in 1010. Here a first layer of material capable of superconducting below a critical temperature may be deposited. A second layer of an electrically insolating material is carried by the first layer, and a third layer of material capable of superconducting below a critical temperature is carried by the second layer. At 1020, etching of the trilayer to a desired size is completed. The size of the trilayer relates to the performance of the trilayer within an integrated circuit. At 1030, a dielectric layer is deposited, for example, on top of the trilayer. At 1040, the dielectric layer is planarized. At 1050, a hole is etched in the dielectric layer to expose the trilayer. At 1060, a conductive metal layer able to superconduct at and/or below a critical temperature is deposited and carried by the dielectric layer. The conductive metal layer fills at least a portion of the hole to create a superconducting electrical contact (e.g., a superconducting via) between the trilayer and the conductive metal layer.

Figure 11:
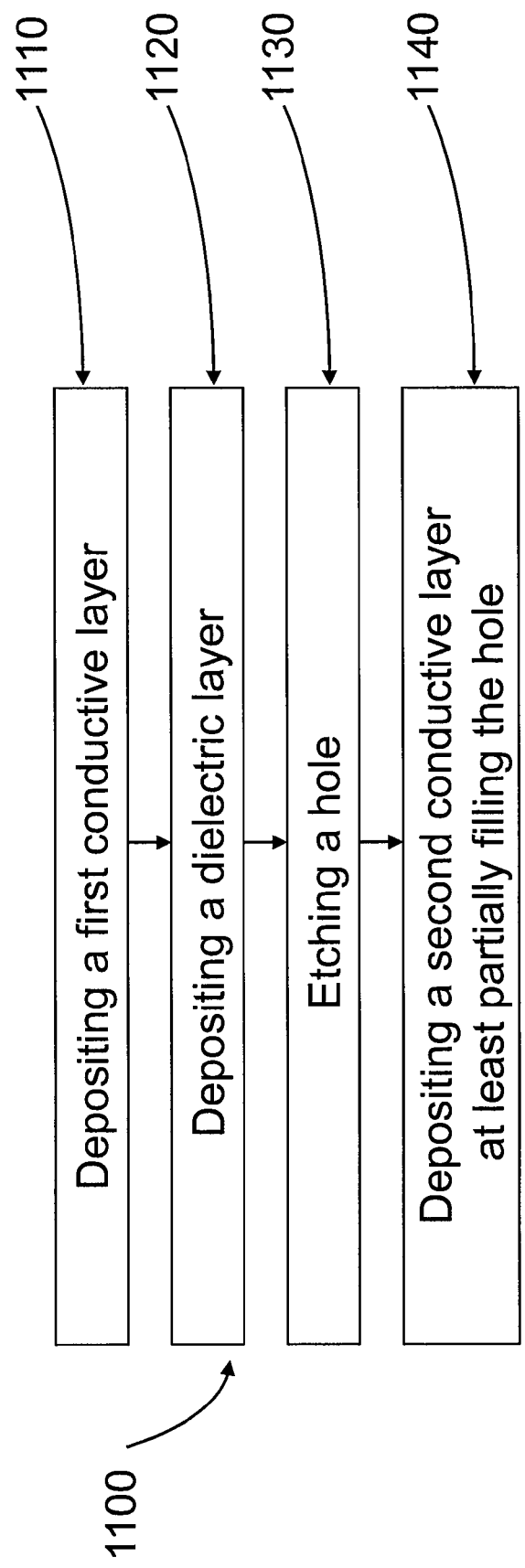
FIG. 11 is a flow chart illustrating a fabrication method to produce a structure capable of superconducting, according to yet another illustrated embodiment.

FIG. 11 shows a process 1100. Process 1100 begins at 1110 with depositing of a first conductive layer able to superconduct at and/or below a critical temperature. At 1120, a dielectric layer is deposited, carried by the first conductive layer. At 1130, a hole is etched in the dielectric layer to expose the first conductive layer. At 1140, a second conductive layer able to superconduct at and/or below a critical temperature is deposited and carried by the dielectric layer. The second conductive layer fills at least a portion of the hole to create a superconducting electrical contact between the first conductive layer and the second conductive layer.

Figure 12:
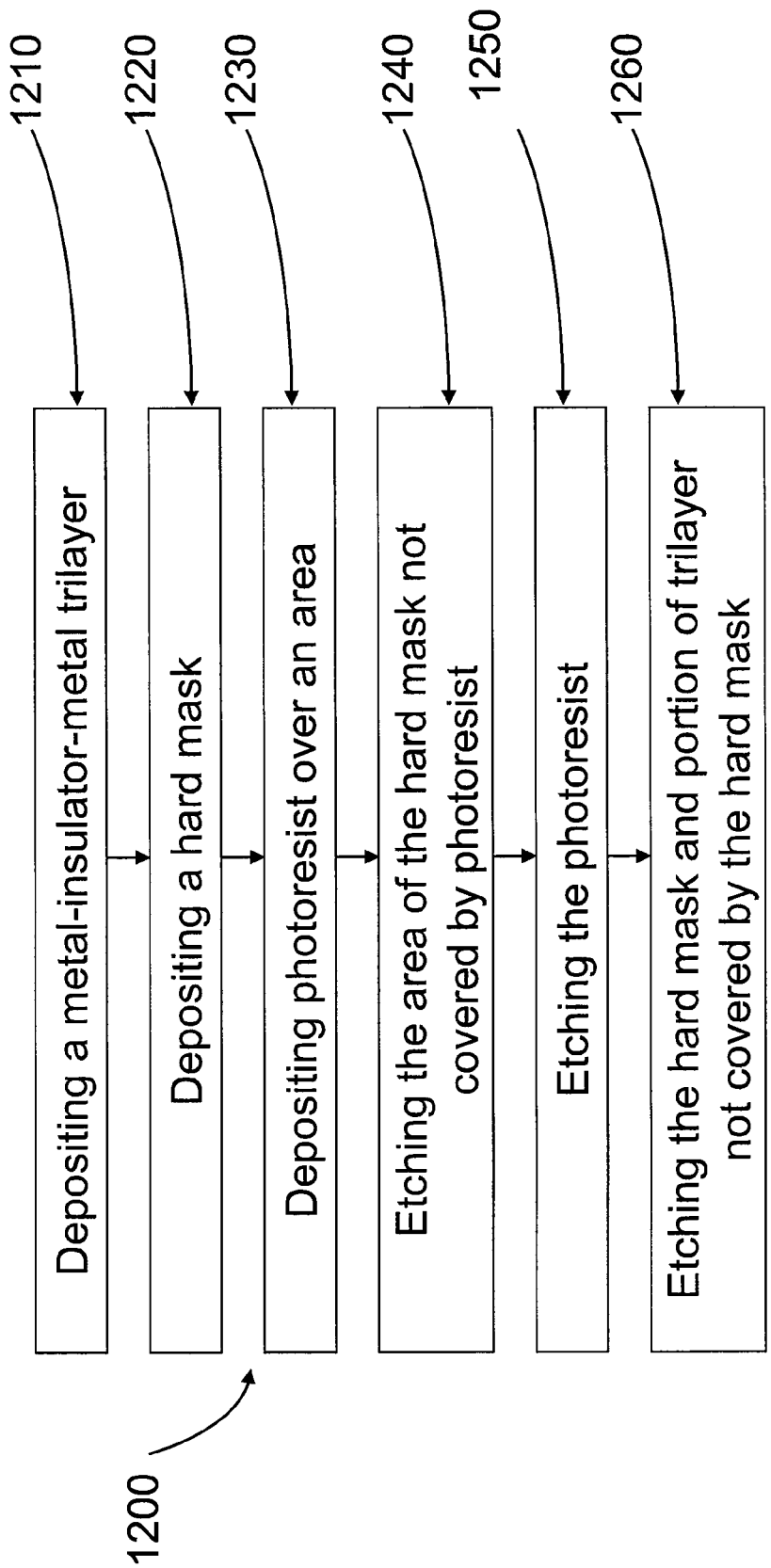
FIG. 12 is a flow chart illustrating a fabrication method to produce a structure capable of superconducting, according to still another illustrated embodiment.

FIG. 12 shows a process 1200. Process 1200 begins at 1210 with depositing of a metal-insulator-metal trilayer, such as a Josephson junction. Here a first layer of material capable of superconducting at and/or below a critical temperature may be deposited. At 1220, a hard mask is deposited on top of at least a portion of the trilayer. At 1230, a photoresist is deposited over an area of the hard mask. At 1240, an area of the hard mask that is not covered by the photoresist is etched away. At 1250, an etching process (e.g., a wet etch process) is used to remove the photoresist. At 1260, the hard mask and portion of the trilayer not covered by the hard mask are removed by physical etching. In some embodiments, both the hard mask and the portion of the trilayer not covered by the hard mask may simultaneously be removed by the same physical etching process. In other embodiments, the portion of the trilayer that is not covered by the hard mask may be removed first using a first etching process (e.g., bombardment with argon gas atoms) and the hard mask may be removed second using a second etching process (e.g., RIE). This sizes the trilayer. The size of the trilayer relates to the performance of the trilayer within an integrated circuit.

Figure 13A:
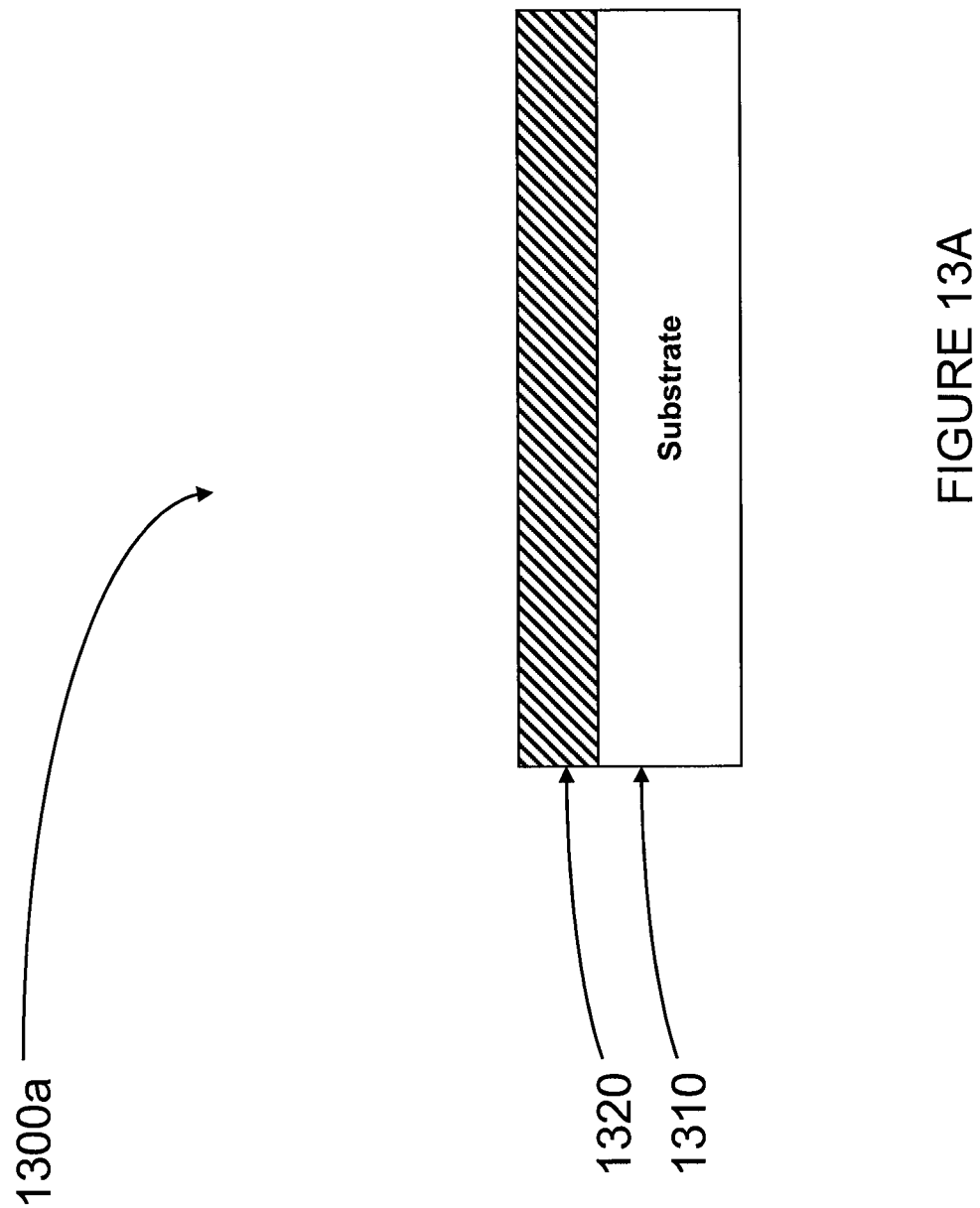
FIGS. 13A, 13B, 13C and 13D are cross-sectional views of a superconducting integrated circuit at different phases of a fabrication process.
Figure 13B:
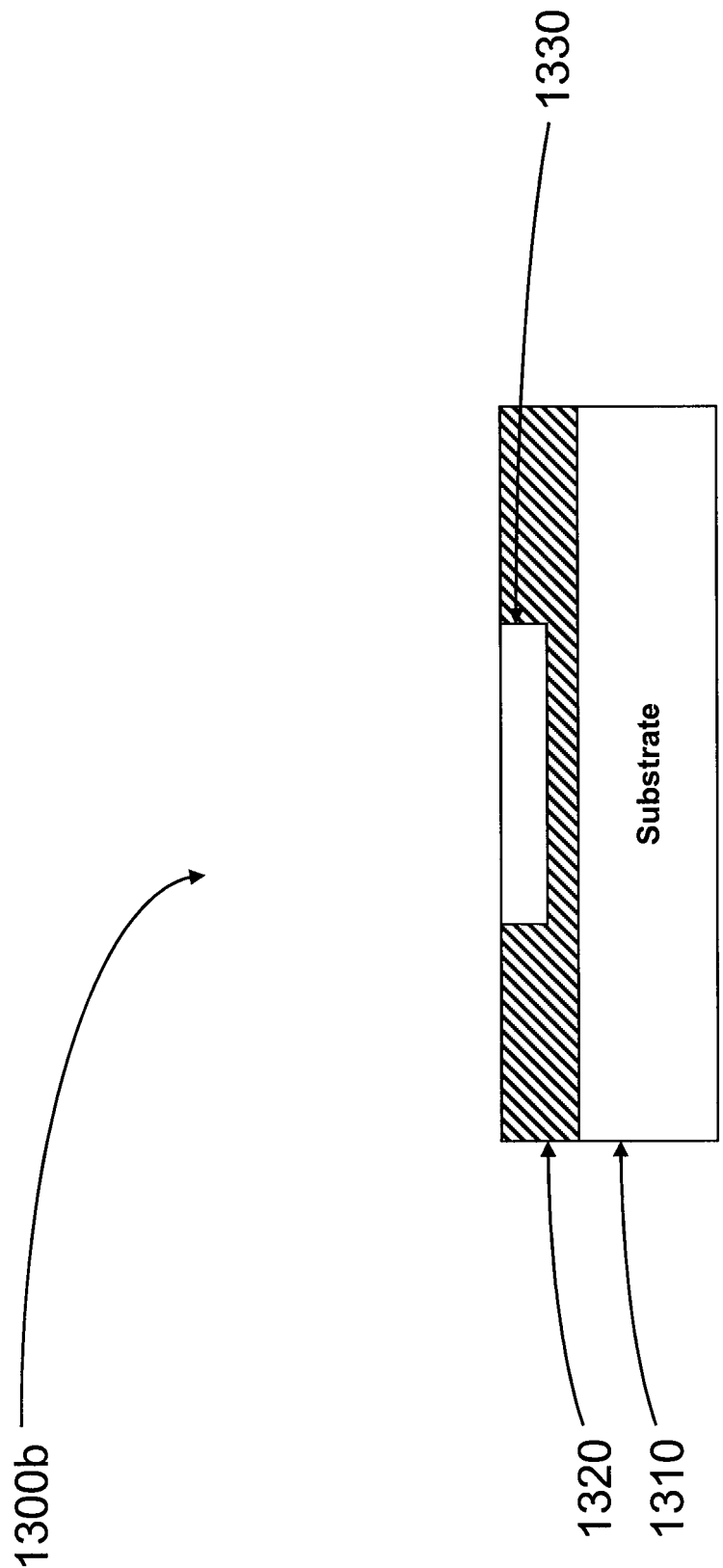
Figure 13C:
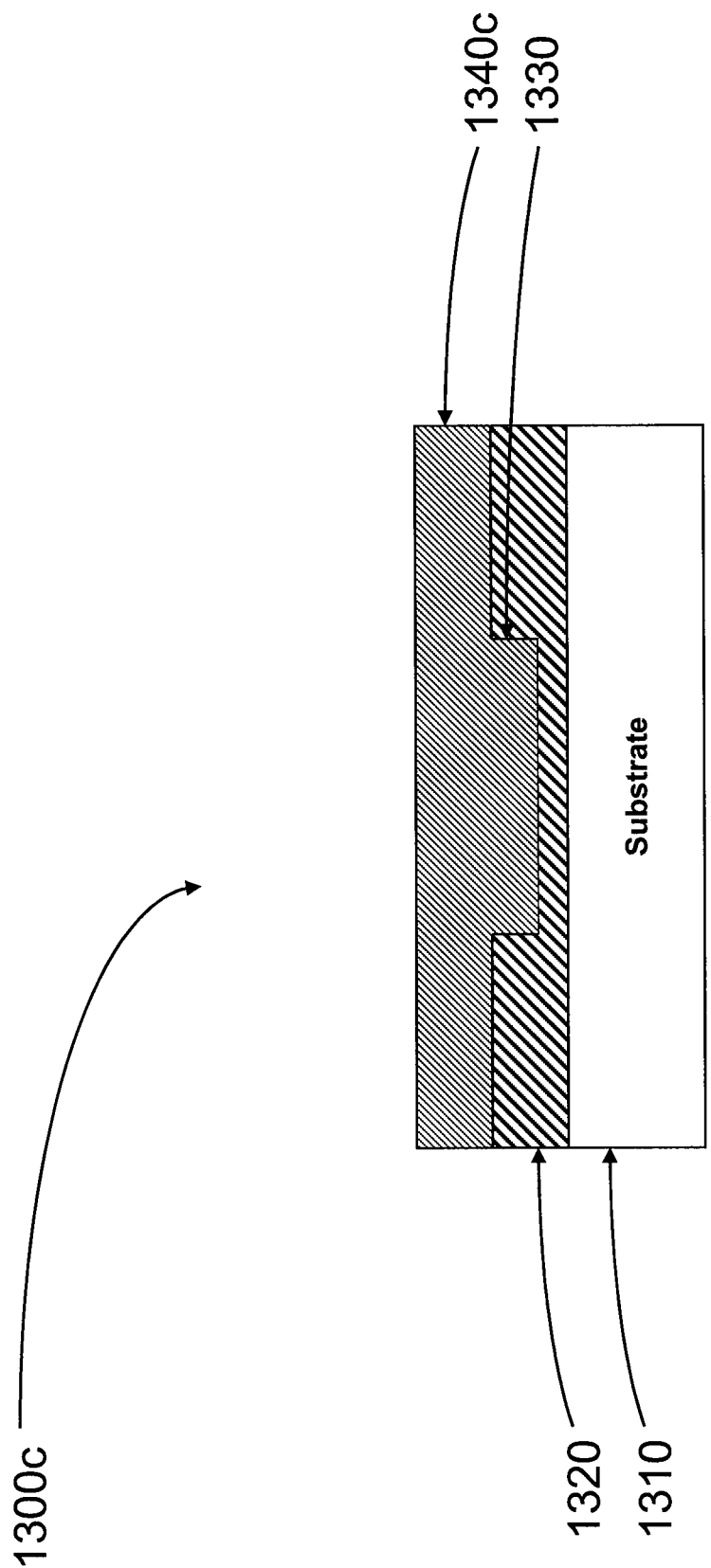
Figure 13D:
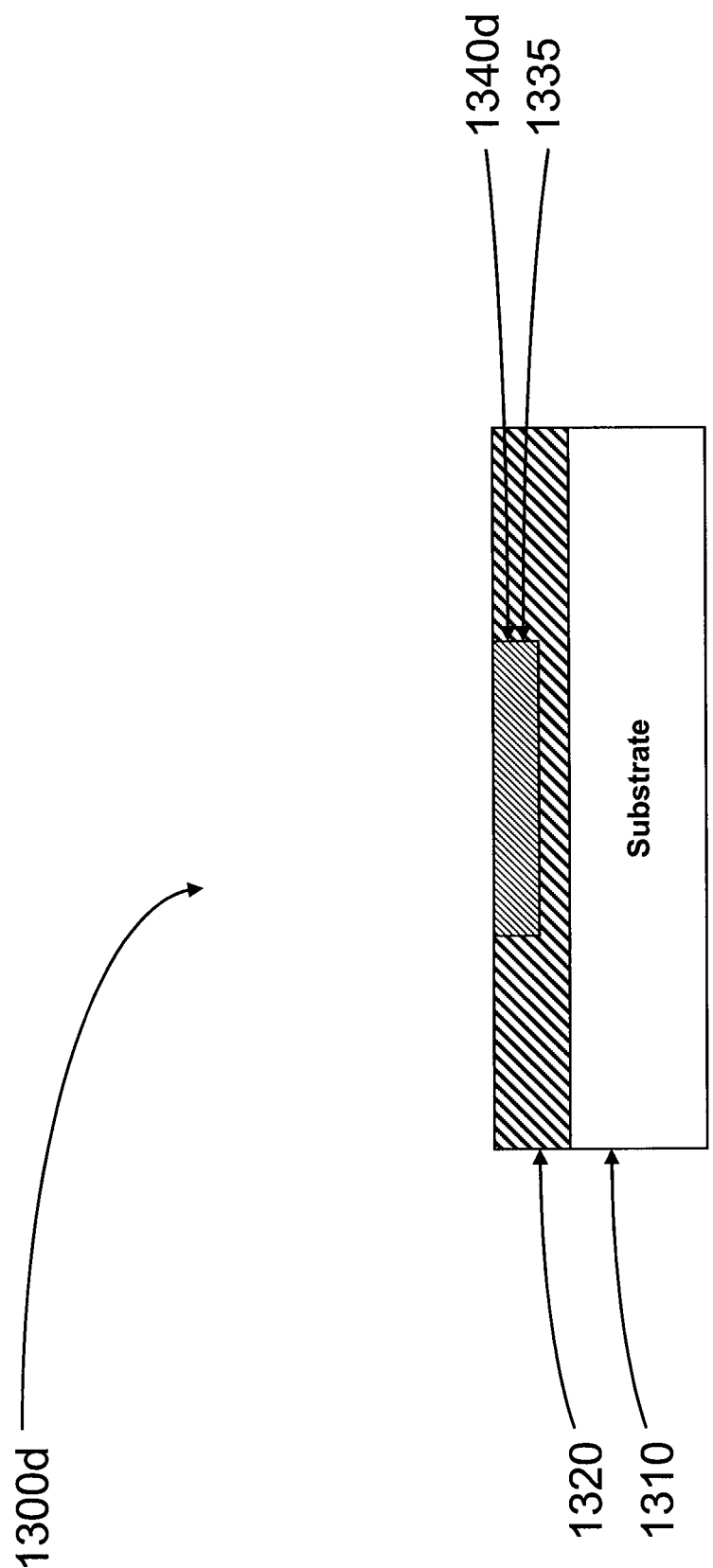

FIG. 13A shows an integrated circuit 1300a having a substrate 1310 and a dielectric layer 1320 deposited atop the substrate 1310. In FIG. 13B, integrated circuit 1300b has a trench 1330 etched into dielectric layer 1320. Trench 1330 may have been etched through, for example, a photolithographic process. FIG. 13C shows integrated circuit 1300c. A metal layer 1340c has been deposited onto dielectric layer 1320 and into trench 1330. Metal layer 1340c may be a material capable of superconducting at and/or below a critical temperature. The material may include niobium, aluminum, lead, zinc, tin, or similar metal or alloy capable of superconducting. In other embodiments, the metal layer 1340c may be a material that is resistive at the operating temperature of the integrated circuit 1300c, such as platinum. FIG. 13D shows integrated circuit 1300d in which metal layer 1340c has been planarized to leave metal layer 1340d. An MPP or CMP process may be performed on metal layer 1340c to produce metal layer 1340d. Metal layer 1340d may be polished to a level even with the surface of dielectric layer 1330 thereby creating a trace that is embedded into dielectric layer 1330. Metal layer 1340c may be polished such that all material not in the trench is removed from the integrated circuit 1300d and only material that was deposited within the trench remains to form metal layer 1340d.

Figure 14:
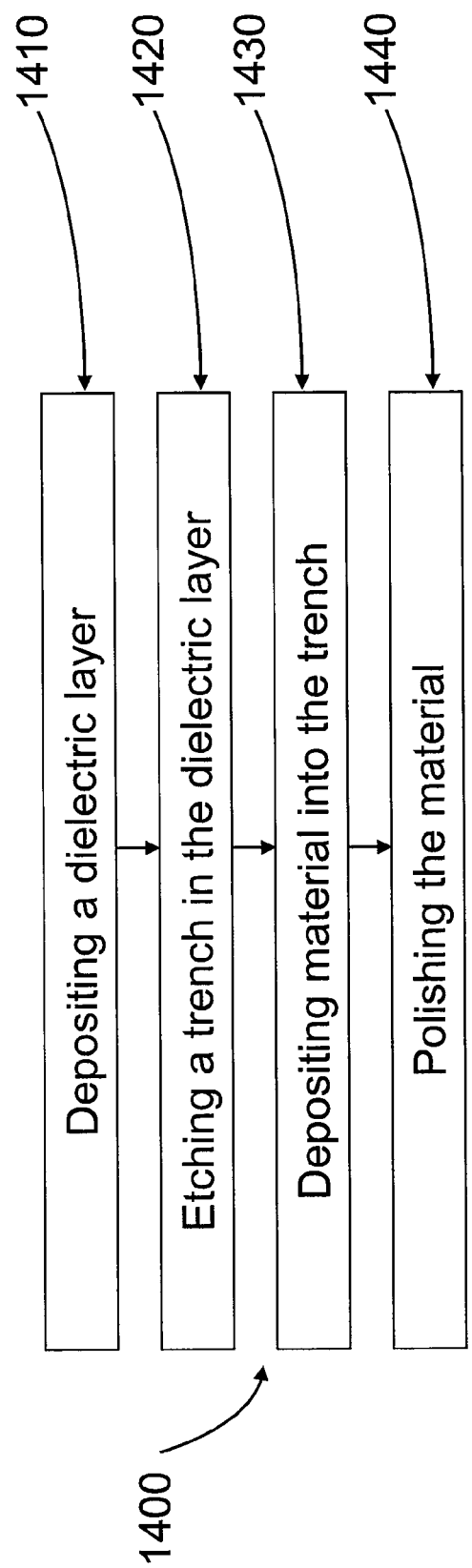
FIG. 14 is a flow chart illustrating a fabrication method to produce a structure capable of superconducting, according to still another illustrated embodiment.

FIG. 14 shows a process 1400. Process 1400 begins at 1410 with depositing of dielectric layer. The dielectric layer may be deposited onto a substrate, a metal layer or another dielectric layer. At 1420, a trench is etched into the dielectric layer. At 1430, a material is deposited into the trench. In some embodiments, the material may be capable of superconducting below a critical temperature. In other embodiments, the material may be resistive. The material may be deposited with a thickness greater than the depth of the trench such that it fully fills the trench. At 1440, a polishing process is performed on the material. The polishing process may be a MPP process or a CMP process. The material may be polished such that all material not in the trench is removed and only material that was deposited within the trench remains.

Many of the embodiments described herein are directed towards applications in superconducting quantum computation. Those of skill in the art will appreciate that the requirements (e.g., tolerable levels of noise) for manipulating quantum information may be more stringent than the requirements for manipulating non-quantum information. Thus, while the various embodiments described herein are particularly well-suited for use in the fabrication of a superconducting quantum processor, these teachings may be applied to any application incorporating superconducting integrated circuitry (where the performance criteria are likely to be less stringent). For example, the various teachings provided herein may be applied in single-flux quantum (SFQ) circuits. In some instances, applying the present systems and methods in non-quantum computing applications may allow certain constraints to be relaxed. For example, an application of SFQ is likely to be less sensitive to noise than a quantum computing application, and as such a lower temperature dielectric process may readily be applied to an SFQ circuit in order to preserve Josephson junction quality with less regard for the resultant increase in dielectric defects. Furthermore, in accordance with, e.g., US Patent Publications 2008-0215850, 2009-0082209, 2009-0078931 and PCT Patent Publication WO2009149086, a superconducting quantum processor may include components, such as programming and readout components using, for example, SFQ technology, that are designed to manipulate non-quantum information.

Certain aspects of the present systems and methods may be realized at room temperature, and certain aspects may be realized at a superconducting temperature. Thus, throughout this specification and the appended claims, the term "superconducting" when used to describe a physical structure such as a "superconducting metal" is used to indicate a material that is capable of behaving as a superconductor at an appropriate temperature. A superconducting material may not necessarily be acting as a superconductor at all times in all embodiments of the present systems and methods.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other superconductive circuits and structures, not necessarily the exemplary superconductive circuits and structures generally described above.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications assigned D-Wave Systems Inc. referred to in this specification and/or listed in the Application Data Sheet, are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

We claim:

1. A method of fabricating a Josephson junction, the method comprising:
   depositing a first dielectric layer;
   planarizing a surface of the first dielectric layer;
   depositing a first electrode that superconducts at or below a critical temperature over at least a portion of the planarized surface of the first dielectric layer;
   forming an electrically insulative layer over at least a portion of the first electrode;
   depositing a second electrode that superconducts at or below the critical temperature over at least a portion of the electrically insulative layer;
   depositing an additional dielectric layer over at least a portion of the second electrode;
   planarizing a surface of the additional dielectric layer;
   forming a hole in the additional dielectric layer to expose at least a portion of the second electrode; and
   at least partially filling the hole in the additional dielectric layer with a material that superconducts at or below the critical temperature.

2. The method of claim 1, further comprising:
   depositing a second dielectric layer over at least a portion of the planarized surface of the first dielectric layer.

3. The method of claim 1 wherein the first dielectric layer is deposited at a temperature higher than about 200 degrees Celsius.

4. The method of claim 1 wherein forming a hole in the additional dielectric layer includes forming a hole with a width of less than 1 micrometer.

5. A method of fabricating a superconducting integrated circuit, the method comprising:

depositing a first layer of material that superconducts at or below a critical temperature;

forming an electrical insulator layer over at least a portion of the first layer of material that superconducts at or below a critical temperature;

depositing a second layer of material that superconducts at or below a critical temperature over at least a portion of the electrical insulator layer;

depositing a hard mask over at least a portion of the second layer of material that superconducts at or below the critical temperature;

depositing a photoresist over an area of the hard mask, wherein a first portion of the hard mask is covered by the photoresist and a second portion of the hard mask is not covered by the photoresist;

removing the second portion of the hard mask to form a first portion of the second layer of material that superconducts at or below a critical temperature that is covered by the first portion of the hard mask and a second portion of the second layer of material that superconducts at or below a critical temperature that is not covered by the hard mask;

removing the photoresist; and removing the second portion of the second layer of material that superconducts at or below a critical temperature.

6. The method of claim 5 wherein removing the second portion of the hard mask comprises etching by a microlithography process.

7. The method of claim 5 wherein removing the photoresist comprises etching by a wet etching process.

8. The method of claim 5 wherein removing the second portion of the second layer of material that superconducts at or below a critical temperature comprises etching by an argon gas plasma process.

9. The method of claim 5 wherein removing the second portion of the second layer of material that superconducts at or below a critical temperature comprises etching by a reactive ion etching process.

10. The method of claim 5 wherein at least one of the first and the second layer of material that superconducts at or below a critical temperature comprises niobium.

11. The method of claim 5, further comprising:
depositing a cap over at least a portion of the integrated circuit.

12. The method of claim 5 wherein the hard mask comprises silicon nitride, and further comprising:
exposing the silicon nitride to an oxygen plasma before depositing the photoresist.

13. The method of claim 5, further comprising:
depositing a dielectric layer;
planarizing a surface of the dielectric layer;
forming a hole in the dielectric layer wherein a width of the hole is less than 1 micrometer; and
at least partially filling the hole with a material that superconducts at or below a critical temperature.

14. The method of claim 13 wherein forming a hole in the dielectric layer includes forming a hole having a width of less than about 0.5 micrometers.

15. The method of claim 13 wherein the dielectric layer covers at least a portion of the first portion of the second layer of material that superconducts at or below a critical temperature, forming a hole in the dielectric layer exposes at least a portion of the first portion of the second layer of material that superconducts at or below a critical temperature, and at least partially filling the hole provides an electrical connection with the first portion of the second layer of material that superconducts at or below a critical temperature.

16. The method of claim 5 wherein forming an electrical insulator layer over at least a portion of the first layer of material that superconducts at or below a critical temperature comprises:
depositing a metal layer above at least a portion of the first layer of material that superconducts at or below a critical temperature; and
exposing the metal layer to oxygen.

17. The method of claim 5, further comprising:
removing the first portion of the hard mask.

18. The method of claim 13 wherein removing the first portion of the hard mask comprises etching by a reactive ion etching process.

19. A method of fabricating a superconducting integrated circuit including a Josephson junction having a first superconducting electrode and a second superconducting electrode, the method comprising:
depositing the first electrode of the Josephson junction, wherein the first electrode superconducts at or below a critical temperature;
forming an electrically insulative layer over at least a portion of the first electrode;
depositing the second electrode of the Josephson junction over at least a portion of the electrically insulative layer, wherein the second electrode superconducts at or below a critical temperature;
depositing a photoresist over the second superconducting electrode;
masking and developing the photoresist to produce an area of the second superconducting electrode not covered by the photoresist;
removing the area of the second superconducting electrode not covered by the photoresist;
removing the photoresist;
depositing a dielectric layer over the Josephson junction;
planarizing a surface of the dielectric layer;
forming a hole having a width of less than 1 micrometer in the dielectric layer, wherein the hole exposes at least a portion of the second superconducting electrode; and
depositing a conductive layer comprising a material that superconducts at or below a critical temperature over at least a portion of the dielectric layer, wherein a portion of the conductive layer at least partially fills the hole and establishes electrical communication with the second superconducting electrode of the Josephson junction.

20. The method of claim 19 wherein at least one of the first and the second superconducting electrodes is formed of a material that comprises at least one metal selected from the group consisting of: niobium, aluminum, zinc, tin, and lead.

21. The method of claim 19 wherein forming an electrical insulative layer over at least a portion of the first superconducting electrode comprises:
depositing a metal layer over at least a portion of the first superconducting electrode; and
exposing the metal layer to oxygen.

22. The method of claim 19 wherein removing the area of the second superconducting electrode not covered by the photoresist comprises etching by an argon gas plasma process.

23. The method of claim 19 wherein removing the photoresist comprises etching by a wet etching process.

24. A method of fabricating a superconducting integrated circuit, the method comprising:
forming a platinum resistor carried by a dielectric layer;
forming a first trilayer comprising a first pair of layers of material that are superconducting at and below a critical temperature and first electrically insulative layer interposed between the first pair of layers of material that are superconducting;

forming a second trilayer comprising a second pair of layers of material that are superconducting at and below a critical temperature and a second electrically insulative layer interposed between the second pair of layers of material that are superconducting; and electrically coupling the first trilayer and the second trilayer through the platinum resistor wherein at least one of the first trilayer and the second trilayer overlies at least a portion of the platinum resistor.

25. The method of claim 24, further comprising:

forming a fin thermally conductively coupled to the resistor.

26. The method of claim 24 wherein the dielectric layer covers at least a portion of the platinum resistor, and further comprising:

forming a first hole in the dielectric layer to expose at least a first portion of the platinum resistor;

at least partially filling the first hole with a material that is superconducting at and below a critical temperature to provide an electrical connection between the first trilayer and the platinum resistor;

forming a second hole in the dielectric layer to expose at least a second portion of the platinum resistor; and at least partially filling the second hole with a material that is superconducting at and below a critical temperature to provide an electrical connection between the second trilayer and the platinum resistor.

27. The method of claim 24, further comprising:

forming a fin on the resistor.

28. The method of claim 24, further comprising:

forming a fin carried by the dielectric layer.

* * * * *

UNITED STATES PATENT AND TRADEMARK OFFICE
CERTIFICATE OF CORRECTION

| | | |
|---|---|---|
| PATENT NO. | : 8,951,808 B2 | Page 1 of 1 |
| APPLICATION NO. | : 12/992049 | |
| DATED | : February 10, 2015 | |
| INVENTOR(S) | : Eric Ladizinsky et al. | |

It is certified that error appears in the above-identified patent and that said Letters Patent is hereby corrected as shown below:

In the Claims

<u>Column 30, Line 11, Claim 18:</u>
"18. The method of claim 13 wherein removing the first" should read, --18. The method of claim 17 wherein removing the first--.

Signed and Sealed this
Twenty-ninth Day of September, 2015

Michelle K. Lee
*Director of the United States Patent and Trademark Office*